US007216138B2

(12) United States Patent
Abdallah et al.

(10) Patent No.: US 7,216,138 B2
(45) Date of Patent: *May 8, 2007

(54) METHOD AND APPARATUS FOR FLOATING POINT OPERATIONS AND FORMAT CONVERSION OPERATIONS

(75) Inventors: Mohammad Abdallah, Folsom, CA (US); Prasad Modali, San Jose, CA (US); Hsien-Cheng E. Hsieh, deceased, late of Gold River, CA (US); by Chien-Yu Huang, legal representative, San Jose, CA (US); Thomas R. Huff, Portland, OR (US); Vladimir Pentkovski, Folsom, CA (US); Patrice Roussel, Portland, OR (US); Shreekant S. Thakkar, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/783,875

(22) Filed: Feb. 14, 2001
(Under 37 CFR 1.47)

(65) Prior Publication Data
US 2004/0268094 A1 Dec. 30, 2004

Related U.S. Application Data

(63) Continuation-in-part of application No. 09/070,891, filed on Apr. 30, 1998, now Pat. No. 6,266,769, and a continuation-in-part of application No. 09/071,466, filed on Apr. 30, 1998, now Pat. No. 6,282,554.

(51) Int. Cl.
*G06F 7/00* (2006.01)
*G06F 9/30* (2006.01)

(52) U.S. Cl. .................. 708/204; 712/221; 712/210

(58) Field of Classification Search ............... 712/210, 712/221; 345/523; 708/204
See application file for complete search history.

(56) References Cited

U.S. PATENT DOCUMENTS 3,872,442 A * 3/1975 Boles et al. ............... 708/204
4,949,291 A 8/1990 Saini (Continued)

FOREIGN PATENT DOCUMENTS

WO WO99/23548 5/1999

OTHER PUBLICATIONS

IPEA/US, International Preliminary Examination Report for International Application No. PCT/US99/09156, 5 pages, May 30, 2000.

(Continued)

*Primary Examiner*—Stacy A Whitmore
(74) *Attorney, Agent, or Firm*—Lawrence M. Mennemeier

(57) ABSTRACT

A method and apparatus are described for converting a number from a floating point format to an integer format or from an integer format to a floating point format responsive to a control signal of a control signal format.

Numbers are stored in the floating point format in a register of a first set of architectural registers in a packed format. One or more numbers in the floating point format are converted to the integer format and placed in a register of a second set of architectural registers in a packed format. Conversion from integer format to floating point format is performed in a similar manner.

A floating point arithmetic apparatus is described that provides for converting a plurality of numbers between integer formats and a floating point formats, further providing for conversion operations that require a greater data path width than floating-point arithmetic operations.

30 Claims, 35 Drawing Sheets

U.S. PATENT DOCUMENTS

| | | | |
|---|---|---|---|
| 5,157,388 | A | 10/1992 | Kohn |
| 5,257,215 | A | 10/1993 | Poon |
| 5,303,174 | A | 4/1994 | Okamoto |
| 5,404,469 | A * | 4/1995 | Chung et al. ............... 712/215 |
| 5,528,741 | A | 6/1996 | Lucas |
| 5,627,773 | A | 5/1997 | Wolrich et al. |
| 5,673,093 | A | 9/1997 | Brody |
| 5,673,407 | A | 9/1997 | Poland et al. |
| 5,696,709 | A | 12/1997 | Smith, Sr. |
| 5,721,855 | A | 2/1998 | Hinton et al. |
| 5,729,724 | A | 3/1998 | Sharangpani et al. |
| 5,740,093 | A | 4/1998 | Sharangpani |
| 5,761,103 | A | 6/1998 | Oakland et al. |
| 5,764,548 | A | 6/1998 | Keith et al. |
| 5,768,170 | A | 6/1998 | Smith |
| 5,802,219 | A | 9/1998 | Farkas et al. |
| 5,805,486 | A | 9/1998 | Sharangpani |
| 5,848,284 | A | 12/1998 | Sharangpani |
| 5,852,726 | A | 12/1998 | Lin |
| 5,874,969 | A | 2/1999 | Storm et al. |
| 5,933,160 | A * | 8/1999 | Kabir et al. ............... 345/561 |
| 5,968,116 | A | 10/1999 | Day, II et al. |
| 5,978,901 | A | 11/1999 | Luedtke et al. |
| 5,995,122 | A | 11/1999 | Hsieh et al. |
| 6,058,465 | A | 5/2000 | Nguyen |
| 6,061,782 | A * | 5/2000 | Elliott et al. ............... 712/222 |

OTHER PUBLICATIONS

Sun Microsystems; "Visual Instruction Set (VIS.TM.) User's Guide"; Ver. 1.1, Mar. 1997; pp. 11-12.

Advanced Micro Devices (AMD); "AMD-3D.TM. Technology Manual"; Feb., 1998; pp. 19, 20.

MIPS Technologies, Inc.; "MIPS Extension for Digital Media with 3D"; Dec. 3, 1996; pp. 1-26.

Bistry, et al.; "The Complete Guide to MMX.TM. Technology"; 1997: Chapter 1—pp.2-22.

Bistry, et al.; "The Complete Guide to MMX.TM. Technology"; 1997; chapter 2—pp.24-34.

Bistry, et al.; "The Complete Guide to MMX.TM. Technology"; 1997; Chapter 4—pp.54-65.

Bistry, et al.; "The Complete Guide to MMX.TM. Technology"; 1997; Chapter 5—pp. 68-110.

Bistry, et al.; "The Complete Guide to MMX.TM. Technology"; 1997; Appendix B—pp. 257-268.

Tom Shanley; "Pentium.RTM.Pro and Pentium.RTM.II System Architecture"; 1998; Chapter 18—pp. 379-406.

Tom Shanley; "Pentium.RTM. Pro and Pentium .RTM.II System Architecture"; 1998; Chapter 26—pp. 507-520.

Rohan Coelho, et al.; "Direct X.RTM., RDX, RSX, and MMX.TM. Technology a Jumpstart Guide to High Performance APls"; 1998; Chapter 18—pp. 277-286.

Rohan Coelho, et al.; "Direct X.RTM., RDX, RSX, and MMX.TM. Technology a Jumpstart Guide to High Performance APls"; 1998, Chapter 19—pp. 289-308.

Rohan Coelho, et al.; "Direct X.RTM., RDX, RSX, and MMX.TM. Technology a Jumpstart Guide to High Performance APls"; 1998; Chapter 20—PP. 311-330.

Rohan Coelho, et al.; "Direct X.RTM., RDX, RSX, and MMX.TM. Technology a Jumpstart Guide to High Performance APls"; 1998; Chapter 22—pp. 349-371.

Alpha Architecture Hanboodk Version 3, Oct. 1996, pp. 4-79 to 4-116.

"Mechanism to clamp and pack lit floating-point colors", IBM Technical Disclosure Bulletin, Mar. 1997, v40, n3, pp. 163-164.

"Hyperspeed product benchmarks—X860/XP860", Apr. 3, 1996, at www5.electriciti.com/hyperspd/i860bnch.html.

AMD-K6 Processor Data Sheet, Mar. 1998, Advanced Micro Devices, Inc. pp. 21-38.

"MIPS V Instruction Set," Oct. 1996, Rev. 1.0; pp. B-1, B-2, B-18.

"MIPS Digital Media Extension"; Oct. 1996, Rev. 1.0 pp. C-1, C-2.

Darley, M. et al., "The TMS390C602A Floating-Point Coprocessor for Sparc Systems", IEEE MICRO, Jun. 1990, pp. 36-47.

Gilliam, K. et al, "Design and Architecture for a Multi-Mode Pipelined, Floating-Point Adder", Proceedings of the IEEE, 1991, pp. 73-76.

* cited by examiner

FIG. 5c

Packed Byte 521: bits 63-56 Byte 7, 55-48 Byte 6, 47-40 Byte 5, 39-32 Byte 4, 31-24 Byte 3, 23-16 Byte 2, 15-8 Byte 1, 7-0 Byte 0

Packed Word 522: bits 63-48 Word 3, 47-32 Word 2, 31-16 Word 1, 15-0 Word 0

Packed Doubleword 523: bits 63-32 Doubleword 1, 31-0 Doubleword 0

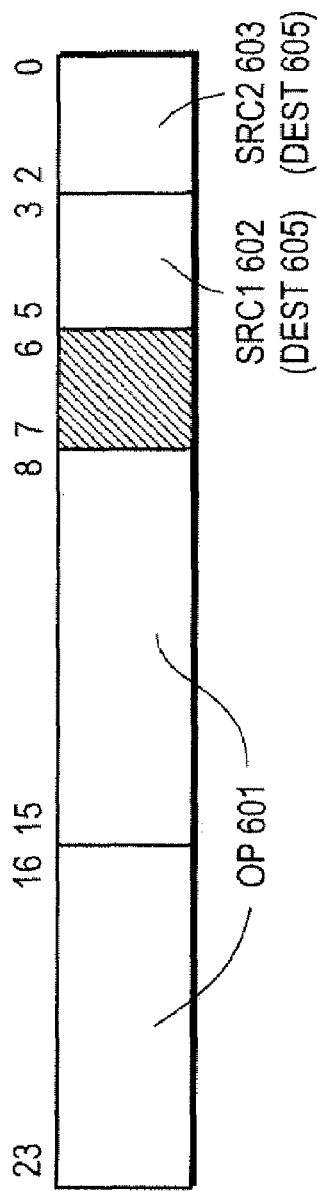
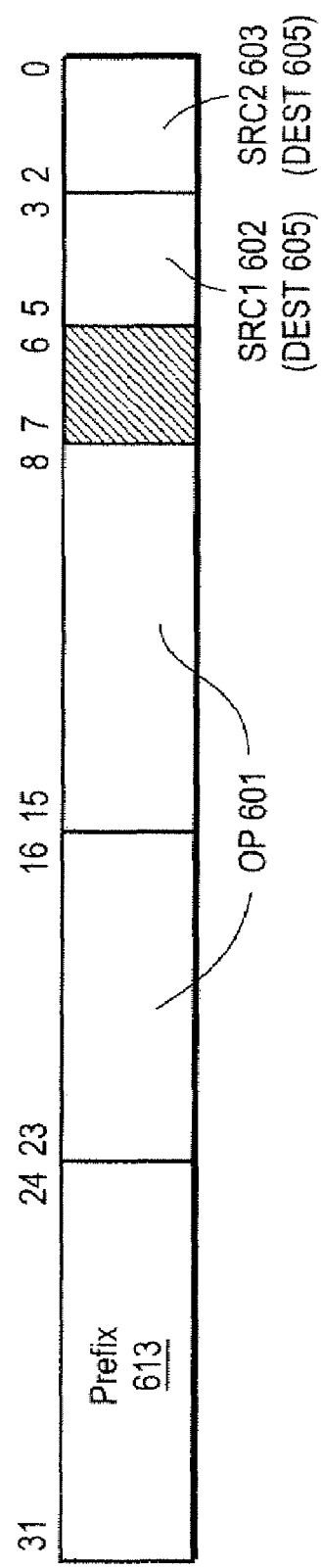
FIG. 6a
FIG. 6b

METHOD AND APPARATUS FOR FLOATING POINT OPERATIONS AND FORMAT CONVERSION OPERATIONS

CROSS-REFERENCES TO RELATED APPLICATIONS

This is a continuation-in-part application claiming, under 35 U.S.C. § 120, the benefit of the filing dates of U.S. application Ser. No. 09/070,891, filed on Apr. 30, 1998, now U.S. Pat. No. 6,266,769 and of U.S. application Ser. No. 09/071,466, also filed on Apr. 30, 1998, now U.S. Pat. No. 6,282,554.

FIELD OF THE INVENTION

The present invention relates generally to the parallel manipulation of data and, more particularly, to the parallel conversion of data between floating point and fixed point or integer data formats.

BACKGROUND OF THE INVENTION

In typical computer systems, processors are implemented to operate on values represented by a large number of bits, for example, 32-bits, using instructions that produce one result. For example, the execution of an ADD instruction will add together a first 32-bit value and a second 32-bit value and store the result as a third 32-bit value.

In some computer applications, the required range of numbers is very large. While it is possible to represent such numbers as multibyte integers or multibyte fractions, the memory required for storage is excessive. Also, when the number of significant bits required is small, the use of a multibyte representation is wasteful of memory. In addition, most very large or very small numbers do not require the precision of a multibyte representation. A more efficient representation of very large or very small decimal numbers is floating point notation or format. Floating point is useful for performing operations that require many precise calculations, such as operations in a graphics application.

Processors that perform floating point operations typically include special floating point circuitry to perform operations such as addition, subtraction, etc. Because it is not necessary or efficient for floating point numbers to be used for every application that may be executed on a processor, processors have the capability of performing operations using either floating point numbers or integer numbers. Conversions between the two formats are therefore often required.

Some applications require the manipulation of large amounts of data represented by fewer than 32 bits. Multimedia graphics, for instance, are typically generated by treating an image as a collection of small, independently controlled dots, or pixels. Position coordinates and color values corresponding to pixels are typically represented by fewer than 32 bits. The processing of the large amounts of data through a pipeline required by graphics applications can greatly increase processing time and slow graphics rendering correspondingly.

Multimedia graphics applications include, but are not limited to, applications targeted at computer supported cooperation (CSC), two-dimensional (2D) graphics, three-dimensional (3D) graphics, image processing, video compression/decompression, recognition algorithms and audio manipulation. As such, the data of multimedia applications typically comprises still images or video frames and sound data. The pixels of the still image or video data are typically represented using 8- or 16-bit data elements, and the sound data is typically represented using 8- or 16-bit data elements. When processing multimedia data comprising still images or video frames, the same operation is often performed repeatedly over all of the pixels of the image or of the frame. As each of these multimedia applications typically use one or more algorithms, and each algorithm typically uses a number of operations, multimedia extensions used to execute the same operations on 8-bit, 16-bit, or even 32-bit data while processing two, four, or eight data samples at a time speeds up computations that exhibit data parallelism.

To improve efficiency of multimedia applications, as well as other applications having similar characteristics, prior art processors use packed data formats. A packed data format is one in which a certain number of fixed sized data elements, each of which represents a separate value, are stored together. For example, a 64-bit register may be broken into two 32-bit elements, each of which represents a separate 32-bit value. In addition, these prior art processors provide instructions for separately manipulating each element in these packed data types in parallel. For example, a packed add instruction adds together corresponding data elements from a first packed data and a second packed data. Thus, if a multimedia algorithm requires a loop containing five operations that must be performed on a large number of data elements, it is desirable to pack the data and perform these operations in parallel using packed data instructions. In this manner, these processors can more efficiently process multimedia applications.

Therefore, in order to reduce the time required for graphics rendering in multimedia applications, parallel processing is used, wherein a single instruction operates on multiple elements of data; this process is typically referred to as Single Instruction Multiple Data (SIMD) processing. Typically, integer instructions operate on individual integer data elements (A+B). The SIMD instructions, however, operate on integer data arrays (A[1 . . . n]+B[1 . . . n]), where n is the number of elements in the array.

Typical prior art processing systems, in rendering 2D images, used only integer data in the geometry and rasterization phases because the smaller range of coordinate values did not necessitate the precision of floating point arithmetic. Therefore, the graphics data was rendered using SIMD processing of integer data, meaning that no conversion was typically required between the integer format and the floating point format.

However, in rendering 3D images, the data manipulations performed for the geometry phase are typically performed using floating point arithmetic because of the large range of values that define the coordinate space and because of the precision required within this range to accurately place the rendered images. Because the color component data is often stored and manipulated along with the corresponding position data it is convenient to perform operations on the rasterization data comprising color component data using floating point arithmetic. Upon completion of processing, the coordinates of the composited images are provided to the rasterization circuitry using the floating point format. In contrast, the color component data is provided to the rasterization circuitry using the integer format. Therefore, the color component data used to render the image is converted from the floating point format to the integer format in order to render an image display.

The problem in the prior art processors using SIMD processing of 3D graphic data is that, while parallel processing may be performed on floating point data, the conversion of the floating point data to integer data for rasterization creates a bottleneck in the processing pipeline because the prior art algorithms perform conversions sequentially. A prior art method of dealing with this problem duplicates the floating point execution resources of the processor. This duplication of resources allows for two floating point pipelines executing at the same time wherein the floating point data of each branch of the pipeline can be sequentially converted to integer format at the same time. While the delay due to the conversion execution bottleneck may be reduced with the use of the additional hardware, the additional hardware increases the cost and size of the system while increasing the overall complexity of the system.

BRIEF DESCRIPTION OF THE DRAWINGS

FIG. 5c illustrates one embodiment of packed data-types.

FIG. 6a, FIG. 6b, FIG. 6c and FIG. 6d illustrate alternative embodiments of a control signal format that may be used in the computer system to initiate an operation.

DETAILED DESCRIPTION

Figure 1:
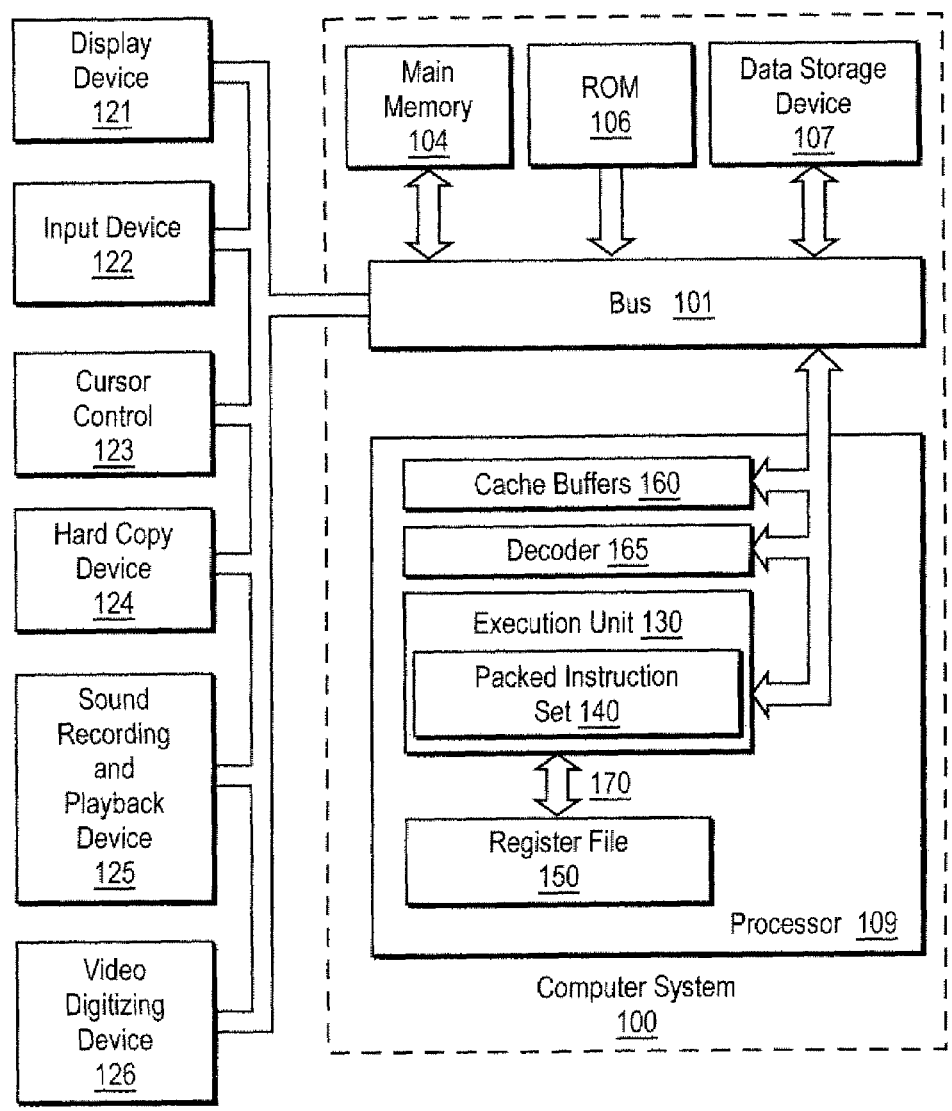
FIG. 1 is a computer system of one embodiment.

A method and apparatus are described that allow conversions between an integer format and a floating point format using a floating point arithmetic unit. A floating point arithmetic unit allows for performance of packed or scalar conversion operations. In one embodiment, the floating point arithmetic unit operates on single precision floating point numbers. In another embodiment, the floating point arithmetic unit operates on double precision floating point numbers.

In one embodiment, additional bit positions are added to operational units and data paths of the floating point arithmetic unit to accommodate the maximum possible shift required by a conversion operation. The additional bit positions enable the floating point arithmetic unit to be easily used for conversions both from floating point format to integer format and from integer format to floating point format. A circuit is provided to latch numbers coming into the floating point unit for conversion in a particular manner. A circuit is also provided to more quickly determine a number of bits to be shifted and a direction of shift in order to perform a conversion operation in fewer clock cycles.

In the embodiments described, data in one format in one architectural register is converted to another format and placed in another architectural register. There are advantages realized from placing a result of a conversion in an architectural register rather than in a memory location. Placing conversion results in an architectural register makes usage models that prefer consumption of a register result are more efficient. For example, in the case of performing 3-dimensional operations using packed floating point numbers in 128-bit single instruction multiple data (SIMD) registers and performing rasterization using packed integers in 64-bit SIMD registers, it would be inconvenient for intermediate conversion results to be stored in memory. This is because the conversion results would be immediately required from memory, necessitating a memory access operation that would place the results back in a register. If it is ever required to move a conversion result to memory, that can be done easily with a STORE instruction.

In addition, placing conversion results in a register make the use of conversion instructions more flexible in some systems. In particular, in some processor architectures, a computation operation cannot have memory as both a source of one operand and the destination of the result. If an architectural register is the destination, as in the described embodiments, a conversion operation can have memory as an operand source.

In one embodiment, packed single precision floating point format data are placed in architectural registers of a set of 128-bit architectural registers, while the scalar format data are placed in 32-bit architectural registers or memory. Furthermore, a method and apparatus for converting data between a packed single precision floating point format and a packed integer format are described. In one embodiment, packed 32-bit single precision floating point format data are placed in architectural registers of a set of 128-bit architectural registers, while packed 32-bit integer format data are placed in architectural registers of a set of 64-bit architectural registers. In alternative embodiments, packed 64-bit double precision floating point format data are placed in architectural registers of a set of 128-bit architectural registers, while packed 32-bit integer format data are placed in architectural registers of a set of 64-bit architectural registers. In other alternative embodiments, integer format data are also placed in architectural registers of a set of 128-bit architectural registers. In other alternative embodiments, architectural resisters may be of different sizes. For example, 128-bit registers may be used instead of 64-bit registers.

A method and apparatus for performing parallel conversion of 3D graphics data is described, wherein the graphics data is converted in parallel between different sets of architectural registers for processing. As such, scalar integer data or memory data may be converted to a packed floating point format in parallel using the instructions provided herein. The packed floating point data is manipulated to provide the graphic data used in 3D image rendering. Following manipulation, the packed floating point graphics data are converted to a packed integer format in parallel using the instructions described herein. The packed integer data are used to render an image display.

A method and apparatus for using the conversion instructions in the parallel conversion of multiple color component data, or values, from packed single precision floating point format to packed integer format are described. Intended advantages of the parallel conversion instructions can include reduced processing time over sequential conversion techniques, a decreased number of instructions in the processing of graphics data, no requirement for duplicated floating point execution resources, and higher application processing efficiency.

COMPUTER SYSTEM

FIG. 1 shows one embodiment of a computer system 100. The computer system 100 is an example of one type of computer system that can be used with embodiments of the present invention. Other types of computer systems, not shown, that are configured differently, could also be used with embodiments of the present invention. The computer system 100 comprises a bus 101, or other communications hardware and software, for communicating information, and a processor 109 coupled to the bus 101 for processing information. The processor 109 represents a central processing unit (CPU) having any type of architecture, including complex instruction set computing (CISC) architecture or reduced instruction set computing (RISC) architecture. The processor 109 comprises an execution unit 130, a register file 150, a cache 160, a decoder 165, and an internal bus 170. The term "registers" is used herein to refer to the on-board processor storage locations that are used as part of macro-instructions to identify operands (also referred to as architectural registers). In other words, the registers referred to herein are those that are visible from the outside of the processor (from a programmers perspective). However, the registers described herein can be implemented by circuitry within a processor using any number of different techniques, such as dedicated physical registers, dynamically allocated physical registers using register renaming, combinations of dedicated and dynamically allocated physical registers, etc. The register file 150 may comprise a single register file comprising multiple architectural registers or may comprise multiple register files, each comprising multiple architectural registers.

The computer system 100 further comprises a random access memory (RAM) or other dynamic storage device in main memory 104 coupled to the bus 101 for storing information and instructions to be executed by the processor 109. The main memory 104 may be used for storing temporary variables or other intermediate information during execution of instructions by processor 109. The computer system 100 further comprises a read only memory (ROM) 106, or other static storage device, coupled to the bus 101 for storing static information and instructions for the processor 109.

A data storage device 107, such as a magnetic disk or optical disk and a corresponding disk drive, is coupled to the bus 101. The computer system 100 may be coupled via the bus 101 to a display device 121 for displaying information to a user of the computer system 100. Display device 121 can include a frame buffer, specialized graphics rendering devices, a cathode ray tube (CRT), and a flat panel display, but the invention is not so limited. An alphanumeric input device 122, including alphanumeric and other keys, may be coupled to the bus 101 for communicating information and command selections to the processor 109. Another type of user input device is a cursor control 123 comprising a mouse, a trackball, a pen, a touch screen, or cursor direction keys for communicating direction information and command selections to the processor 109, and for controlling cursor movement on the display device 121. The input device of one embodiment has two degrees of freedom in two axes, a first axis, or x-axis, and a second axis, or y-axis, which allows the input device to specify positions in a plane, but the invention is not so limited.

In one embodiment, a hard copy device 124 is coupled to the bus 101 and is used for printing instructions, data, and other information on a medium such as paper, film, or similar types of media. Additionally, the computer system 100 can be coupled to a device for sound recording and playback 125. The sound recording may be accomplished using an audio digitizer coupled to a microphone, and the sound playback may be accomplished using a speaker which is coupled to a digital to analog (D/A) converter for playing back the digitized sounds, but the invention is not so limited.

The computer system 100 can function as a terminal in a computer network, wherein the computer system 100 is a computer subsystem of a computer network, but the invention is not so limited. The computer system 100 may further include a video digitizing device 126. The video digitizing device 126 can be used to capture video images that can be transmitted to other computer systems coupled to the computer network.

In one embodiment, the processor 109 additionally supports an instruction set which is compatible with the x86 and/or x87 instruction sets, the instruction sets used by existing microprocessors such as the Pentium® processors manufactured by Intel Corporation of Santa Clara, Calif. Thus, in one embodiment, the processor 109 supports all the operations supported in the Intel Architecture (IA™), as defined by Intel Corporation of Santa Clara, Calif. See Microprocessors, Intel Data Books volume 1 and volume 2, 1992 and 1993, available from Intel of Santa Clara, Calif. As a result, the processor 109 can support existing x86 and/or x87 operations in addition to the operations of the invention. Alternative embodiments of the invention may incorporate the invention into other instruction sets.

The execution unit 130 is used for executing instructions received by the processor 109. In addition to recognizing instructions typically implemented in general purpose processors, the execution unit 130 recognizes instructions in a packed instruction set 140 for performing operations on packed data formats. In one embodiment, the packed instruction set 140 comprises instructions for supporting pack operations, unpack operations, packed add operations, packed subtract operations, packed multiply operations, packed shift operations, packed compare operations, multiply-add operations, multiply-subtract operations, population count operations, and a set of packed logical operations, but the invention is not so limited. The set of packed logical operations of one embodiment comprise packed AND, packed ANDNOT, packed OR, and packed XOR, but the invention is not so limited. While one embodiment is described wherein the packed instruction set 140 includes these instructions, alternative embodiments may comprise a subset or a super-set of these instructions.

These instructions provide for performance of the operations required by many of the algorithms used in multimedia applications that use packed data. Thus, these algorithms may be written to pack the necessary data and perform the necessary operations on the packed data, without requiring the packed data to be unpacked in order to perform one or more operations on one data element at a time. Therefore, these algorithms provide performance advantages over prior art general purpose processors that do not support the packed data operations required by certain multimedia algorithms. For example, if a multimedia algorithm requires an operation that cannot be performed on packed data, the prior art program, in contrast to the present invention, must unpack the data, perform the operation on the separate elements individually, and then pack the results into a packed result for further packed processing.

The execution unit 130 is coupled to the register file 150 using an internal bus 170. The register file 150 represents a storage area on the processor 109 for storing information, including data. Furthermore, the execution unit 130 is coupled to a cache 160 and a decoder 165. The cache 160 is used to cache data and control signals from, for example, the main memory 104. The decoder 165 is used for decoding instructions received by the processor 109 into control signals and microcode entry points. In response to these control signals and microcode entry points, the execution unit 130 performs the appropriate operations. For example, if an ADD instruction is received, the decoder 165 causes execution unit 130 to perform the required addition; if a subtract instruction is received, the decoder 165 causes the execution unit 130 to perform the required subtraction. Thus, while the execution of the various instructions by the decoder 165 and the execution unit 130 is represented by a series of if/then statements, the execution of an instruction of one embodiment does not require a serial processing of these if/then statements.

The register file 150 is used for storing information, including control and status information, scalar data, integer data, packed integer data, and packed floating point data. In one embodiment, the register file 150 may comprise memory registers, control and status registers, scalar integer registers, scalar floating point registers, packed single precision floating point registers, packed integer registers, and an instruction pointer register coupled to the internal bus 170, but the invention is not so limited. In one embodiment, the scalar integer registers are 32-bit registers, the packed single precision floating point registers are 128-bit registers, and the packed integer registers are 64-bit registers, but the invention is not so limited.

In one embodiment, the packed integer registers are aliased onto the same memory space as the scalar floating point registers. Separate registers are used for the packed floating point data. In using registers of register file 150, the processor 109, at any given time, must treat the registers as being either stack referenced floating point registers or non-stack referenced packed integer registers. In this embodiment, a mechanism is included to allow the processor 109 to switch between operating on registers as stack referenced floating point registers and non-stack referenced packed data registers. In another such embodiment, the processor 109 may simultaneously operate on registers as non-stack referenced floating point and packed data registers. Furthermore, in an alternate embodiment, these same registers may be used for storing scalar integer data.

Alternative embodiments may contain different sets of registers. For example, an alternative embodiment may comprise separate registers for the packed integer registers and the scalar data registers. An alternate embodiment may include a first set of registers, each for storing control and status information, and a second set of registers, each capable of storing scalar integer, packed integer, and packed floating point data.

The registers of the register file 150 may be implemented to include different numbers of registers and different size registers, but the invention is not so limited. For example, in one embodiment, the integer registers may be implemented to store 32 bits, while other registers are implemented to store 128 bits, wherein all 128 bits are used for storing floating point data while only 64 are used for packed data. In an alternate embodiment, the integer registers each contain 32 or 64 bits.

PROCESSOR

Figure 2:
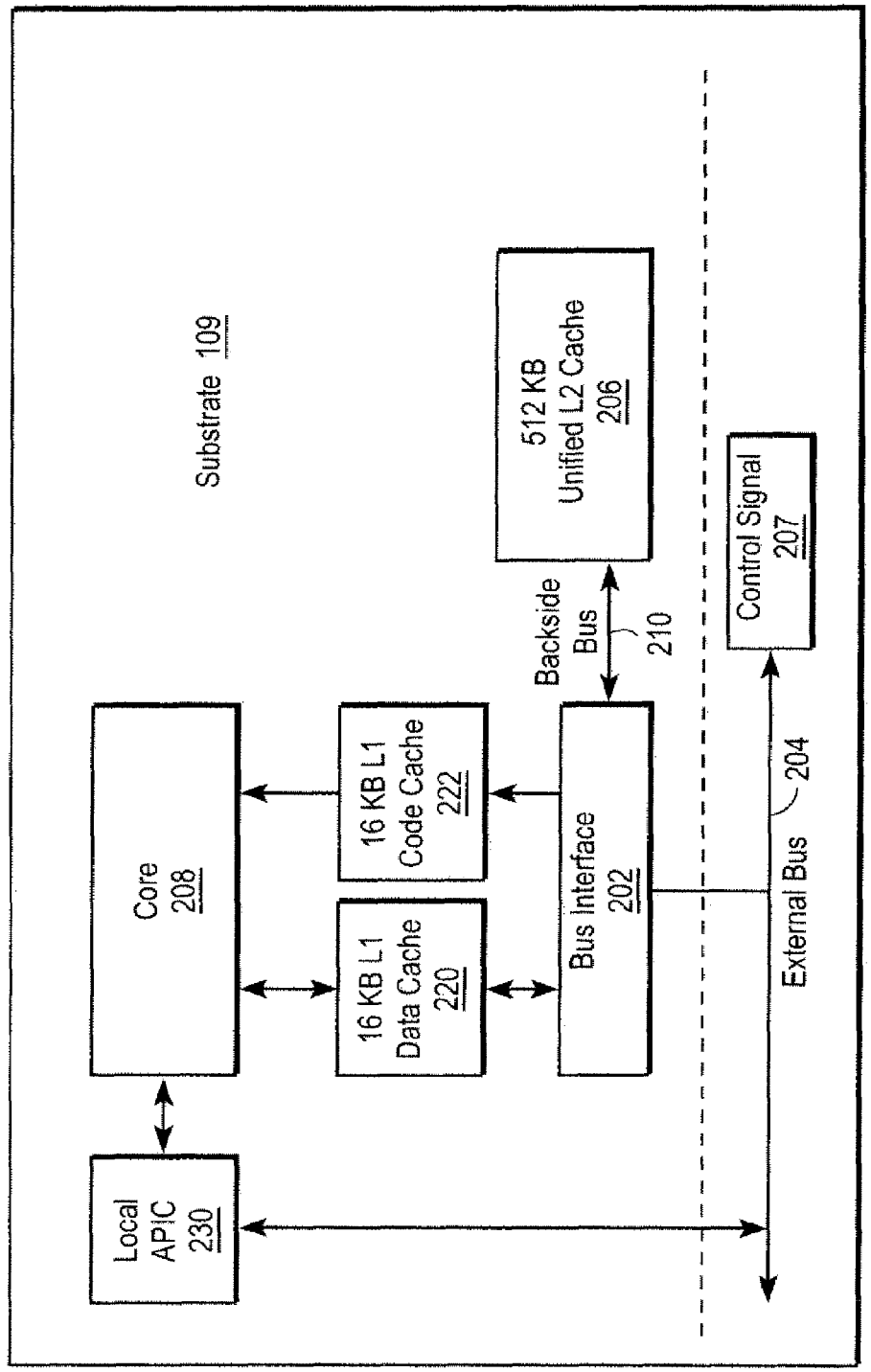
FIG. 2 is a processor of one embodiment.

FIG. 2 illustrates one embodiment of a processor 109. The processor 109 comprises a bus interface unit 202 that couples the processor 109 to an external bus 204, wherein the external bus 204 is used to communicate with other system devices. Bus unit 204 may, for example, receive data and instructions from main memory 104 for processor 109, the instructions including control signal 207. The bus interface unit 202 performs bus transactions when requested by the L2 cache 206 or the processor core 208. Furthermore, the bus interface unit 202 couples the processor 109 to a unified L2 cache 206 using a backside bus 210. The L2 cache 206 may be off the chip, and may run at a fraction of the speed of the core processor 208, but the invention is not so limited. The L2 cache 206 of one embodiment comprises 512 Kbytes, but the invention is not so limited. The L2 cache 206 services misses on the L1 data 220 and code 222 caches, and may issue requests to the bus interface unit 202.

The bus interface unit 202 of one embodiment is coupled to the processor core 208 using an L1 data cache 220 and an L1 code cache 222, each of which are 16 Kbytes, but the invention is not so limited. The L1 caches 220–222 are first level caches that can provide data in one clock cycle on a cache hit. A cache hit occurs when the requested data is already in the cache; otherwise a cache miss occurs, and the data is brought in from main memory or the L2, or second level, cache 206. The L1 data cache 220 services data load and store requests issued by the load and store execution units; when a miss occurs, the L1 data cache 220 forwards requests to the L2 cache 206. The L1 code cache 222 services instruction fetch requests issued by the instruction prefetcher and may store and provide translated or untranslated copies of control signal 207 to processor 109.

The processor core 208 comprises logic responsible for: instruction fetch; branch prediction; parsing of instruction streams; decoding instructions into reduced instruction set computing (RISC) instructions, or micro-ops; mapping accesses among register sets; and dispatch, execution, and retirement of micro-ops. The processor core 208 may run at speeds of 233, 266, and 300 megahertz (MHz), but the invention is not so limited. The processor 109 supports out-of-order execution, wherein micro-ops are executed based on the readiness of their data rather than the order in which they entered the execution unit. An asynchronous processor interrupt control (APIC) unit 230 receives interrupt requests and prioritizes and forwards the requests to the processor core 208 for execution.

The processor of one embodiment is an advanced superscalar processor built around two general-purpose integer pipelines and a pipelined floating-point unit, allowing the processor to execute two integer instructions simultaneously. The processor can issue two instructions in each clock cycle, one in each pipe, but the invention is not so limited.

Figure 3:
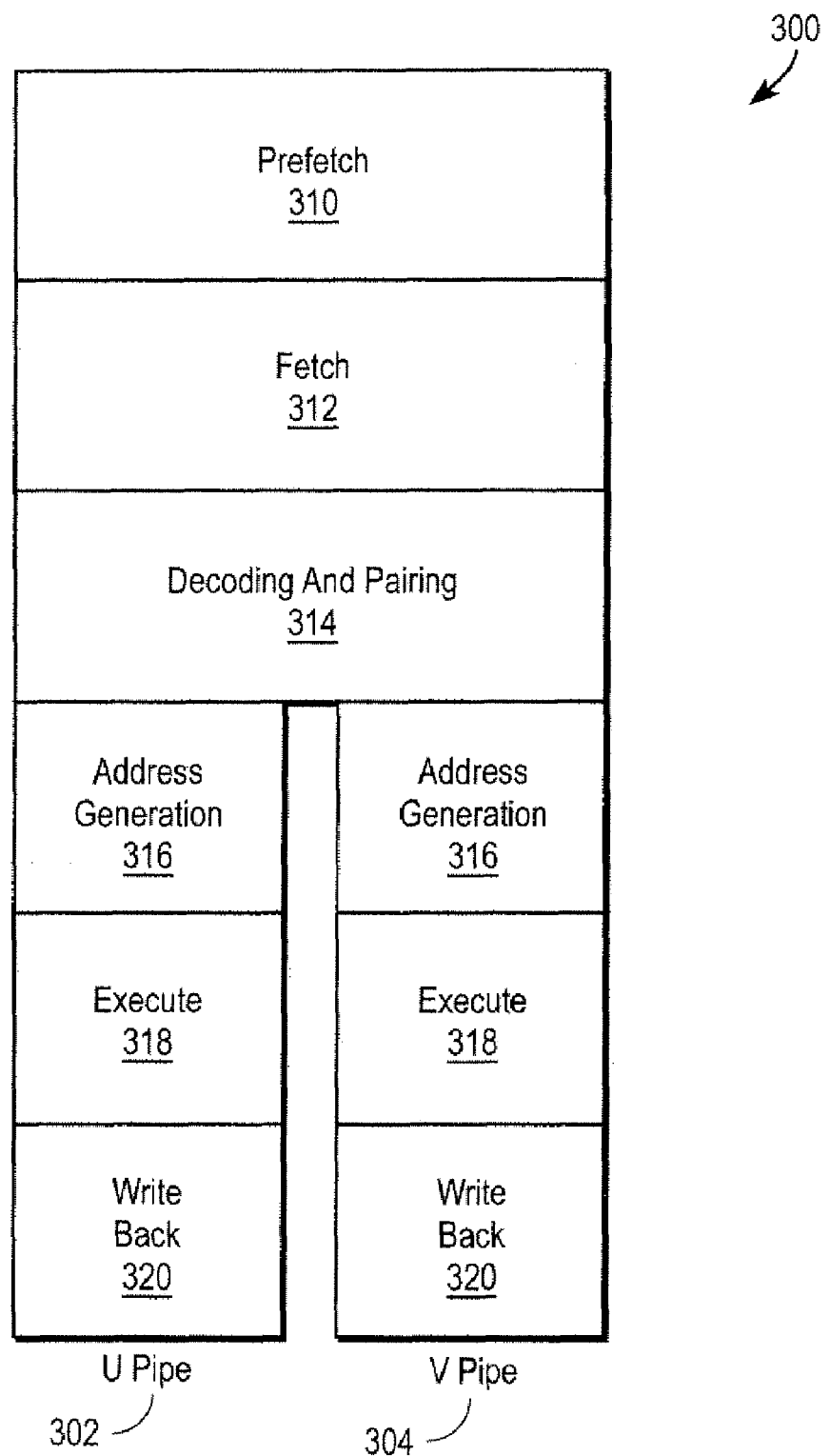
FIG. 3 is a dual data pipeline of one embodiment.

FIG. 3 is a dual data pipeline 300 of one embodiment. Other embodiments may have one pipeline or more than two pipelines. The first logical pipe is referred to as the U-pipe 302, and the second logical pipe is referred to as the V-pipe 304. During the decoding of any given instruction, the next two instructions are checked, and if possible, they are issued such that the first one executes in the U-pipe 302 and the second in the V-pipe 304. If it is not possible to pair two instructions, the next instruction is issued to the U-pipe 302 and no instruction is issued to the V-pipe 304. When instructions execute in the two pipes 302–304, their behavior is the same as if they were executed sequentially. The processor micro-architecture comprises the following stages: instruction prefetch 310, instruction fetch 312, instruction decoding, pairing, and dispatch 314, address generation 316, operand read and execution 318, and writeback 320. Instruction decode logic decodes, schedules, and issues the instructions at a rate of up to two instructions per clock cycle.

Figure 4:
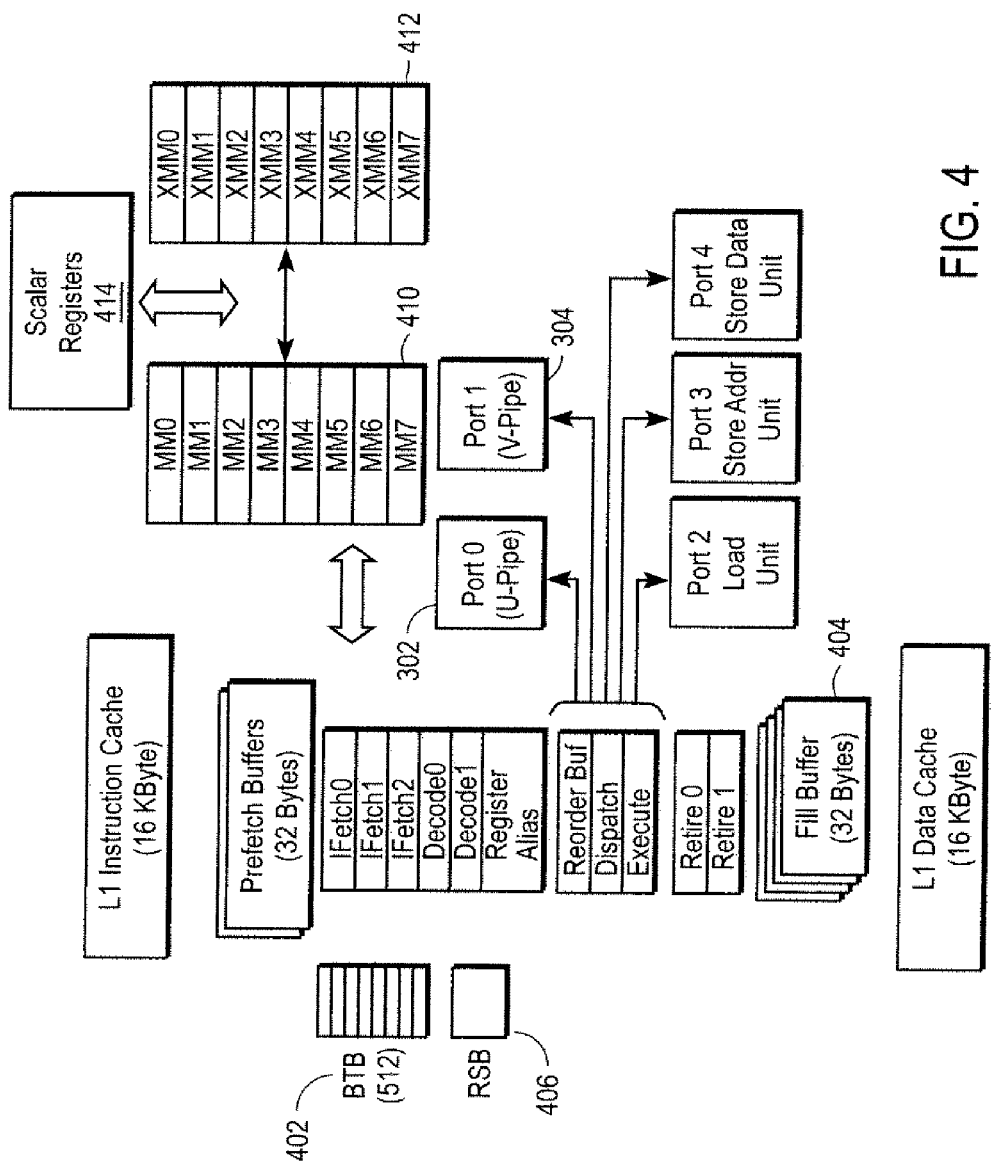
FIG. 4 is a cache architecture of a processor of one embodiment.

FIG. 4 is a cache architecture of a processor of one embodiment. The processor comprises a twelve-stage pipelined architecture with an out-of-order execution core. Furthermore, the processor of one embodiment comprises three parallel decoders, five execution ports 0–4, a branch target buffer (BTB) 402 with 512 entries, four 32-byte write buffers 404, a set of 32-bit scalar registers 414, a set of eight 64-bit registers 410, a set of eight 128-bit multimedia extension registers 412, and a return stack buffer (RSB) 406. The BTB 402 holds a history of branches that were mispredicted during the execution of an application. It stores the address of the mispredicted branch instruction, the branch target address, and the result of the misprediction. When the same instructions show up again, the branch prediction unit uses this information to predict the outcome of the branch. The RSB 406 may correctly predict return addresses for procedures that are called from different locations in succession.

As previously discussed herein, the processor comprises two execution pipelines, the U-pipe 302 and the V-pipe 304. These pipelines 302–304 operate in parallel and may sustain an execution rate of up to two instructions every clock cycle. The U-pipe 302 and the V-pipe 304 can write to any of the four write buffers 404. Furthermore, one embodiment supports pipelining, or overlapping operations. In pipelining, the processor breaks instruction execution into multiple stages comprising fetch, decode, execution, and writeback. As a result, the processor can execute multiple instructions at the same time, each in a different execution stage. For example, one instruction could be in the prefetch stage, one in decode, one in execution, and one in writeback. As previously discussed herein, parallel processing wherein a single instruction operates on multiple elements of data is often referred to as Single Instruction Multiple Data (SIMD).

The set of eight 64-bit registers 410 of one embodiment allow for parallel processing to the level where a single instruction operates on multiple elements of data. This process benefits applications that perform the same operation repetitively on contiguous blocks of data, as in multimedia algorithms. The 64-bit registers 410 may be mapped or aliased onto the registers 414, but the invention is not so limited. Because the 64-bit registers 410 are a part of the floating-point state, there is no new state. When the 64-bit registers 410 are aliased onto the 32-bit scalar registers 414, in accessing the aliased registers, multimedia extension instructions interpret the data as packed integer bytes, or words, and floating-point instructions interpret the same data as the mantissa part of a floating-point number. Equally important is that the multimedia extension instructions have access to the eight dedicated 64-bit registers 410 in addition to the eight 32-bit scalar registers 414.

Three packed data types and a 64-bit quad-word are defined for the 64-bit registers 410 of one embodiment. Each element within the packed data types is a fixed-point integer. The user controls the place of the fixed point within each element and is responsible for its placement throughout the calculation. This provides the user with the flexibility to choose and change fixed-point formats during the application in order to fully control the dynamic range of values.

The 64-bit registers 410 contain packed, fixed-point integer data. Each 64-bit multimedia extension register MM0–MM7 can be directly addressed by designating a register name in the instructions. With regard to register access, these registers MM0–MM7 become random access registers; that is, they are not accessed via a stack model as they are with the floating-point instructions. Instructions that specify a memory operand use the 32-bit scalar registers 414 to address that operand.

Because the 64-bit registers 410 actually use the floating-point registers, applications that use multimedia extension technology have 16 integer registers to use. Eight registers are the 64-bit multimedia extension floating-point registers MM0–MM7 comprising packed data, and eight registers are the 32-bit scalar registers 414, which can be used for different operations like addressing, loop control, or any other data manipulation.

Memory and integer register operations support the movement of data between the 64-bit registers 410 and the 32-bit scalar registers 414 or memory. The 32-bit and 64-bit memory access support in the U-pipe 302 is used for performing 32-bit and 64-bit memory transfers to and from the 64-bit registers 410. Furthermore, the processor uses the U-pipe 302 for transfers between the integer and multimedia processing data paths.

The instructions corresponding to the 64-bit registers 410 operate in parallel on the packed byte, packed word, packed doubleword, and quadword data types packed into 64-bit registers. The packed byte data type comprises eight packed consecutive bytes in a 64-bit register, or eight elements per operand. The packed word data type comprises four packed consecutive words in a 64-bit register, or four elements per operand. The packed doubleword data type comprises two packed consecutive double words in a 64-bit register, or two elements per operand. The quadword data type comprises one quad word in a 64-bit register, or one element per operand. The instructions perform signed and unsigned arithmetic, logical, packing, and unpacking operations on the data type boundaries. Furthermore, the instructions allow for saturation or wrap-around to handle overflow and underflow conditions. The instructions of one embodiment comprise MOVQ, POR, PSLLD, and UNPACK instructions. The MOVQ instruction transfers 64 bits among the first set of multimedia extension registers and among the first set of multimedia extension registers and memory. The POR instruction causes execution of a bitwise logical OR in the first set of multimedia extension registers. The PSLLD instruction causes execution of a shift left logical without carry across data type boundary in the first set of multimedia extension registers. The UNPACK instruction interleaves data by taking one operand from one register and one operand from a corresponding location in another register and placing both operands contiguously in a register. For example, an UNPACK HIGH instruction places the high operand of one register and the high operand of another register contiguously in a register. In one embodiment, an UNPACK instruction operates on a zero operand from one source register and a non-zero operand from another source register and places both operands in the source register of the zero operand.

The processor architecture comprising the 128-bit multimedia extension registers 412 of one embodiment further accelerates performance of 3D graphics applications over prior art multimedia extension technologies. The associated programming model uses instructions that operate on new packed floating-point data types which contain four single precision floating point numbers, but the invention is not so limited. General purpose floating point instructions are used to operate on the set of eight 128-bit multimedia extension registers XMM0–XMM7, thereby providing the programmer with the ability to develop algorithms that can finely mix packed single precision floating-point and integer data. Furthermore, instructions are introduced to control cacheability of packed floating-point data and integer data. These new instructions comprise the ability to stream data into the eight 64-bit multimedia extension registers MM0–MM7 and the eight 128-bit multimedia extension registers XMM0–XMM7 without polluting the caches. Moreover, these instructions comprise the ability to prefetch data before it is actually used. The intended advantage of packed floating point instructions is the acceleration of 3D geometry and graphics, the acceleration of 3D rendering, and the acceleration of video encoding and decoding.

In one embodiment, the Single Instruction Multiple Data (SIMD) technique is used, but the invention is not so limited. As previously discussed herein, this technique speeds up software performance by processing multiple data elements in parallel, using a single instruction. The 128-bit multimedia extension registers 412 support operations on packed single precision floating point data types, and the 64-bit registers 410 support operations on packed quadrate data types, or byte, word, and double-word data types. This approach is used because most 3D graphics and digital signal processing (DSP) applications have characteristics comprising the following: inherently parallel; wide dynamic range, hence floating-point based; regular and re-occurring memory access patterns; localized re-occurring operations performed on the data; and, data independent control flow.

In one embodiment, eight 128-bit general purpose registers XMM0–XMM7 are provided, each of which can be directly addressed. These 128-bit registers XMM0–XMM7 hold packed 128-bit data. In one embodiment, the principle data type of the 128-bit multimedia extension registers 412 is a packed single precision floating point operand, specifically four 32-bit single precision floating point numbers, but the invention is not so limited. The corresponding multimedia extension instructions access the 128-bit registers 412 directly using register names, but the invention is not so limited. The 128-bit registers 412 may be used to perform calculations on data.

The real-number system comprises the continuum of real numbers from minus infinity to plus infinity. Because the size and number of registers that any computer can have is limited, only a subset of the real-number continuum can be used in real-number calculations. As the subset of real numbers that a particular processor supports represents an approximation of the real-number system, the range and precision of this real-number subset is determined by the format that the processor uses to represent real numbers. To increase the speed and efficiency of real-number computations, computers typically represent real numbers in a binary floating-point format. In this format, a real number has three parts: a sign, a significand, and an exponent.

DATA STORAGE AND FORMATS

In the following description, references to bit, byte, word, doubleword, and quadword subfields are made. For example, bit six through bit zero of the byte $00111010_2$ (shown in base 2) represent the subfield $111010_2$.

Figure 5A:
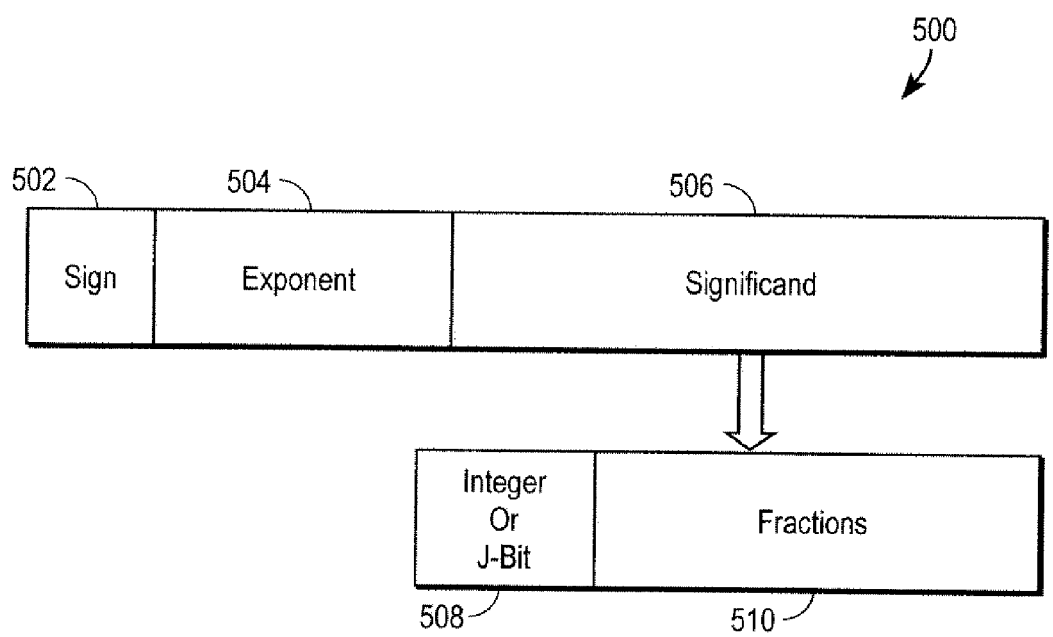
FIG. 5a is a binary floating-point format used by a 128-bit multimedia extension registers of one embodiment.

FIG. 5a is a binary floating-point format 500 used by one embodiment of the 128-bit multimedia extension registers. For one embodiment, this format conforms to the IEEE 754 standard ("IEEE Standard for Binary Floating Point Arithmetic," *SIGPLAN Notices*, 22(2), pp. 9–25, 1985). The sign 502 is a binary value that indicates the number is positive (0) or negative (1). The significand 506 has two parts: a 1-bit binary integer 508, also referred to as the J-bit; and, a binary fraction 510. In alternative embodiments, the J-bit 508 is not explicitly represented, but instead is an implied value. The exponent 504 is a binary integer that represents the base-2 power to which the significand 506 is raised.

For one embodiment of the floating point format 500, the sign 502 is identified with bit thirty-one, the exponent 504 is identified with bit thirty through bit twenty-three and the significand 506 is identified with bit twenty-two through bit zero. This embodiment may be referred to as a single precision floating point format. For an alternative embodiment, the sign 502 is identified with bit sixty-three, the exponent 504 is identified with bit sixty-two through bit fifty-two and the significand 506 is identified with bit fifty-one through bit zero. This embodiment may be referred to as a double precision floating point format. For an alternative embodiment, the sign 502 is identified with bit seventy-nine, the exponent 504 is identified with bit seventy-eight through bit sixty-four and the significand 506 is identified with bit sixty-three through bit zero, the integer bit 508 being explicitly identified with bit sixty-three. This embodiment may be referred to as a double extended precision floating point format.

Regarding memory data formats, one embodiment of the packed 128-bit data type comprises four single precision floating point numbers. An alternative embodiment of the packed 128-bit data type comprises two double precision floating point numbers. The 128 bits are numbered 0 through 127, wherein bit 0 is the least significant bit (LSB), and bit 127 is the most significant bit (MSB). The bytes of the packed 128-bit data type of one embodiment have consecutive memory addresses, wherein the ordering is little endian, that is, the bytes with the lower addresses are less significant than the bytes with the higher addresses.

Figure 5B:
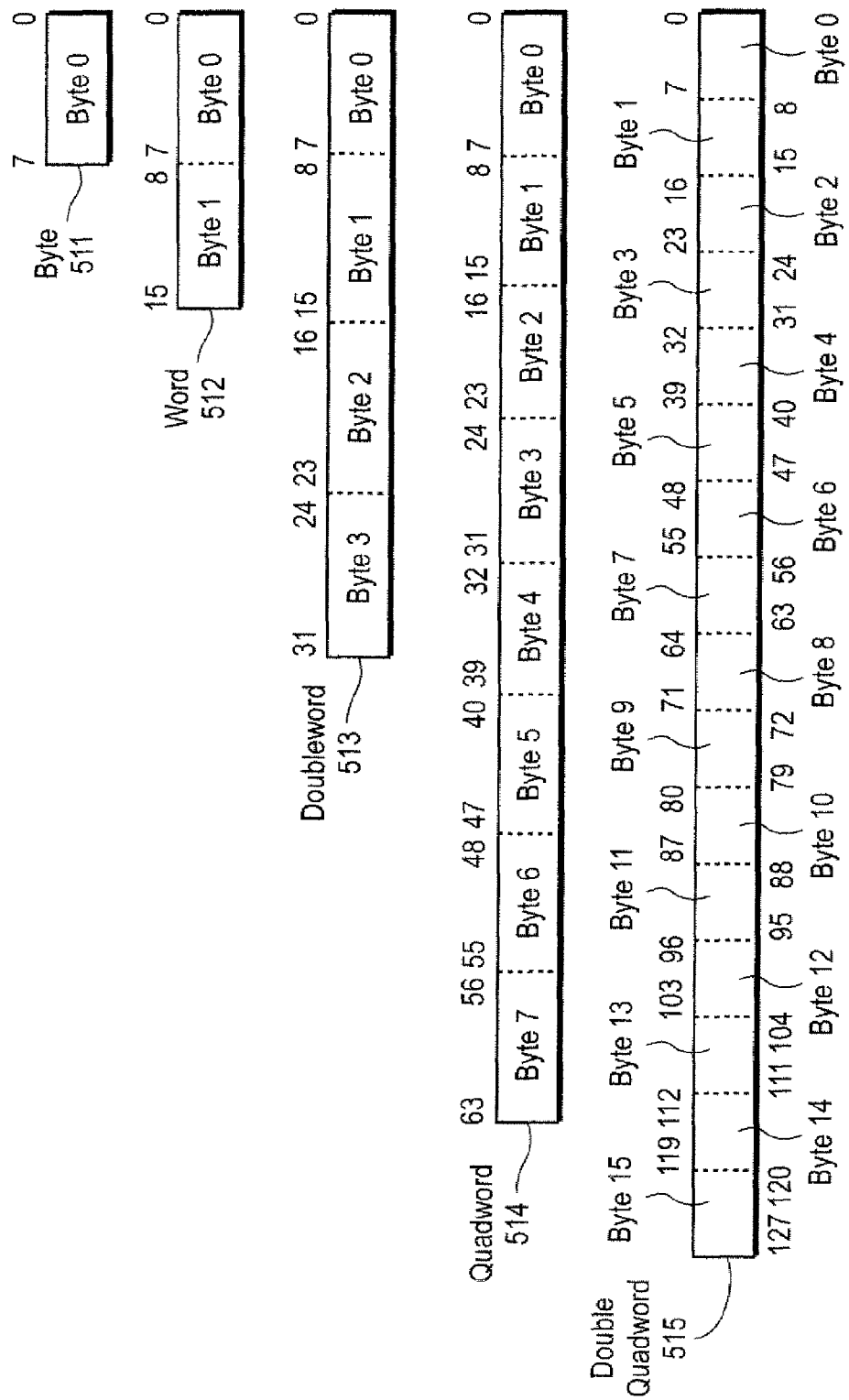
FIG. 5b illustrates memory data types.

FIG. 5*b* illustrates some of the other data formats as may be used in computer system 100. These data formats are fixed point. Processor 109 can manipulate these data formats. Multimedia algorithms often use these data formats. A byte 511 contains eight bits of information. A word 512 contains sixteen bits of information, or two bytes. A doubleword 513 contains thirty-two bits of information, or four bytes. A quadword 514 contains sixty-four bits of information, or eight bytes. A double quadword 515 contains one hundred and twenty-eight bits of information, or sixteen bytes. Thus, processor 109 executes control signals that may operate on any one of these memory data formats.

FIG. 5*c* illustrates the data formats for one embodiment of packed data types. Three packed data formats are illustrated; packed byte 521, packed word 522, and packed doubleword 523. Packed byte, in this embodiment, is sixty-four bits long containing eight data elements. Each data element is one byte long. Generally, a data element is an individual piece of data that is stored in a single register (or memory location) with other data elements of the same length. In this embodiment, the number of data elements stored in a register is sixty-four bits divided by the length in bits of a data element. It will be appreciated that alternative embodiments may include registers having a capacity for storing more bits or for storing less bits, and that these registers may store data in more packed data formats or in less packed data formats than those illustrated in FIG. 5*c*.

Packed word 522 is sixty-four bits long and contains four word 512 data elements. Each word 512 data element contains sixteen bits of information.

Packed doubleword 523 is sixty-four bits long and contains two doubleword 513 data elements. Each doubleword 513 data element contains thirty-two bits of information.

Figure 5D:
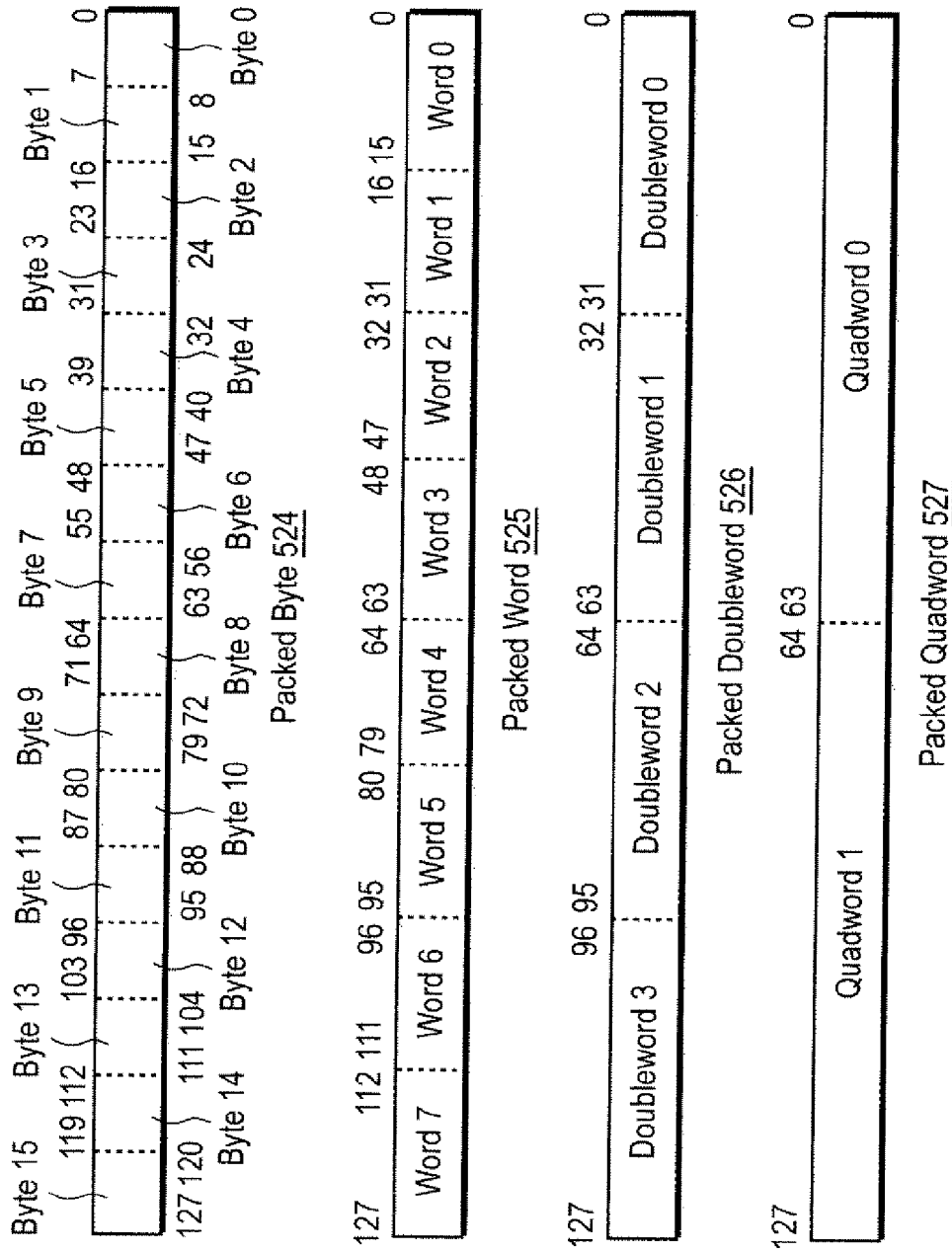
FIG. 5d illustrates an alternative embodiment of packed data-types.

FIG. 5*d* illustrates one alternative embodiment of packed data-types. In this embodiment, four packed data formats are illustrated; packed byte 524, packed word 525, packed doubleword 526, and packed quadword 527. Packed byte 524, in this embodiment, is one hundred and twenty-eight bits long containing sixteen byte 511 data elements. Each data element is one byte long. In this embodiment, the number of data elements stored in a register is one hundred and twenty-eight bits divided by the length in bits of a data element. It will be appreciated that alternative embodiments including registers with a capacity for storing more bits may or may not include additional packed data formats—for example packed double quadwords, or packed 2-dimensional pixels (or 3-dimensional voxels) of various sizes.

Packed word 525 is one hundred and twenty-eight bits long and contains eight word 512 data elements. Each word 512 data element contains sixteen bits of information.

Packed doubleword 526 is one hundred and twenty-eight bits long and contains four doubleword 513 data elements. Each doubleword 513 data element contains thirty-two bits of information.

Packed quadword 527 is one hundred and twenty-eight bits long and contains two quadword 514 data elements. Each quadword 514 data element contains sixty-four bits of information.

Regarding register data formats, values in the 128-bit multimedia extension registers have the same format as a 128-bit quantity in memory. Two or more data access modes may be supported, a 128-bit access mode and a 32-bit access mode, but the invention is not so limited. For one embodiment, the floating point data types correspond directly to the single precision format or to the double precision format in the IEEE 754 standard. The fraction part of the significand is encoded. The integer is assumed to be one for all numbers except zero and denormalized finite numbers. The exponent is encoded in biased format. The biasing constant is 127 for the single precision format, 1023 for the double precision format, and 16383 for the double extended precision format.

When storing real values in memory, single-precision values are stored in four consecutive bytes in memory, double precision values are stored in eight consecutive bytes and double extended precision values are stored in ten consecutive bytes. The 128-bit access mode may be used for 128-bit memory accesses, 128-bit transfers between the 128-bit multimedia extension registers, and all logical, unpack and arithmetic instructions. The 32-bit access mode may be used for 32-bit memory access, 32-bit transfers between the 128-bit multimedia extension registers, and all arithmetic instructions. A 64-bit access mode may also be used for 64-bit memory access, 64-bit transfers between the 128-bit multimedia extension registers, and all arithmetic instructions. Direct access may be allowed to all of the 128-bit multimedia extension registers.

CONTROL SIGNAL FORMATS

The following describes one embodiment of control signal formats used by processor 109 to manipulate packed data. In this embodiment, control signals are represented as three or more bytes. Decoder 165 may receive a control signal 207 from bus 101. In another embodiment, decoder 165 can also receive such control signals from cache buffers 160.

FIG. 6*a* illustrates one embodiment of a control signal format that corresponds with the general format described in the *Pentium™ Processor Family User's Manual*, (available from Intel Corporation, Literature Sales, P.O. Box 7641, Mt. prospect, Ill., 60056-7641) for an instruction or control signal. Operation field OP 601, bit twenty-three through bit eight, provides information about the operation to be performed by processor 109; for example, packed addition, packed subtraction, conversion from floating point to integer, etc. SRC1 602, bit five through three, provides the source register address of a register in register file 150. This source register contains the first data, Source1, to be used in the execution of the control signal. Similarly, SRC2 603, bit two through bit zero, contains the address of a register in register file 150. This second source register contains the data, Source2, to be used during execution of the operation.

In one embodiment, where there is a SRC1 602 address, then bits three through five also correspond to DEST 605. In an alternate embodiment, where there is a SRC2 603 address, then bits zero through two also correspond to DEST 605. DEST 605 contains the address of a register in register file 150. This destination register will store the result data, Result, of the packed data operation.

This general format allows register to register, memory to register, register by memory, register by register, register by immediate, and register to memory addressing. Also, in one embodiment, this general format can support integer register to extension register, and extension register to integer register addressing. This is described in more detail in the *Pentium™0 Processor Family User's Manual*, in appendix F, pages F-1 through F-3.

In one embodiment, control signals may have any one of a plurality of lengths. Decoder 165 may receive one or more format type of a control signal 207 from bus 101. In another embodiment, decoder 165 can also receive format types of a control signal 207 from cache buffers 160 that are similar to or different from the format types of a control signal 207 received from bus 101. In another embodiment, receipt of a first format type of control signal 207 from bus 101, may cause processor 109 to execute one or more of a second set of format types of a control signal to perform the operation of the control signal 207 received from bus 101.

Figure 6C:
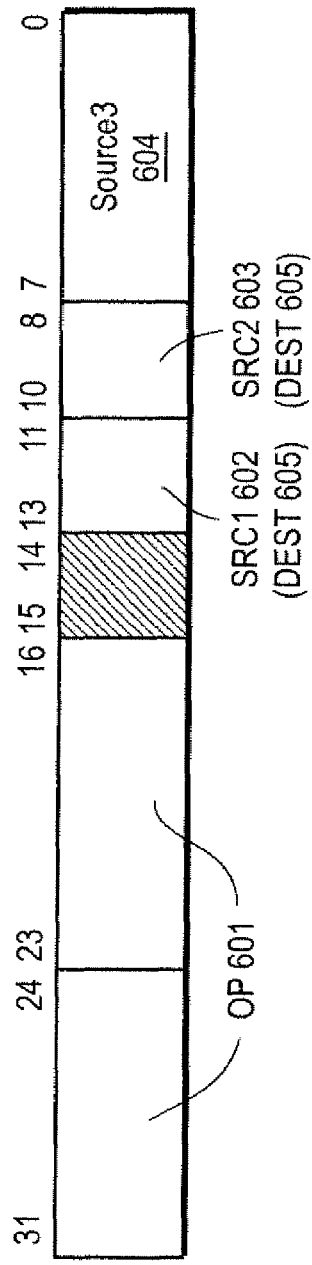
Figure 6D:
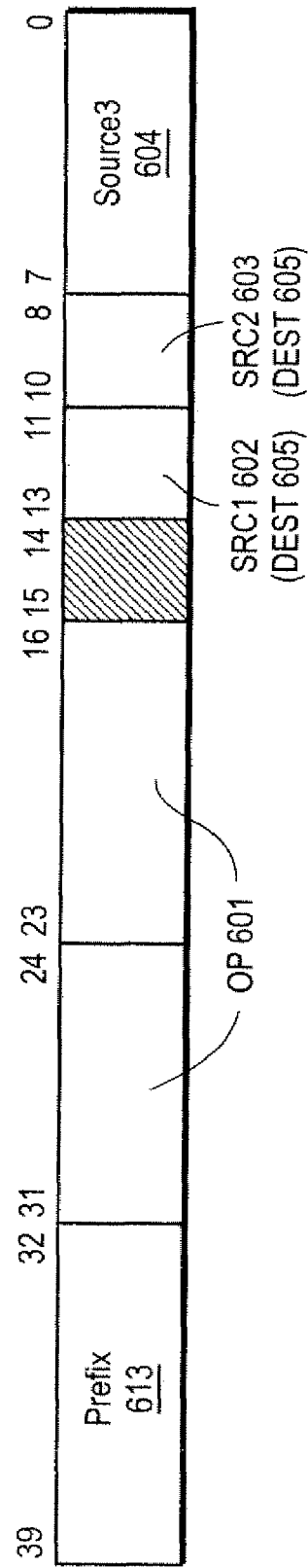

FIG. 6b, FIG. 6c and FIG. 6d illustrate some alternative embodiments of a control signal format that may be used, for example, in computer system 100 to initiate an operation on packed data.

FIG. 6b illustrates an alternative embodiment of a control signal format that corresponds with the general integer opcode format described in the *IA-32 Intel® Architecture Software Developer's Manual*, Volume 2, Order Number 245471; available from Intel Corporation or online at http://developer.intel.com. This embodiment comprises four or more bytes. In addition to the control signal format of FIG. 6a, the control signal format of FIG. 6b includes a prefix 613. For some control signals, prefix 613 may be used by decoder 165 to identify a SRC1 602 address or a SRC2 603 address in scalar registers 414. For some control signals, prefix 613 may be used by decoder 165 to identify a SRC1 602 address or a SRC2 603 address in extension registers 410. For some control signals, prefix 613 may be used by decoder 165 to identify a SRC1 602 address or a SRC2 603 address in extension registers 412. In one embodiment, where there is a SRC1 602 address, then bits three through five also correspond to DEST 605. In another embodiment, where there is a SRC2 603 address, then bits zero through two also correspond to DEST 605. In one embodiment, decoder 165 may enable functional unit 203 to perform a one hundred and twenty-eight bit packed data operation in response to decoding prefix 613. In another embodiment, decoder 165 may enable execution unit 130 to perform an operation on less than all of the elements of a one hundred and twenty-eight bit packed data in response to decoding prefix 613.

FIG. 6c illustrates another alternative embodiment of a control signal format that corresponds with the general integer opcode format described in the *IA-32 Intel® Architecture Software Developer's Manual*, Volume 2, from Intel Corporation. This embodiment comprises four or more bytes. For some control signals, bits eleven through thirteen are SRC1 602. In one embodiment, where there is a SRC1 602 address, then bits eleven through thirteen also correspond to DEST 605. In addition to the control signal format of FIG. 6a, the control signal format of FIG. 6c includes an immediate Source3 604 field. In one embodiment, bits eight through fifteen are referred to as a ModR/M byte, bits zero through two of the ModR/M byte corresponding to SRC2 603, and bits three through five of the ModR/M byte (bits eleven through thirteen of FIG. 6c) corresponding to SRC1 602. In one embodiment, the immediate Source3 604 is identified with bits zero through seven.

FIG. 6d illustrates another alternative embodiment of a control signal format that corresponds with the general integer opcode format described in the *IA-32 Intel® Architecture Software Developer's Manual*, Volume 2, from Intel Corporation. This embodiment comprises five or more bytes. For some control signals, bits eleven through thirteen are SRC1 602. In one embodiment, where there is a SRC1 602 address, then bits eleven through thirteen also correspond to DEST 605. Like the control signal format of FIG. 6c, the control signal format of FIG. 6d bits eight through fifteen may be referred to as a ModR/M byte, with bits zero through two of the ModR/M byte corresponding to SRC2 603, and bits three through five of the ModR/M byte corresponding to SRC1 602.

In addition to the control signal format of FIG. 6c, the control signal format of FIG. 6d includes a prefix 613. For some control signals, prefix 613 may be used by decoder 165 to identify a SRC1 602 address or a SRC2 603 address in scalar registers 414. For some control signals, prefix 613 may be used by decoder 165 to identify a SRC1 602 address or a SRC2 603 address in extension registers 410. For some control signals, prefix 613 may be used by decoder 165 to identify a SRC1 602 address or a SRC2 603 address in extension registers 412. In one embodiment, decoder 165 may enable execution unit 130 to perform a one hundred and twenty-eight bit packed data operation at least partially in response to decoding prefix 613. In one embodiment, an immediate Source3 604 is identified with bits zero through seven.

For example, a list of possible control signal encodings for data format conversion operations using one embodiment of the control signals formats of FIG. 6a and FIG. 6b is shown in Table 1.

TABLE 1

| Instruction | Prefix 613 | OPCODE | Format | DEST | SRC2 |
|---|---|---|---|---|---|
| 1 CVTPI2PS | N/A | 0F 2A | FIG. 6a | 412 | 410/M |
| 2 CVTPS2PI | N/A | 0F 2D | FIG. 6a | 410 | 412/M |
| 3 CVTTPS2PI | N/A | 0F 2C | FIG. 6a | 410 | 412/M |
| 4 CVTSI2SS | F3 | 0F 2A | FIG. 6b | 412 | 414/M |
| 5 CVTSS2SI | F3 | 0F 2D | FIG. 6b | 414 | 412/M |
| 6 CVTTSS2SI | F3 | 0F 2C | FIG. 6b | 414 | 412/M |
| 7 CVTSI2SD | F2 | 0F 2A | FIG. 6b | 412 | 414/M |
| 8 CVTSD2SI | F2 | 0F 2D | FIG. 6b | 414 | 412/M |
| 9 CVTTSD2SI | F2 | 0F 2C | FIG. 6b | 414 | 412/M |
| 10 CVTPI2PD | 66 | 0F 2A | FIG. 6b | 412 | 410/M |
| 11 CVTPD2PI | 66 | 0F 2D | FIG. 6b | 410 | 412/M |
| 12 CVTTPD2PI | 66 | 0F 2C | FIG. 6b | 410 | 412/M |
| 13 CVTDQ2PS | N/A | 0F 5B | FIG. 6a | 412 | 412/M |
| 14 CVTPS2DQ | 66 | 0F 5B | FIG. 6b | 412 | 412/M |
| 15 CVTTPS2DQ | F3 | 0F 5B | FIG. 6b | 412 | 412/M |
| 16 CVTDQ2PD | F3 | 0F E6 | FIG. 6b | 412 | 412/M |
| 17 CVTPD2DQ | N/A | 0F E6 | FIG. 6a | 412 | 412/M |
| 18 CVTTPD2DQ | 66 | 0F E6 | FIG. 6b | 412 | 412/M |

The entry on line 1 of Table 1 indicates that the Convert Packed Integers to Packed Single Precision (CVTPI2PS) instruction, with no prefix 613 and an operation code (OPCODE) having the hexadecimal value of 0F 2A (0000 1111 0010 $1010_2$) in bits twenty-three through eight of the format shown in FIG. 6a will identify a DEST address in registers 412 and a SRC2 address in registers 410 or in Memory. Referring to the entry on line 4 of Table 1, by using the format shown in FIG. 6b and employing a prefix 613 having a hexadecimal value of F3 (1111 0011$_2$), decoder 165 will identify a DEST address in registers 412 and a SRC2 address in scalar registers 414 or in Memory. Referring to the entry on line 7 of Table 1, by using the format shown in FIG. 6b and employing a prefix 613 having a hexadecimal value of F2 (1111 0010$_2$), decoder 165 will enable execution unit 130 to perform the Convert Scalar Integer to Scalar Double Precision (CVTSI2SD) instruction on data stored at SRC2 in scalar registers 414, storing the Result as a packed data element in DEST of registers 412. Referring to the entry on line 10 of Table 1, by using the format shown in FIG. 6b and employing a prefix 613 having a hexadecimal value of 66 (0110 0110$_2$), decoder 165 will enable execution unit 130 to perform the Convert Packed Integers to Packed Double Precision (CVTPI2PD) instruction on two packed integer data stored at SRC2 in registers 410, storing the Result as a packed data elements in DEST of registers 412.

Referring now to line 13 of Table 1, the entry indicates that the Convert the Double Quadword of packed integers to Packed Single Precision (CVTDQ2PS) instruction, with no prefix 613 and an operation code (OPCODE) having the hexadecimal value of 0F 2B (0000 1111 0010 1011$_2$) in bits twenty-three through eight of the format shown in FIG. 6a will identify both a DEST address and a SRC2 address in registers 412. On the other hand, referring to the entry on line 14 of Table 1, by using the format of FIG. 6b and employing the prefix 613 of 66 (0110 0110$_2$), and the same OPCODE of 0F 2B (0000 1111 0010 1011$_2$), decoder 165 will again identify a DEST address and a SRC2 address in extension registers 412, but will enable execution unit 130 to perform a Convert Packed Single Precision to a Double Quadword of packed integers (CVTPS2DQ) instruction. Referring to the entry on line 15 of Table 1, by using the same format but employing a prefix 613 having a hexadecimal value of F3 (1111 0011$_2$), decoder 165 will enable execution unit 130 to perform the operation of line 14 using Truncation (CVTTPS2DQ).

A list of possible control signal encodings for a set of shuffle operations using one embodiment of the control signals formats of FIG. 6c, and FIG. 6d is shown in Table 2.

INSTRUCTION SET

Figure 7A:
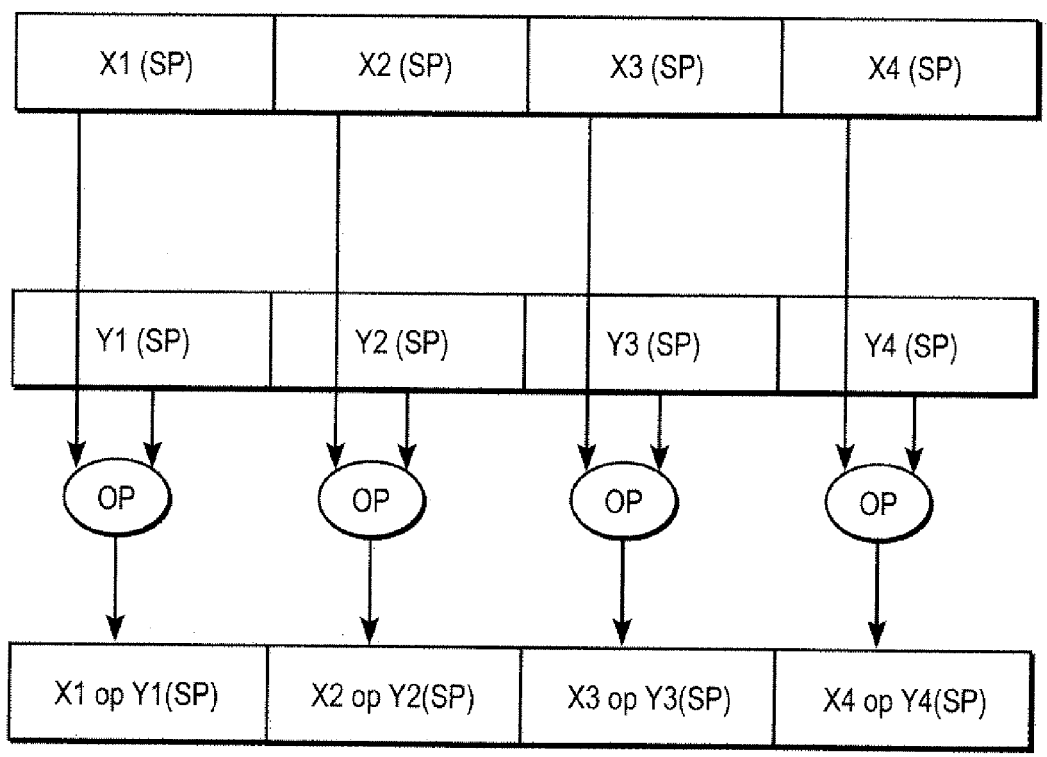
FIG. 7a shows a packed instruction operating on a pair of operands.
Figure 7B:
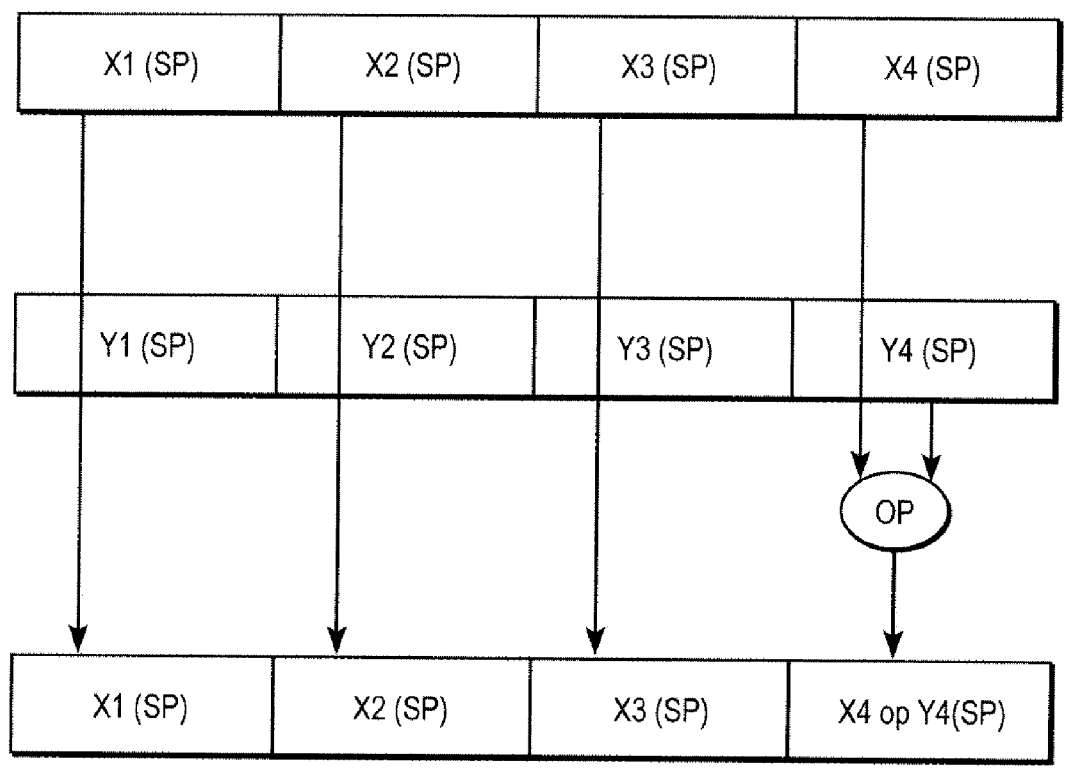
FIG. 7b shows a scalar instruction operating on a least significant pair of the two operands.

The instruction set of one embodiment used to operate on data operands of the 128-bit multimedia extension registers operates on either all or the least significant pairs of packed data operands, in parallel. FIG. 7a shows the packed instructions operating on a pair of operands. FIG. 7b shows the scalar instructions operating on the least significant pair of the two operands; for scalar operations, the three upper components from the first operand are passed through to the destination. Alternatively, the three upper components may be zeroed. In general, the address of a memory operand is aligned on a 16-byte boundary for all instruction, except for unaligned loads and stores.

Figure 8:
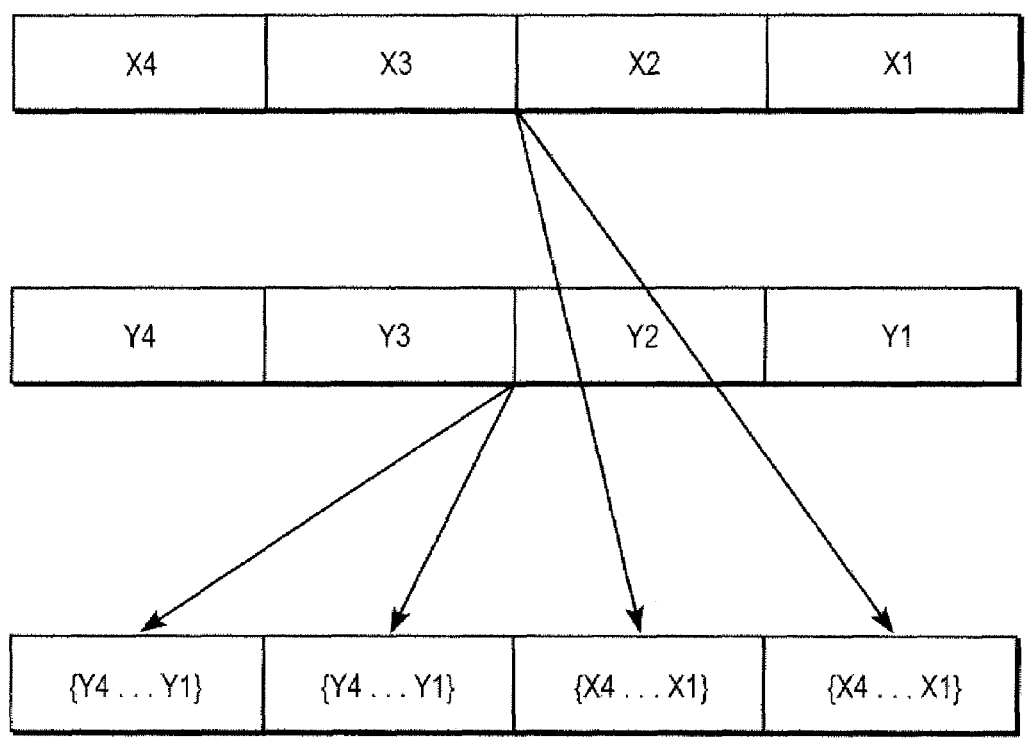
FIG. 8 shows a packed shuffle operation according to a SHUFPS instruction of one embodiment.

The instructions of one embodiment comprise a Shuffle Packed Single Precision Floating Point (SHUFPS) instruction. The instructions of an alternative embodiment further comprises a Shuffle Packed Double Precision Floating Point (SHUFPD) instruction. The SHUFPS instruction is capable of shuffling any of the packed four single precision floating point numbers from one source operand to the lower two destination fields; the upper two destination fields are generated from a shuffle of any of the four single precision floating point numbers from the second source operand. FIG. 8 shows the packed shuffle operation (the SHUFPS instruction) of one embodiment. By using the same register for both sources, the SHUFPS instruction can return any combination of the four single precision floating point numbers from this register. The SHUFPD instruction is capable of shuffling either of the two packed double precision floating point numbers from one source operand to the lower destination field; the upper destination field is generated from a shuffle of either of the two packed double precision numbers from the second source operand.

In one embodiment, scalar integer or memory data may be converted in parallel using the instructions provided herein to a packed floating point format. The packed floating point data is manipulated to provide the graphic data used in 3D image rendering. Following manipulation, the packed floating point graphics data are converted in parallel using the instructions described herein to a packed integer format. The packed integer data are used to render an image display. As such, an application may use 128-bit multimedia extension register instructions in combination with 64-bit multimedia register instructions or 128-bit multimedia extension register

TABLE 2

| Instruction | Prefix 613 | OPCODE | Format | DEST | SRC2 | Source3 |
| --- | --- | --- | --- | --- | --- | --- |
| 1 SHUFPS | N/A | 0F C6 | FIG. 6c | 412 | 412/M | I-select[7:0] |
| 2 SHUFPD | 66 | 0F C6 | FIG. 6d | 412 | 412/M | I-select[1:0] |

Additional details of these operations are further discussed below.

One embodiment of the control signal formats herein disclosed provide for a decoder 165 having reduced additional circuitry, area and cost. One embodiment of the control signal formats herein disclosed further provides for a decoder 165 for efficient decoding of control signals for previously used operations and extended control signals.

The foregoing disclosures are illustrated by way of example and not limitation with unnecessary detail omitted so as not to obscure the invention. It will be appreciated that the apparatuses and methods described above can be modified in arrangement and detail by those skilled in the art.

instructions in combination with scalar register or memory instructions. Thus, the instructions of one embodiment comprise conversion instructions that support packed and scalar conversions between the 128-bit multimedia extension registers and either the 64-bit multimedia extension integer registers or the 32-bit integer IA™ registers.

Figure 9A:
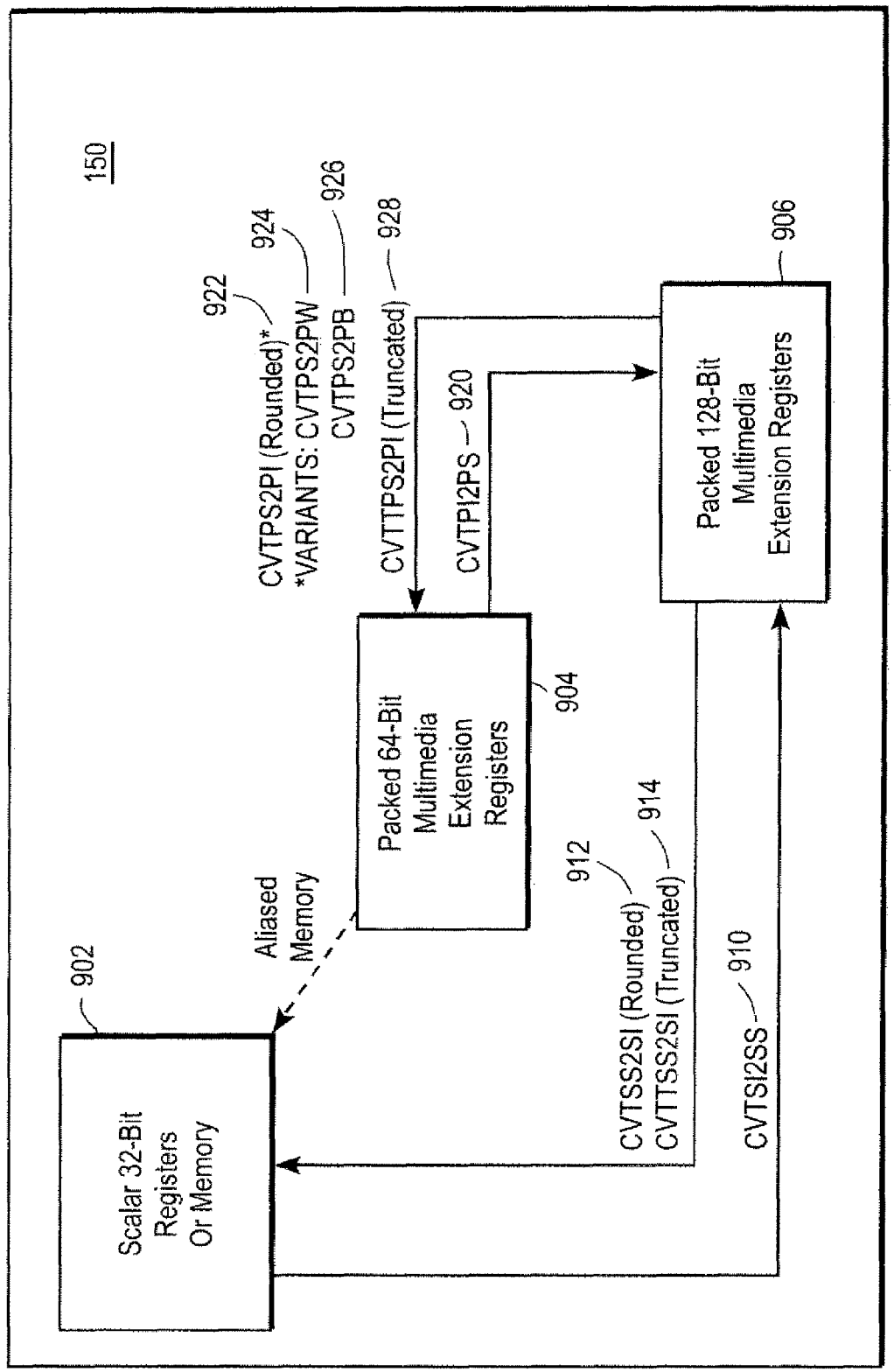
FIG. 9a shows a register file and corresponding conversion instructions of one embodiment.

FIG. 9a shows architectural registers supported by the register file 150 and the corresponding conversion instructions 910–928 of one embodiment. The register file supports a set of scalar 32-bit IA™ registers, a set of packed 64-bit multimedia extension registers 904, and a set of packed 128-bit multimedia extension registers 906, but the invention is not so limited. In one embodiment, as previously discussed herein, the packed 64-bit multimedia extension registers registers 904 may be aliased onto the memory space of the scalar registers or the system memory 902, but the invention is not so limited.

The conversion instructions 910–928 corresponding to the registers 902–906 of the register file 150 provide an efficient means of converting between SIMD floating point data and SIMD integer data during data conversion between the registers. The conversion instructions comprise, but are not limited to, a Convert Scalar Integer to Scalar Single Precision Floating Point instruction (CVTSI2SS instruction) 910, a Convert Scalar Single Precision Floating Point to a 32-bit Integer instruction (CVTSS2SI instruction) 912, a Convert Truncate Scalar Single Precision Floating Point to Scalar 32-bit Integer instruction (CVTTSS2SI instruction) 914, a Convert Packed 32-bit Integer to Packed Single Precision Floating Point Instruction (CVTPI2PS instruction) 920, a Convert Packed Single Precision Floating Point to Packed 32-bit Integer instruction (CVTPS2PI instruction) 922, two variants of the CVTPS2PI instruction 922 comprising a CVTPS2PW instruction 924 and a CVTPS2PB instruction 926, and a Convert Truncate Packed Single Precision Floating Point to Packed 32-bit Integer instruction (CVTTPS2PI instruction) 928.

The Convert Scalar Integer to Scalar Single Precision Floating Point instruction (CVTSI2SS instruction) 910 of one embodiment converts a signed 32-bit integer from a 32-bit scalar integer in register 902 to a single precision floating point number. The single precision floating point number is placed in a register of a set of 128-bit multimedia extension registers 906. Alternatively, the CVTSI2SS instruction 910 converts a signed 32-bit integer from memory to a single precision floating point number, wherein the single precision floating point number is stored in a register of a set of 128-bit multimedia extension registers 906. When these conversions are inexact, rounding is performed according to the contents of a control and status register.

Figure 9B:
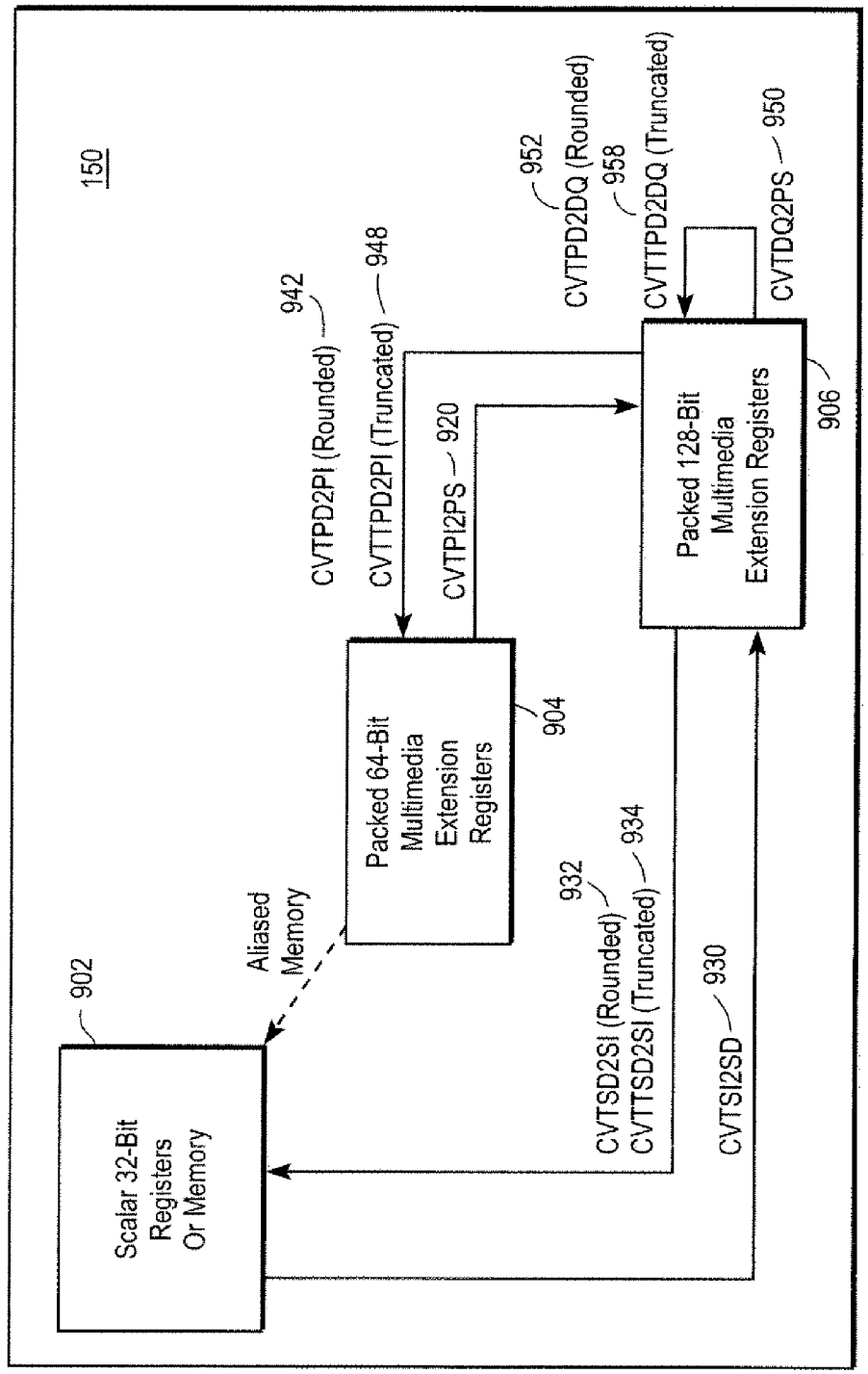
FIG. 9b shows a register file and corresponding conversion instructions of an alternative embodiment.

FIG. 9*b* shows a register file 150 and corresponding conversion instructions of an alternative embodiment. The conversion instructions 930–958 corresponding to the registers 902–906 of the register file 150 provide an efficient means of converting between SIMD floating point data and SIMD integer data during data conversion among the registers. The conversion instructions comprise, but are not limited to, a Convert Scalar Integer to Scalar Double Precision Floating Point instruction (CVTSI2SD instruction) 930, a Convert Scalar Double Precision Floating Point to a 32-bit Integer instruction (CVTSD2SI instruction) 932, a Convert Truncate Scalar Double Precision Floating Point to Scalar 32-bit Integer instruction (CVTTSD2SI instruction) 934, a Convert Packed 32-bit Integer to Packed Double Precision Floating Point Instruction (CVTPI2PD instruction) 940, a Convert Packed Double Precision Floating Point to Packed 32-bit Integer instruction (CVTPD2PI instruction) 942, a Convert Truncate Packed Double Precision Floating Point to Packed 32-bit Integer instruction (CVTTPD2PI instruction) 948, a Convert Packed Double Quadword of 32-bit Integers to Packed Single Precision Floating Point Instruction (CVTDQ2PS instruction) 950, a Convert Packed Single Precision Floating Point to Packed Double Quadword of 32-bit Integers instruction (CVTPS2DQ instruction) 952, and a Convert Truncate Packed Single Precision Floating Point to Packed Double Quadword of 32-bit Integers instruction (CVTTPS2DQ instruction) 958.

The Convert Scalar Integer to Scalar Double Precision Floating Point instruction (CVTSI2SD instruction) 930 of one embodiment converts a signed 32-bit integer from a 32-bit scalar integer in registers 902 to a double precision floating point number. The double precision floating point number is stored as an packed element in a register of packed 128-bit multimedia extension registers 906. Alternatively, the CVTSI2SD instruction 930 converts a signed 32-bit integer from memory to a double precision floating point number, wherein the double precision floating point number is stored in a register of the packed 128-bit multimedia extension registers 906. When these conversions are inexact, rounding is performed according to the contents of a control and status register.

For one embodiment of register file 150, only single precision floating point SIMD instructions are included in packed instruction set 140 and may be executed by execution unit 130. For an alternative embodiment, extended instructions permitting both single precision floating point SIMD operations and double precision floating point SIMD operations are included in packed instruction set 140 and are executed by execution unit 130.

Figure 9C:
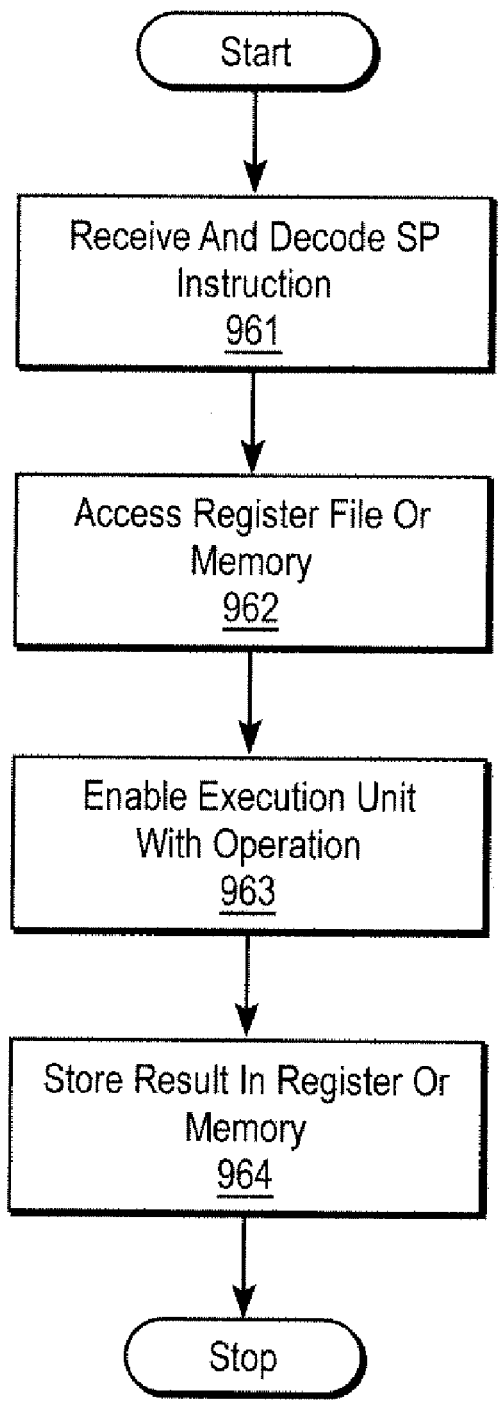
FIG. 9c is a flow diagram illustrating one embodiment of a process to manipulate data in a register file.

FIG. 9*c* is a flow diagram illustrating one embodiment of a process to manipulate data in a register file 150 permitting single precision floating point instructions. In processing block 961, the decoder 165 receives a control signal 207 corresponding to a single precision SIMD operation from either the cache buffers 160 or bus 101. Decoder 165 decodes the control signal 207 to determine the operations to be performed.

Decoder 165 accesses the register file 150, or a location in another memory, in processing block 962. Registers in the register file 150, or memory locations in another memory, are accessed depending on the register address specified in the control signal 207. For example, for an operation on packed single precision data, the control signal can include SRC1, SRC2 and DEST register addresses. SRC1 is the address of the first source register. SRC2 is the address of the second source register. In some cases, the SRC1 or SRC2 address is optional as not all operations require two source addresses. DEST is the address of the destination register where the result data is stored. In one embodiment, SRC1 or SRC2 is also used as DEST. The data stored in the corresponding registers is referred to as Source1, Source2, and Result respectively.

In another embodiment of the present invention, any one, or all, of SRC1, SRC2 and DEST, can define a memory location in the addressable memory space of processor 109. For example, SRC1 may identify a memory location in main memory 104 while SRC2 identifies a first register in integer registers 902, and DEST identifies a second register in registers 906. For simplicity of the description herein, references are made to the accesses to the register file 150, however, these accesses could be made to another memory instead.

In another embodiment of the present invention, the operation code only includes two addresses, SRC1 and SRC2. In this embodiment, the result of the operation is stored in the SRC1 or SRC2 register. That is SRC1 (or SRC2) is used as the DEST. This type of addressing is compatible with previous CISC instructions having only two addresses. This reduces the complexity in the decoder 165. Note, in this embodiment, if the data contained in the SRC1 register is not to be destroyed, then that data is copied into another register before the execution of the operation. The copying would require an additional instruction. To simplify the description herein, the three address addressing scheme will be described (i.e. SRC1, SRC2, and DEST). However, it should be remembered that the control signal, in one embodiment, may only include SRC1 and SRC2, and that SRC1 (or SRC2) identifies the destination register.

Where the control signal requires an operation, in processing block 963, functional unit 130 will be enabled to perform this operation on accessed data from register file 150. Once the operation has been performed in functional unit 130, in processing block 634, the result is stored back into register file 150 or another memory according to requirements of the control signal, for example conversion operations 910–928.

Figure 9D:
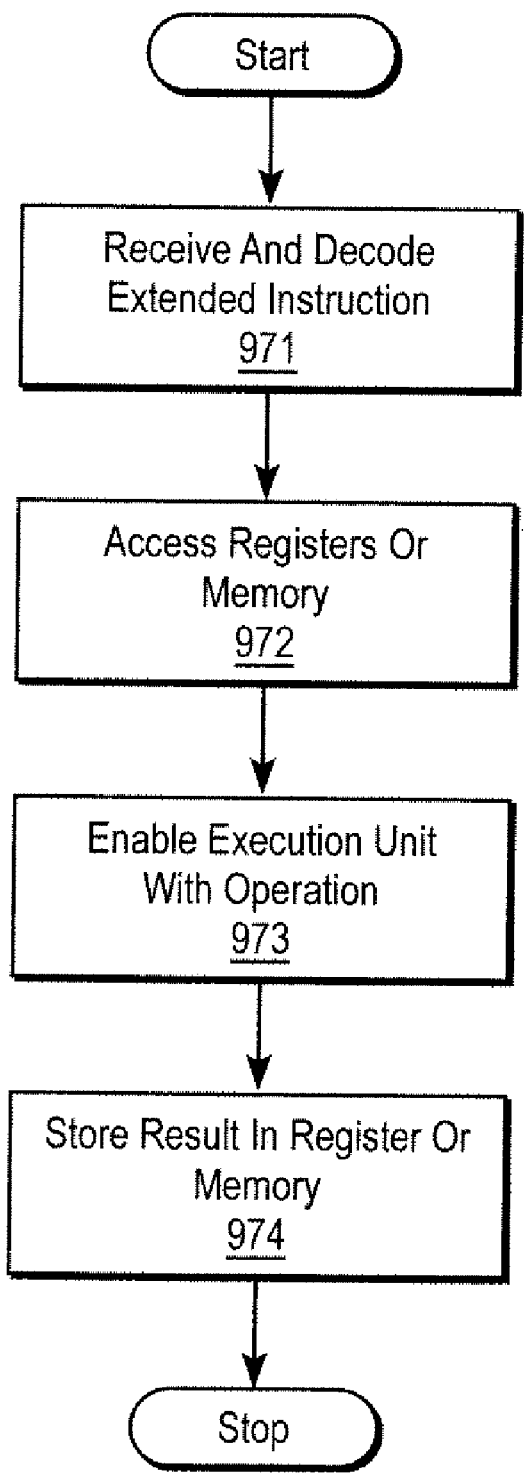
FIG. 9d is a flow diagram illustrating an alternative embodiment of a process to manipulate data in a register file.

In one embodiment of processor 109, packed instruction set 140 and control signal 207 may comprise extended instructions for performing operations on double precision packed data in 128-bit multimedia extension registers 906. FIG. 9d is a flow diagram illustrating an alternative embodiment of a process to manipulate data in a register file 150. In processing block 971, the decoder 165 receives an extended control signal 207 from either the cache buffers 160 or bus 101. Decoder 165 decodes the extended control signal to determine the operations to be performed and registers to be addressed. Decoder 165 accesses the register file 150, or a location in another memory, at processing block 972. Registers in the register file 150, or memory locations in another memory, are accessed depending on the register address specified in the extended control signal 207. In one embodiment of processor 109, the operation code may only permit two addresses, SRC1 and SRC2. In this embodiment, the result of the operation is stored in the SRC1 (or SRC2) register, which is used as the DEST register.

Where the extended control signal requires an operation, in processing block 973, execution unit 130 will be enabled to perform this operation on accessed data from register file 150. Once the operation has been performed in execution unit 130, in processing block 974, the result is stored back into register file 150 or another memory according to requirements of the extended control signal 207.

It will be appreciated that one embodiment of processor 109 may accept a control signal 207 that comprises control signals to initiate the execution of operations on packed data stored in register file 150 but may not need to accept a control signal 207 that also comprises extended control signals to initiate the execution of operations on double precision data stored in packed 128-bit multimedia extension registers 906. For this embodiment of processor 109, an application may need to request, for example, whether processor 109 will accept extended control signals and to install the appropriate control signals in accordance with which type of control signal 207 processor 109 will accept.

SOFTWARE ENABLEMENT IN A SYSTEM

In order for an application to more fully utilize the packed 128-bit multimedia extension registers 906 and to initiate the execution of operations on packed double precision data stored in extension registers $XMM_0$ through $XMM_7$, it may be necessary for the processor 109 to coordinate with the application or with the operating system of computer system 100 to provide a permission signal to the application or to the operating system enabling the application or operating system to submit extended control signals, the extended control signals initiating operations on packed double precision data stored in extension registers $XMM_0$ through $XMM_7$. The application or operating system, having received the permission signal from processor 109, may manipulate data in a register file in accordance with the process of FIG. 9d. Alternatively, the application or operating system may manipulate data in a register file in accordance with FIG. 9c.

Figure 9E:
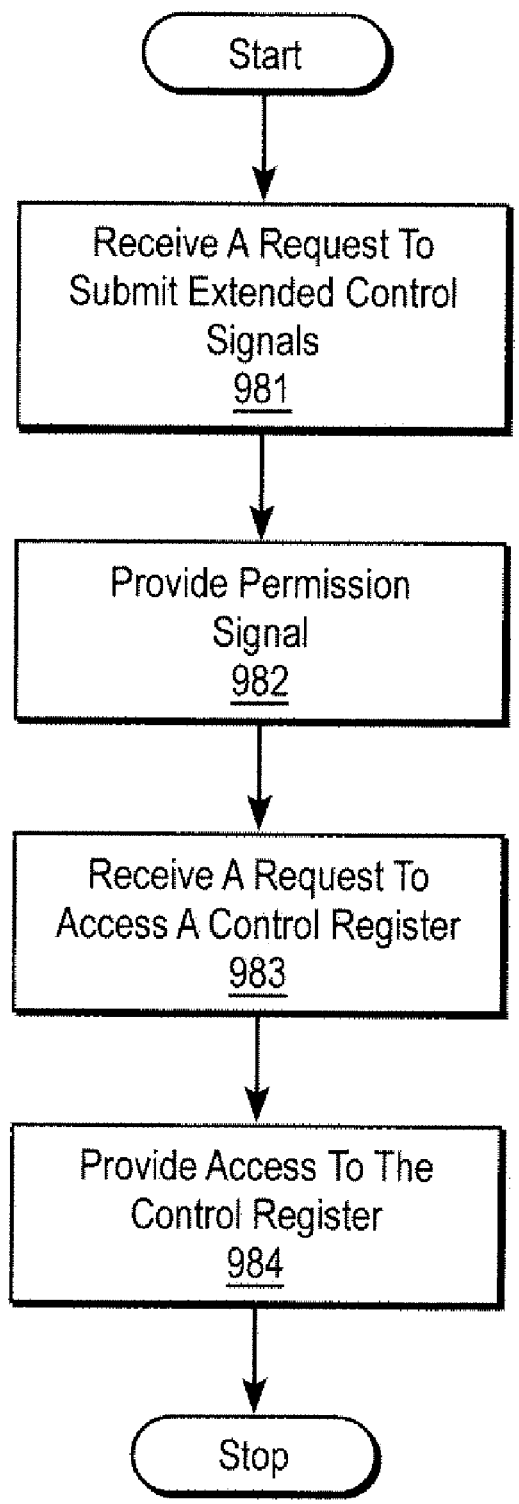
FIG. 9e is a flow diagram illustrating one embodiment of a process to enable software to manipulate data in a register file.

FIG. 9e is a flow diagram illustrating one embodiment of a process to enable software to manipulate data in a register file. In processing block 981 a request to submit extended control signals is received by processor 109 from an application or an operating system of computer system 100. In processing block 982, processor 109 provides a permission signal to the application or an operating system of computer system 100 indicating that the application or operating system may manipulate data in a register file in accordance with the process of FIG. 9d.

It will be appreciated that the permission signal may be provided through any one of a number of methods. For example, in one embodiment of processor 109 that supports a set of operations supported by the Pentium™ processor, bit twenty-six in the EDX register of scalar registers 414 is set to a value of 1 in response to a CPUID request from the application or from the operating system. The setting of this particular bit may be understood as providing the requested permission signal in accordance with procedures defined by Intel Corporation of Santa Clara, Calif. (see Chapter 3 of the *IA-32 Intel® Architecture Software Developer's Manual*, Volume 2, Order Number 245471; and *AP-485, Intel Processor Identification and the CPUID Instruction*, Order Number 241618; both available from Intel of Santa Clara, Calif. or online at http://developer.intel.com).

Having received the permission signal from processor 109, the application or operating system of computer system 100 may have further need of coordinating communication. For example, the operating system of computer system 100 may or may not be enabled to save and restore the state of extension registers 412 in the event of a context switch in a multitasking environment, or during calls and returns from interrupt or exception handlers. The desired communication may be facilitated by processor 109 to enable an operating system of computer system 100 to communicate, to the application software, a state of readiness or non-readiness for supporting manipulation of data in accordance with the process of FIG. 9d.

In processing block 983, processor 109 receives a request to access a control register. For example, in one embodiment of processor 109 that supports a set of operations supported by the Pentium™ processor, access to CR4 control register is requested. In processing block 984, processor 109 provides access the requested control register (see Chapter 11 of the *IA-32 Intel® Architecture Software Developer's Manual*, Volume 1, Order Number 245470; available from Intel of Santa Clara, Calif. or online at http://developer.intel.com).

It will be appreciated that communication between the operating system and the application may be facilitated by processor 109 providing read or write access to a control register through any one of a number of methods. For example, in one embodiment of processor 109 that supports a set of operations supported by the Pentium™ processor, bit nine in the CR4 control register is set to a value of 1 in response to a request from the operating system of computer system 100 to indicate that the operating system supports an FXSAVE and an FXRSTOR instruction to save and to restore, respectively, the state of extension registers 412 in the event of a context switch. Alternatively, processor 109 may provide access to the CR4 control register responsive to a MOV instruction request by the application software to read the contents of CR4. Upon checking the contents of control register CR4 and finding bit nine set to a value of 1, the application may manipulate data in a register file in accordance with the process of FIG. 9d. Alternatively, upon finding bit nine of CR4 set to zero, the application may manipulate data in a register file in accordance with FIG. 9c.

CONVERSION OPERATION

Figure 10:
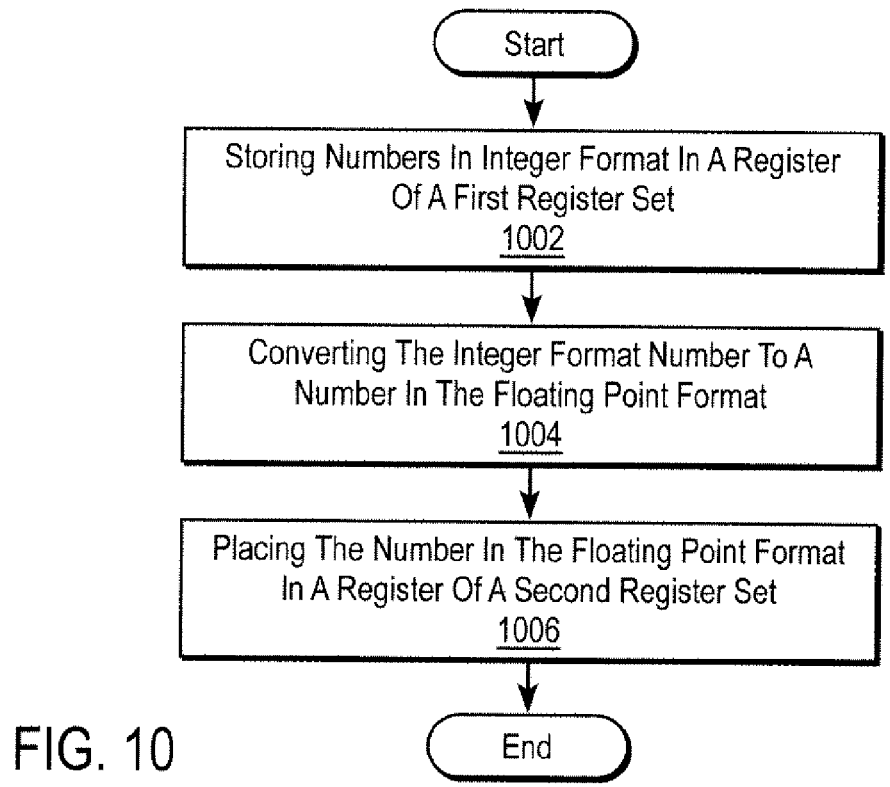
FIG. 10 is a flowchart for converting a number from a scalar format to a packed floating point format according to a CVTSI2SS instruction of one embodiment.

FIG. 10 is a flowchart for converting a number from a scalar format to a packed floating point format (the CVTSI2SS and CVTSI2SD instructions) of one embodiment. Operation begins at step 1002, at which a number is stored in the integer format in a register of a first set of architectural registers in a scalar format. The integer format of one embodiment is a 32-bit integer format, but the invention is not so limited. The first set of architectural registers may comprise eight 32-bit registers, but the invention is not so limited. The number in the integer format is converted, at step 1004, to a number in the floating point format. The floating point format of one embodiment is a 32-bit single precision floating point format, but the invention is not so limited. The floating point format of an alternative embodiment is a 64-bit double precision floating point format, but the invention is not so limited. In one embodiment, the step of converting comprises accessing rounding control bits in a control and status register, and rounding the number in the floating point format according to the rounding control bits. The number in the floating point format is placed in a register of a second set of architectural registers in a packed format, at step 1006. In one embodiment, the second set of architectural registers comprises eight 128-bit registers, but the invention is not so limited. The step of placing the number in the floating point format in a register of a second set of architectural registers may comprise placing the number in the floating point format in a lowest segment of the register and preserving upper segments of the register unchanged, but the invention is not so limited.

The Convert Scalar Single Precision Floating Point to a 32-bit Integer instruction (CVTSS2SI instruction) 912 and the Convert Scalar Double Precision Floating Point to a 32-bit Integer instruction (CVTSD2SI instruction) 932 convert the least significant single or double precision floating point number from a packed 128-bit multimedia extension register 906 to a 32-bit signed integer. The 32-bit signed integer is placed in an IA™ scalar 32-bit integer register 902. When the conversion is inexact, rounding is performed according to the contents of a control and status register.

The Convert Truncate Scalar Single Precision Floating Point to Scalar 32-bit Integer instruction (CVTTSS2SI instruction) 914 and the Convert Truncate Scalar Double Precision Floating Point to Scalar 32-bit Integer instruction (CVTTSD2SI instruction) 934 convert the least significant single or double precision floating point number from a packed 128-bit multimedia extension register 906 to a 32-bit signed integer. The 32-bit signed integer is placed in an IA™ scalar 32-bit integer register 902. When the conversion is inexact, the result is truncated implicitly without the step of accessing a rounding mode from a control and status register.

Figure 11:
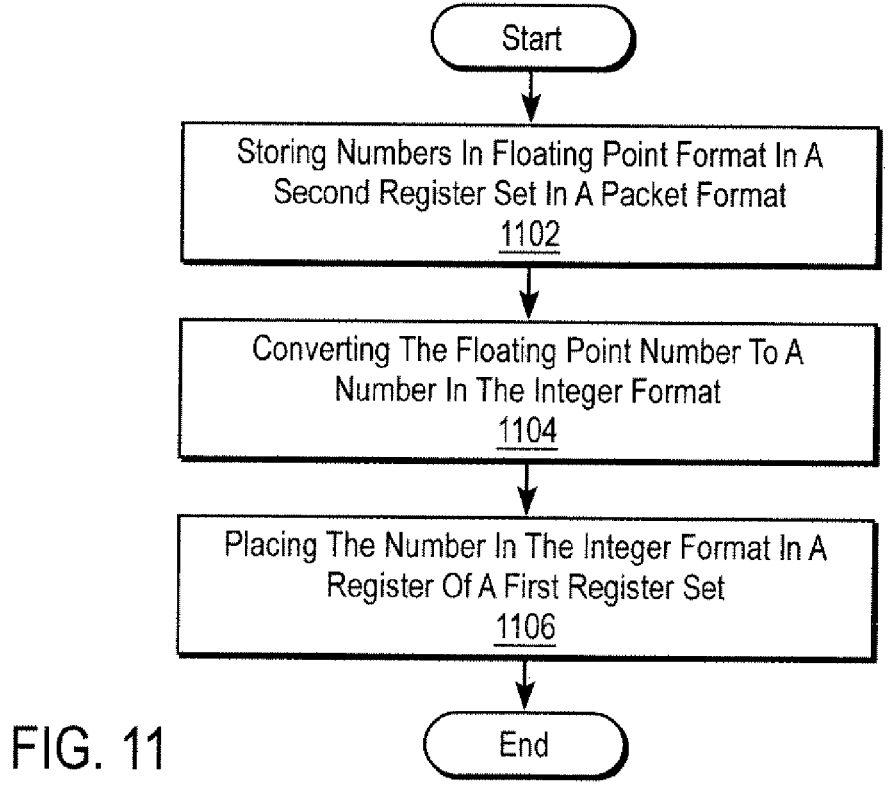
FIG. 11 is a flowchart for converting a number from a packed floating point format to a scalar format according to CVTSS2SI and CVTTSS2SI instructions of one embodiment.

FIG. 11 is a flowchart for converting a number from a packed floating point format to a scalar format (the CVTSS2SI, CVTSD2SI, CVTTSS2SI and CVTTSD2SI instructions) of one embodiment. Operation begins at step 1102, at which a plurality of numbers are stored in the floating point format in a register of the second set of architectural registers in a packed format. In one embodiment, four numbers are stored in the floating point format, but the invention is not so limited. In an alternative embodiment, two numbers are stored in the floating point format, but the invention is not so limited. The floating point formats of one embodiment are a 32-bit single precision floating point format and a 64-bit double precision floating point format, but the invention is not so limited. In one embodiment, the second set of architectural registers comprises eight 128-bit registers, but the invention is not so limited. One of the plurality of numbers in the floating point format is converted, at step 1104, to a number in the integer format. The integer format of one embodiment is a 32-bit integer format, but the invention is not so limited. In one embodiment of the CVTSS2SI and CVTSD2SI instructions, the step of converting comprises accessing rounding mode bits from a control and status register, and rounding the number in the integer format according to the rounding mode indicated.

In one embodiment of the CVTTSS2SI and CVTTSD2SI instruction, the step of converting comprises truncating the number in the integer format implicitly according to mode bits in a conversion instruction. The truncate operation is thus implied by the conversion instruction, and the processing time required to access the control and status register to determine a rounding mode is eliminated. Typical applications perform floating point computations using the round-to-nearest rounding mode, the truncate rounding mode is generally employed when converting from floating point to integer. Changing the rounding mode typically requires changing the rounding control in a control status register. Encoding the truncate rounding mode in the instruction avoids updating the status register because the rounding mode specified by the instruction overrides the status register setting.

The number in the integer format is placed in a register of the first set of architectural registers in a scalar format, at step 1106. The first set of architectural registers may comprise eight 32-bit registers, but the invention is not so limited.

The Convert Packed 32-bit Integer to Packed Single Precision Floating Point Instruction (CVTPI2PS instruction) 920 and the Convert Packed 32-bit Integer to Packed Double Precision Floating Point Instruction (CVTPI2PD instruction) 940 convert two 32-bit signed integers from a 64-bit multimedia extension packed integer register 904 to two least significant single or double precision floating point numbers. In accordance with one embodiment of register file 150, the floating point numbers are placed in a packed 128-bit multimedia extension register 906. When the conversion is inexact, rounding is performed according to a control and status register. When the number of results is less than the capacity count of the packed destination register, the upper significant numbers in the packed destination register are zeroed.

Figure 12:
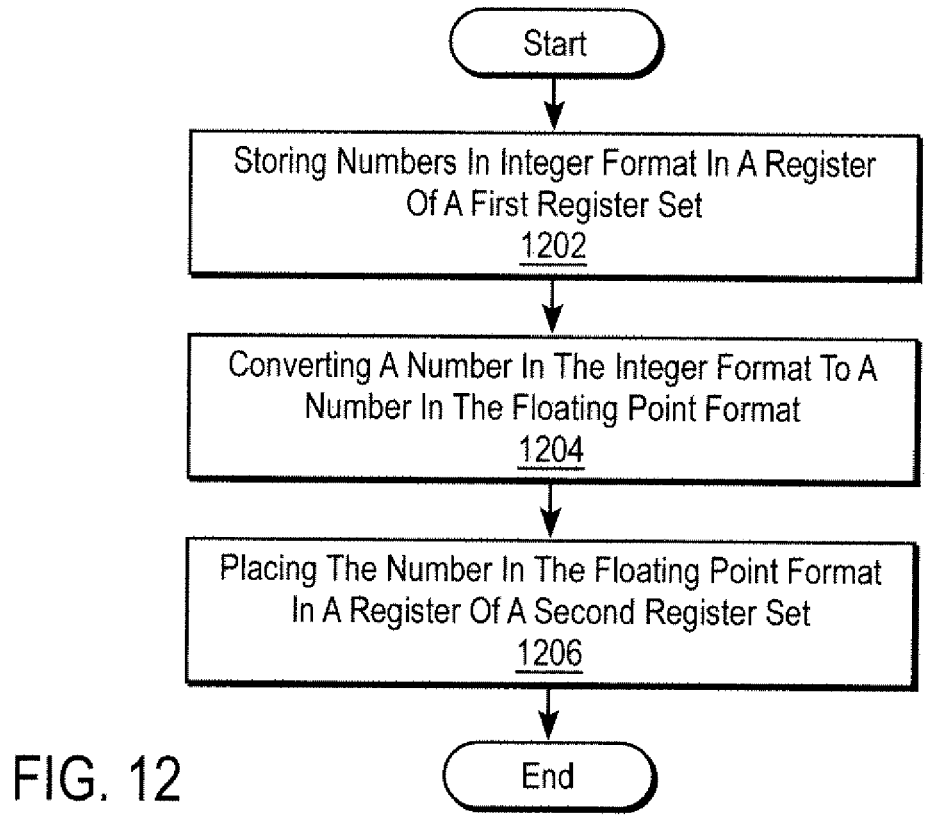
FIG. 12 is a flowchart for converting a number from a packed integer format to a packed floating point format according to a CVTPI2PS instruction of one embodiment.

FIG. 12 is a flowchart for converting a number from a packed integer format to a packed floating point format (the CVTPI2PS and CVTPI2PD instruction) of one embodiment. Operation begins at step 1202, at which a first plurality of numbers in the integer format are stored in a register of a first set of architectural registers in a packed format. In one embodiment, two numbers are stored in the integer format, but the invention is not so limited. The integer format of one embodiment is a 32-bit integer format, but the invention is not so limited. The first set of architectural registers may comprise eight 64-bit registers, but the invention is not so limited. At least one number in the integer format is converted, at step 1204, to at least one number in the floating point format. The floating point formats of one embodiment are a 32-bit single precision and a 64-bit double precision floating point format, but the invention is not so limited. In one embodiment, the step of converting comprises accessing rounding control bits in a control and status register, and rounding the number in the floating point format according to the rounding control bits. At least one number in the floating point format is placed in a register of a second set of architectural registers in a packed format, at step 1206. The at least one number in the floating point format may comprise two numbers, but the invention is not so limited. In one embodiment, the second set of architectural registers comprises eight 128-bit registers, but the invention is not so limited. The step of placing at least one number in the floating point format in a register of a second set of architectural registers may comprise placing two numbers in the floating point format in a lower half of the register and preserving an upper half of the register unchanged, but the invention is not so limited.

In one embodiment, there are several variants 922–926 of an instruction that converts packed single precision floating point values in a 128-bit multimedia extension register 906 to packed 32-bit integers stored in a 64-bit multimedia extension register 904. The first variant is the Convert Packed Single Precision Floating Point to Packed 32-bit Integer instruction (CVTPS2PI instruction) 922 that converts the two least significant single precision floating point numbers from a 128-bit multimedia extension register 906 to two 32-bit signed integers. The two 32-bit signed integers are placed in a 64-bit multimedia extension register 904. When the conversion is inexact, rounding is performed according to the contents of a control and status register.

The second variant is the CVTPS2PW instruction 924 that converts four single precision floating point numbers in a 128-bit multimedia extension register 906 to four 16-bit integers stored in a 64-bit multimedia extension register 904. The third variant is the CVTPS2PB instruction 926 that converts four single precision floating point numbers in a 128-bit multimedia extension register 906 to four 8-bit integers stored in the lower 32-bit field of a 64-bit multimedia extension register 904. Other possible variants include integer, byte, and word versions of conversion instructions that operate on data in integers, bytes and words, respectively.

The Convert Truncate Packed Single Precision Floating Point to Packed 32-bit Integer instruction (CVTTPS2PI instruction) 928 and the Convert Truncate Packed Double Precision Floating Point to Packed 32-bit Integer instruction (CVTTPD2PI instruction) 948 convert the two least significant single or double precision floating point numbers from a packed 128-bit multimedia extension register 906 to two 32-bit signed integers. The two 32-bit signed integers are placed in a 64-bit multimedia extension register 904. When the conversion is inexact, the result is truncated implicitly without the step of accessing a rounding mode from a control and status register.

Figure 13:
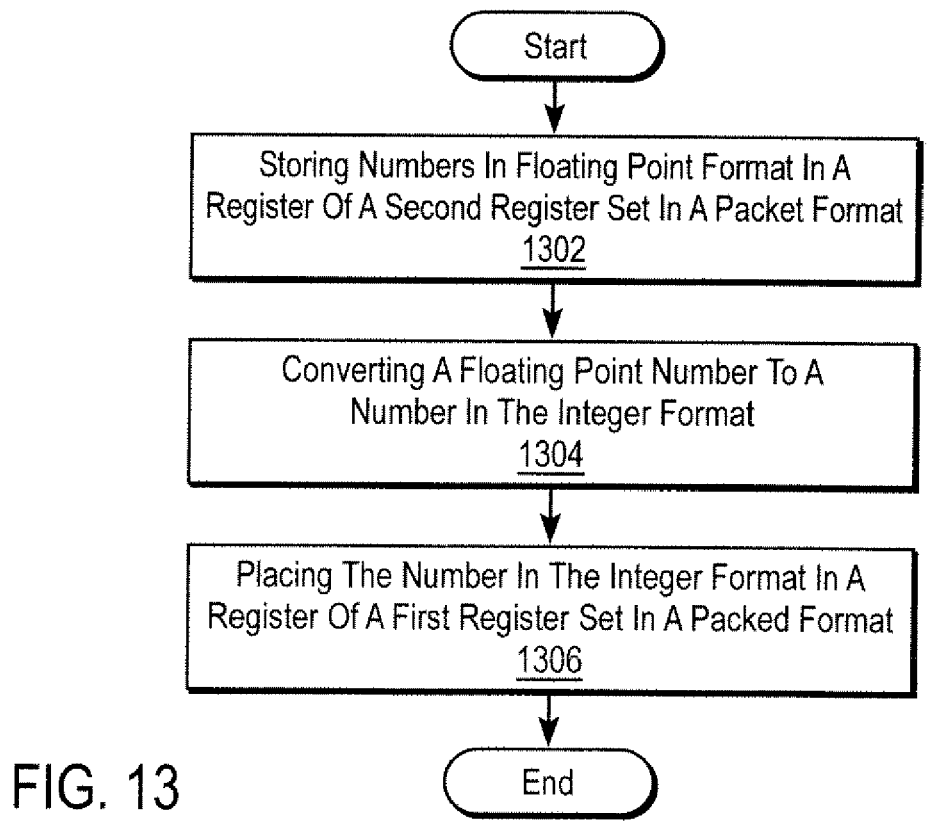
FIG. 13 is a flowchart for converting a number from a packed floating point format to a packed integer format according to CVTPS2PI and CVTTPS2PI instructions of one embodiment.

FIG. 13 is a flowchart for converting a number from a packed floating point format to a packed integer format (the CVTPS2PI, CVTPD2PI, CVTTPS2PI and CVTTPD2PI instructions) of one embodiment. Operation begins at step 1302, at which a second plurality of numbers are stored in the floating point format in a register of the second set of architectural registers in a packed format. In one embodiment, four numbers or two numbers are stored in the floating point format, but the invention is not so limited. The floating point formats of one embodiment are a 32-bit single precision and a 64-bit double precision floating point format, but the invention is not so limited. In one embodiment, the second set of architectural registers comprises eight 128-bit registers, but the invention is not so limited. At least one of the plurality of numbers in the floating point format is converted, at step 1304, to at least one number in the integer format. The integer format of one embodiment is a 32-bit integer format, but the invention is not so limited. In one embodiment of the CVTPS2PI instruction or the CVTPD2PI instruction, the step of converting comprises accessing rounding mode bits from a control and status register, and rounding the number in the integer format according to a rounding mode indicated by the rounding mode bits. In one embodiment of the CVTTPS2PI instruction or the CVTTPD2PI instruction, the step of converting comprises implicitly truncating the number in the integer format according to a truncate mode indicated by the conversion instruction. The number in the integer format is placed in a register of the first set of architectural registers in a packed format, at step 1306. The first set of architectural registers may comprise eight 64-bit registers, but the invention is not so limited.

The CVTTPS2PI instruction and the CVTTPD2PI instruction of one embodiment encodes the rounding mode in the instruction, which improves performance as described above with respect to the CVTTSS2SI instruction and the CVTTPD2PI instruction.

Figure 14:
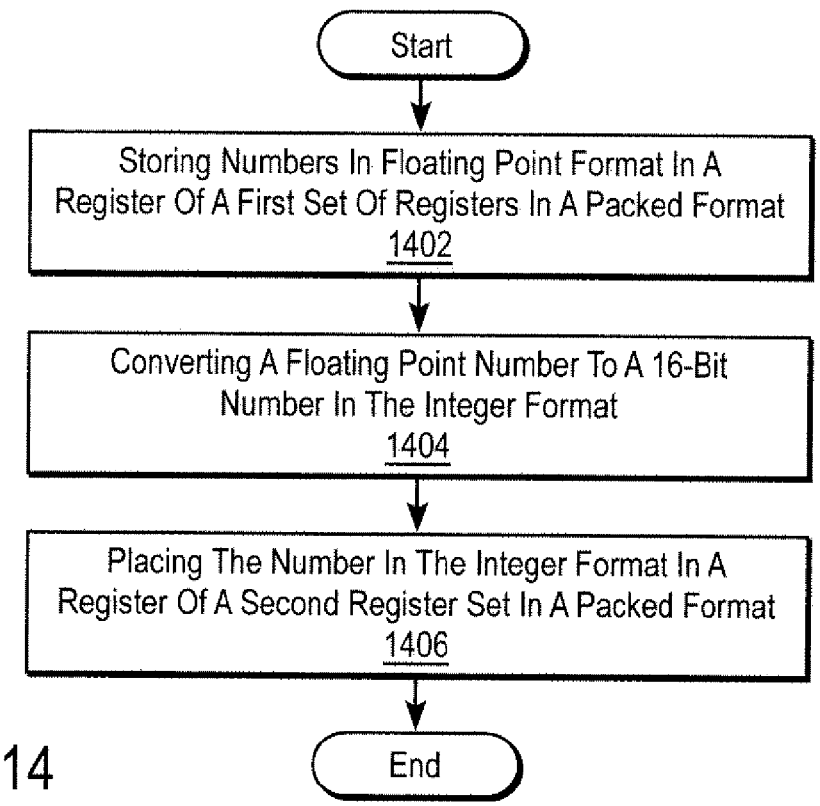
FIG. 14 is a flowchart for a second variant instruction used for converting a number from a packed floating point format to a packed integer format according to a CVTPS2PW instruction of one embodiment.

FIG. 14 is a flowchart for a second variant instruction used for converting a number from a packed floating point format to a packed integer format (the CVTPS2PW instruction). Operation begins at step 1402, at which a plurality of numbers are stored in the floating point format in a register of a first set of architectural registers in a packed format. In one embodiment, four numbers are stored in the floating point format, but the invention is not so limited. The floating point format of one embodiment is a 32-bit single precision floating point format, but the invention is not so limited. In one embodiment, the first set of architectural registers comprises eight 128-bit registers, but the invention is not so limited. At least one of the plurality of numbers in the floating point format is converted, at step 1404, to at least one number in the integer format. The integer format of one embodiment is a 16-bit integer format, but the invention is not so limited. The step of converting of one embodiment comprises accessing rounding mode bits from a control and status register, and rounding the number in the integer format according to a rounding mode indicated by the rounding mode bits. The numbers in the 16-bit integer format are placed in a register of a second set of architectural registers in a packed format, at step 1406. The second set of architectural registers may comprise eight 64-bit registers, but the invention is not so limited. Following the conversion, each 64-bit register may comprise four 16-bit integers representing the contents of one 128-bit floating point register, but the invention is not so limited.

Figure 15:
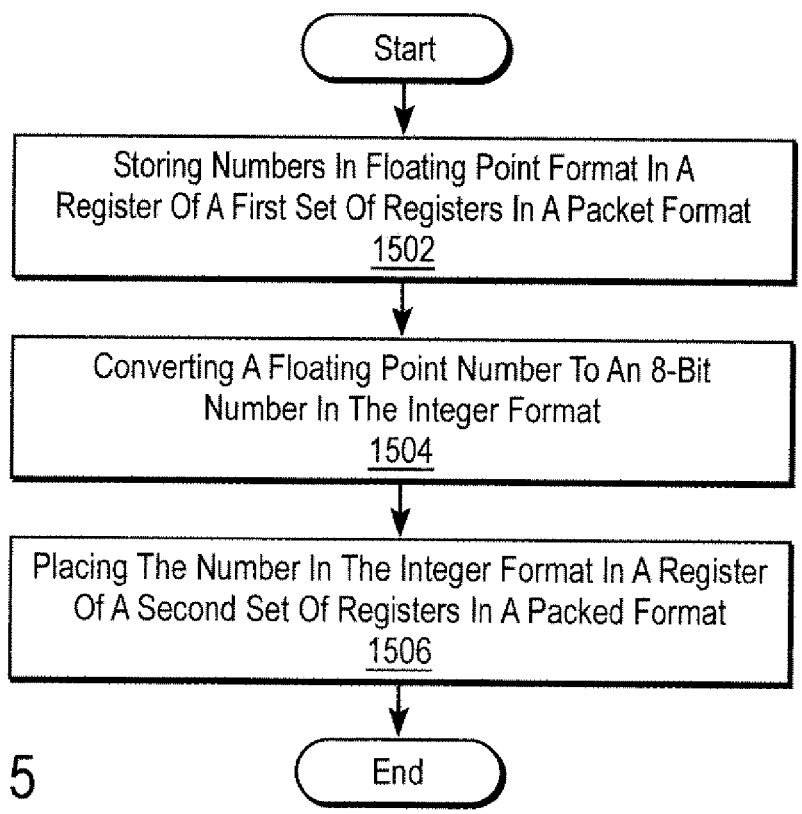
FIG. 15 is a flowchart for a third variant used for converting a number from a packed floating point format to a packed integer format according to a CVTPS2PB instruction of one embodiment.

FIG. 15 is a flowchart for a third variant used for converting a number from a packed floating point format to a packed integer format (the CVTPS2PB instruction). Operation begins at step 1502, at which a plurality of numbers are stored in the floating point format in a register of a first set of architectural registers in a packed format. In one embodiment, four numbers are stored in the floating point format, but the invention is not so limited. The floating point format of one embodiment is a 32-bit single precision floating point format, but the invention is not so limited. In one embodiment, the first set of architectural registers comprises eight 128-bit registers, but the invention is not so limited. At least one of the plurality of numbers in the floating point format is converted, at step 1504, to at least one number in the integer format. The integer format of one embodiment is an 8-bit integer format, but the invention is not so limited. The step of converting of one embodiment comprises accessing rounding mode bits from a control and status register, and rounding the number in the integer format according to a rounding mode indicated by the rounding mode bits. The numbers in the 8-bit integer format are placed in a register of a second set of architectural registers in a packed format, at step 1506. The second set of architectural registers may comprise eight 64-bit registers, but the invention is not so limited. Following the conversion, each 64-bit register may comprise four 8-bit integers representing the contents of one 128-bit floating point register, but the invention is not so limited.

The conversion instructions retain SIMD parallelism even though the widths of the registers are different. For conversions from the 128-bit to the 64-bit multimedia extension registers, the lower two SIMD floating point elements are converted to 32-bit integer elements per conversion instruction; therefore, two instantiations of a particular instruction are used to convert all four single precision elements, wherein shuffling of the operands is performed prior to issuance of the second conversion instruction. For conversions from the 64-bit to the 128-bit multimedia extension registers, the two 32-bit integer values are converted to single precision floating point and placed in the lower two elements of the floating point 128-bit multimedia extension register; the upper two elements of the floating point 128-bit multimedia extension register remain unchanged. This approach of passing the upper elements through intact provides greater flexibility in the merging of new data with existing data.

It will be appreciated that other variants may be useful for converting data between floating point and integer formats. For example, the CVTDQ2PS, CVTPS2DQ and CVTTPS2DQ instructions 950–958 of one embodiment convert between data of a floating point format and data of an integer format in packed 128-bit multimedia extension registers 906. In one embodiment, four numbers are stored in the floating point format, but the invention is not so limited. The floating point format of one embodiment is a 32-bit single precision floating point format, but the invention is not so limited. In one embodiment, the registers comprise eight 128-bit registers for storing a double quadword of data, but the invention is not so limited. The integer format of one embodiment is a 32-bit integer format, but the invention is not so limited. The converting of one embodiment comprises accessing rounding mode bits from a control and status register, and rounding the number in the integer format according to a rounding mode indicated by the rounding mode bits. Following the conversion, one packed 128-bit multimedia extension register 906 may comprise four 32-bit integers representing the contents of one 128-bit floating point register, but the invention is not so limited.

APPLICATION

Multimedia graphics are typically generated by treating an image as a collection of small, independently controlled dots, or pixels, arranged on a screen or cathode ray tube. A computer graphic image is typically composed of a number of objects rendered onto a background image. During rendering, the object may be combined with previously generated objects using compositing techniques, wherein compositing is the combining of multiple images by overlaying or blending the images. In a composited image, the value of each pixel is computed from the component images. In rendering multimedia 3D graphics, images are composited in two phases—geometry and rasterization. The geometry phase comprises building images for compositing using triangles formed by vertices defined in 3D coordinate space. Rasterization is the conversion of vector graphics, or images described in terms of mathematical elements such as points and lines, to equivalent images composed of pixel patterns that can be stored and manipulated as sets of bits.

In composing the triangles that form the images, each vertex or coordinate has a corresponding color value from a particular color model. A color model is a specification of a 3D color coordinate system and a visible subset in the coordinate system within which all colors in a particular color gamut lie, wherein a color gamut is a subset of all visible chromaticities. For example, the red (R), green (G), blue (B), color model (RGB) is the unit cube subset of the 3D Cartesian coordinate system. The purpose of a color model is to allow convenient specification of colors within some color gamut. The RGB primaries are additive primaries in that the individual contributions of each primary are added together to yield the resultant pixel.

The value of each pixel in a composited multimedia image is computed from the component images in some fashion. In an overlay, the pixels of the foreground image are given transparency values in addition to the RGB values. The value of a pixel in the composited image is taken from the background image unless the foreground image has a nontransparent value at that point, in which case the value is taken from the foreground image. Therefore, as an image is produced, coverage information is recorded so that the color associated with each pixel in the image is given an alpha value (A) representing the coverage of the pixel. Consequently, for an image that is to become the foreground element of a composited image, many of the pixels are registered as having coverage zero as they are transparent; the remainder, which constitute the important content of the foreground image, have larger coverage values, typically one. Thus, to do compositing in a reasonable fashion, the alpha information is provided at each pixel of the images being composited, so that along with the RGB values of an image there is an alpha value (A) encoding the coverage of each pixel.

In multimedia algorithms, data parallelism can be exploited in many different ways. One possible way is by executing the same operations on all elements of a color plane. This method involves organizing the information for an image in memory by storing the image by color plane. Consequently, all of the R components are at successive addresses in memory, all of the G components are also at successive addresses, and so on for the B and alpha components. All of the components of each color plane of an image must have the same operation performed on them. With all of the red color components being at successive addresses, it is easy to grab four elements of the R plane in a single memory access, and similarly to grab the corresponding four elements of the alpha plane in a single memory access. Executing the operation by color plane and using multimedia extension technology to compute in parallel on four elements of a given color plane allows for the exploitation of data parallelism.

A second method for exploiting data parallelism is by executing the same operations on all color elements of a pixel. This method involves organizing the information for an image in memory by storing the information about each image so that the three color components, R, G, and B, and the alpha component, of each pixel are at successive addresses in memory. In using the multimedia extension technology, one memory access takes the RGBA components for one pixel and executes in parallel operations on all the representative components of the pixel.

A further example of the exploitation of data parallelism in multimedia applications involves manipulating coordinates of points in space. Using this technique, data parallelism is exploited by executing the same operations on a given coordinate or by executing the same operations on all points of the space.

Figure 16:
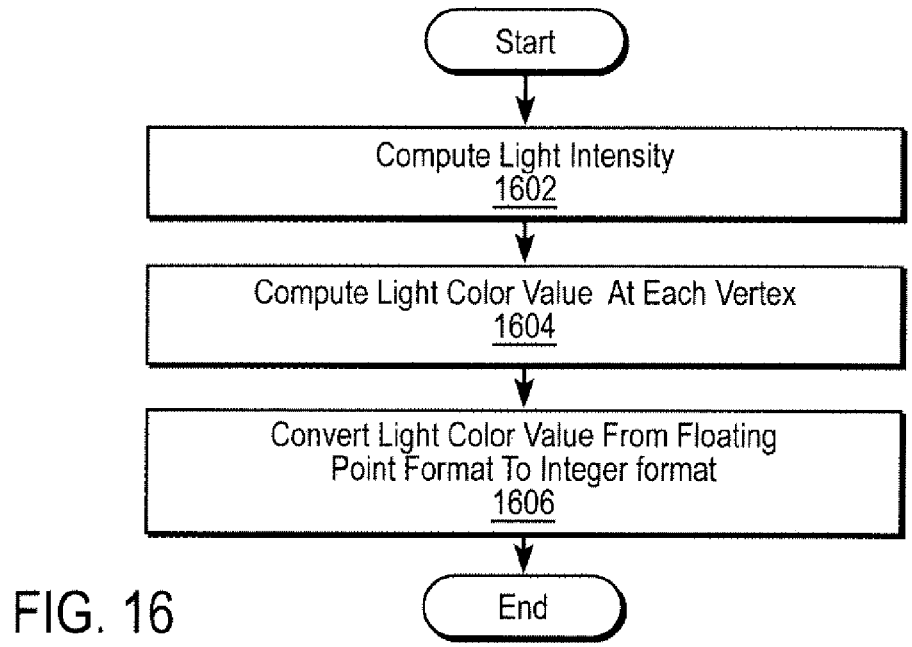
FIG. 16 is a flowchart for a lighting computation in 3D geometry in which the instructions of one embodiment are used.

The instructions disclosed herein allow for the parallel conversion of multiple single precision floating point color values to a specific integer format. One application described herein, but to which the invention is not so limited, uses the conversion instructions for the parallel conversion of lighting function data in 3D graphics. FIG. 16 is a flowchart for the lighting computation in 3D geometry in which the instructions of one embodiment are used. Operation begins at step 1602, at which a light intensity is computed. A light color value is computed, at step 1604, for each vertex. The light color value is converted from a floating point format to an integer format, at step 1606, wherein floating point color values for red (R), green (G), and blue (B) color components are converted into integer values.

Figure 17:
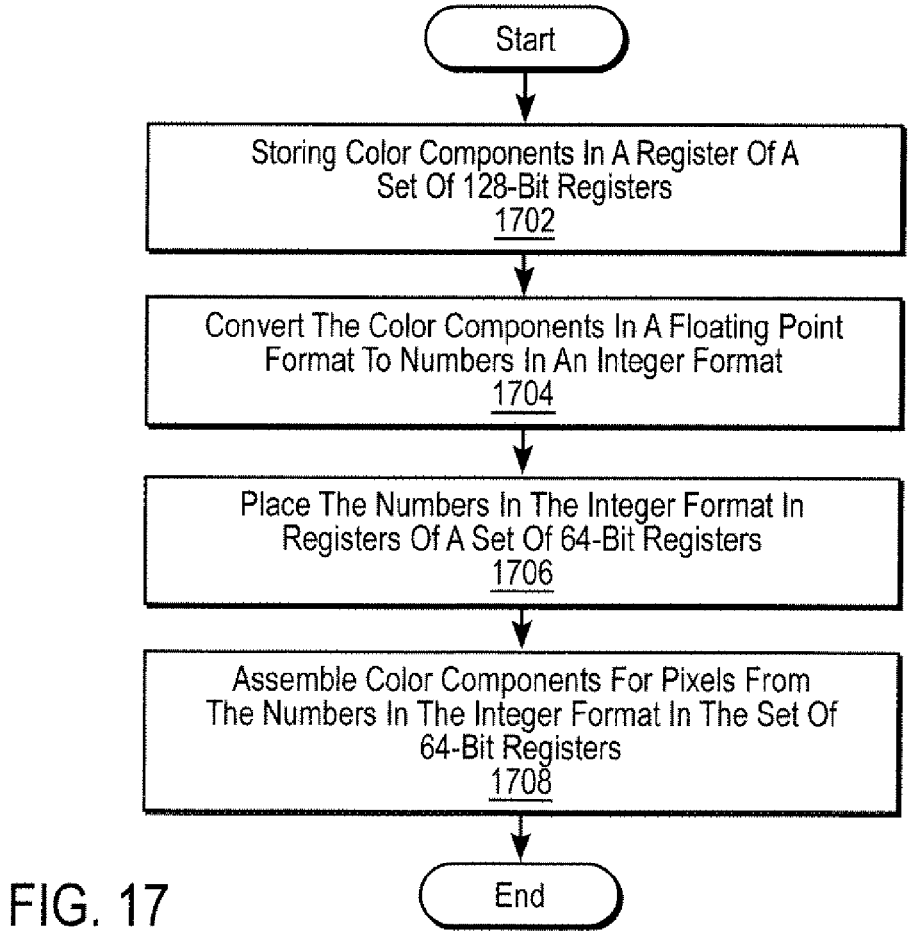
FIG. 17 is a flowchart for a parallel conversion of multiple color values from a single precision floating point format to a specific integer format of one embodiment.

FIG. 17 is a flowchart for the parallel conversion of multiple color values from a single precision floating point format to a specific integer format of one embodiment. Operation begins at step 1702, at which a number of color components in a floating point format are stored in a register of a set of 128-bit registers. The floating point data is stored in the 128-bit registers in the packed format. Each of the color components in the floating point format is converted to color values, or numbers, in an integer format, at step 1704. The numbers in the integer format are placed in at least one register of a set of 64-bit registers, at step 1706. The integer data is stored in the 64-bit registers in the packed format. The color components are assembled for each pixel of a composited graphic using the numbers in the integer format from the set of 64-bit registers. In one embodiment, the color components in each of the registers of the set of 128-bit registers represent values in the same color plane. In an alternate embodiment, the color components in each of the registers of the set of 128-bit registers represent color components that define a color of a pixel.

Figure 18A:
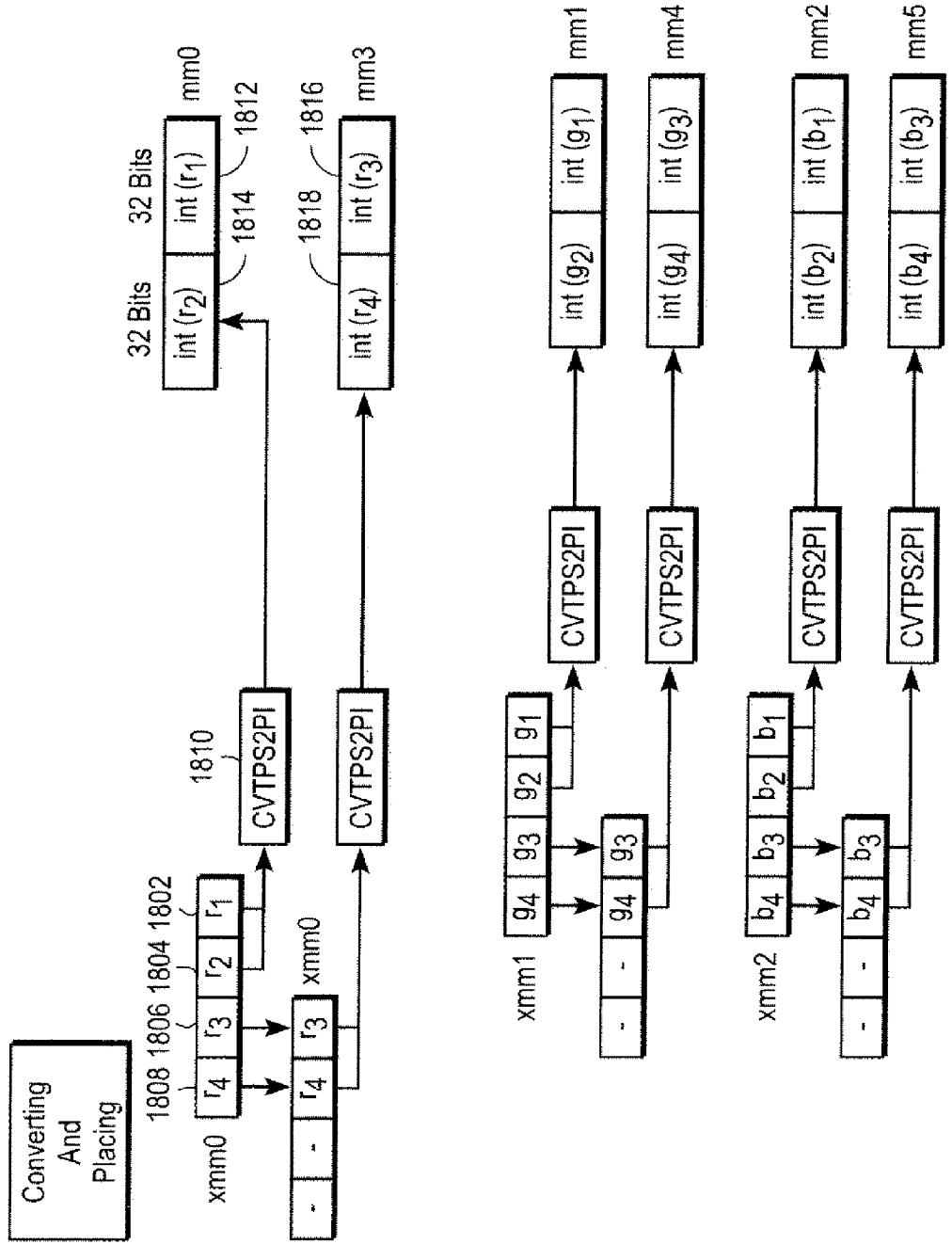
FIG. 18a, FIG. 18b and FIG. 18c are data flow diagrams of parallel conversions of graphic color data using a CVTPS2PI or a CVTPD2PI instruction of one embodiment.
Figure 18B:
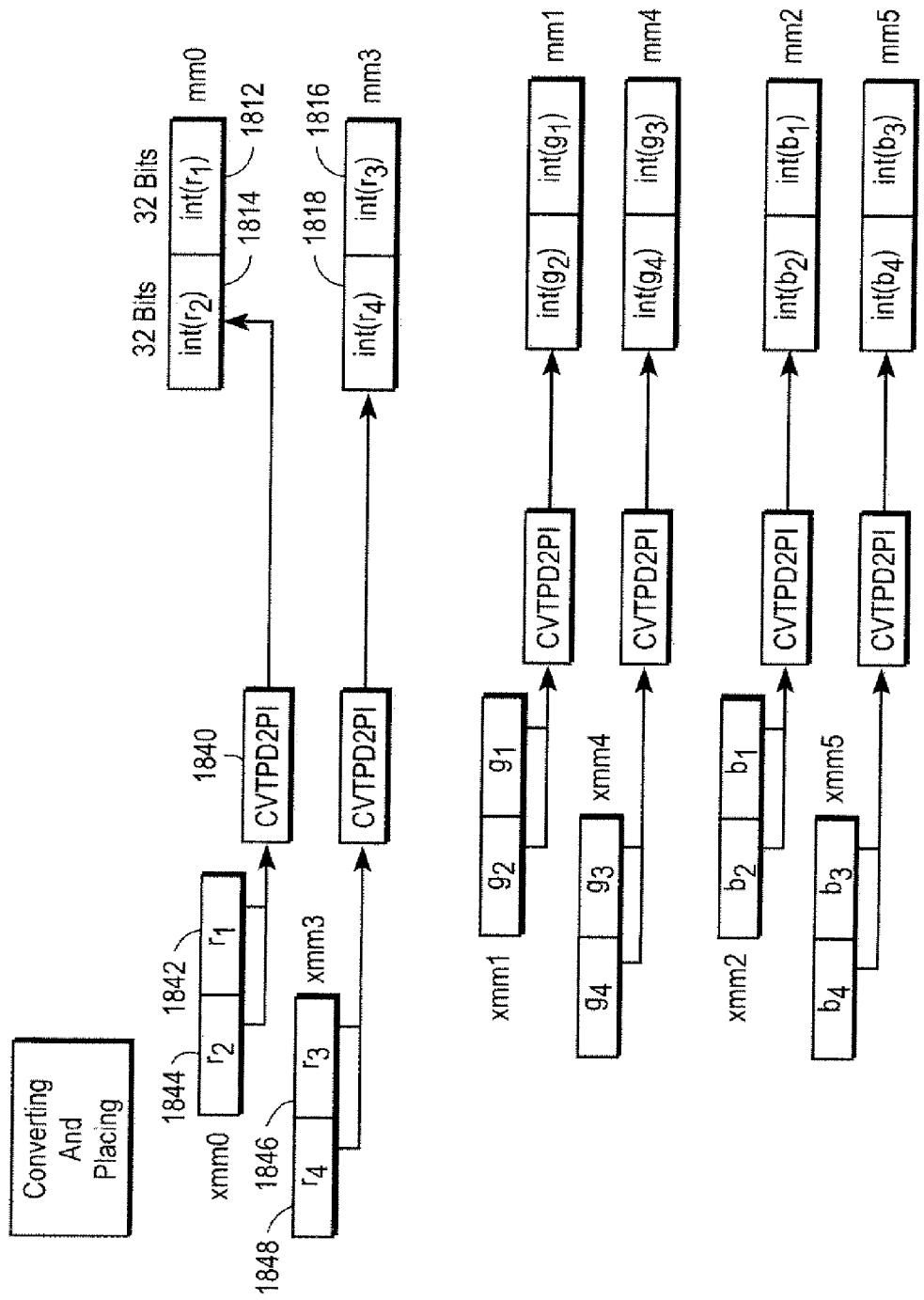
Figure 18C:
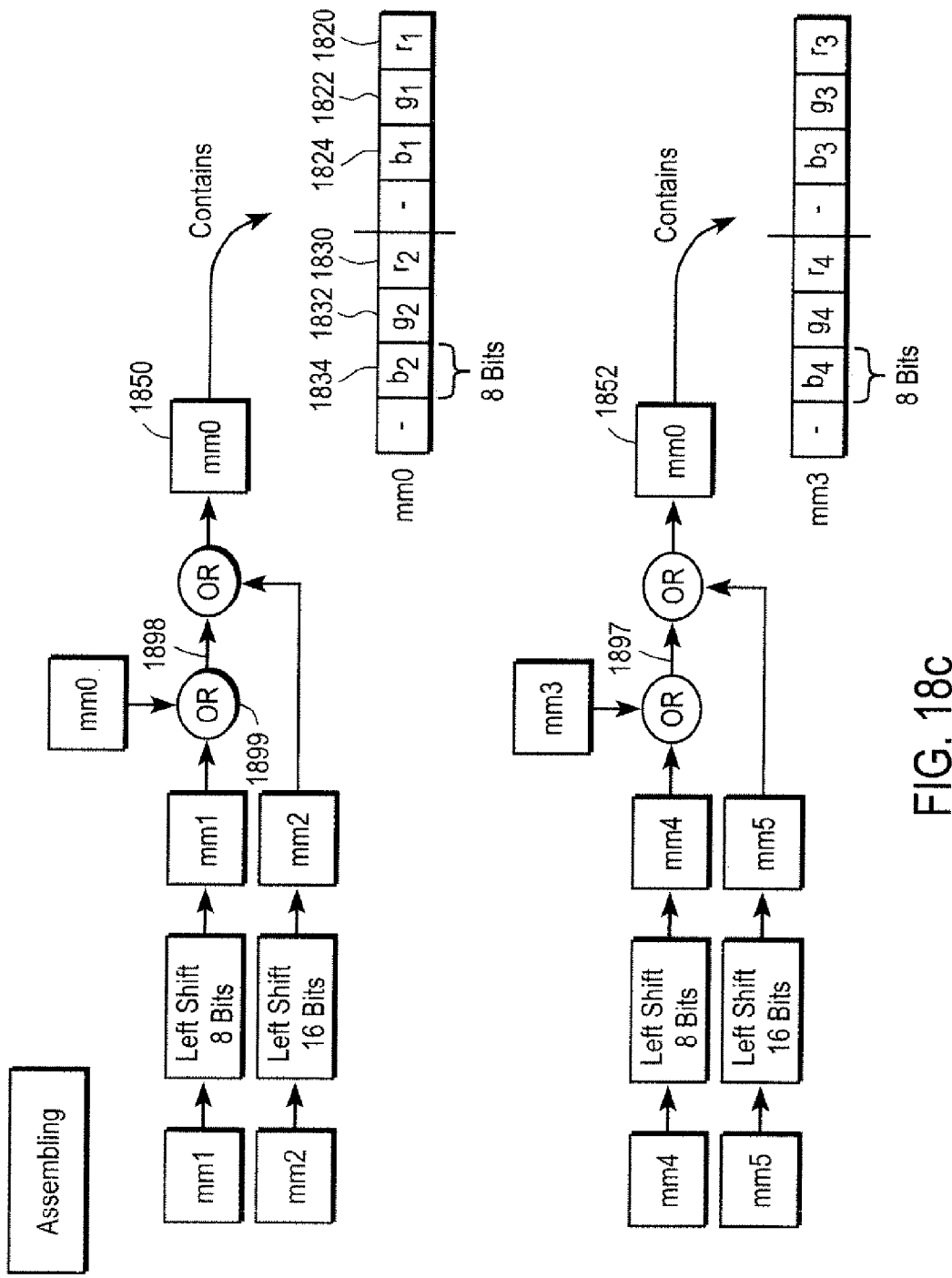

In one embodiment of the CVTPS2PI instruction or the CVTPD2PI 20 instruction previously discussed herein, they may used to convert the color components in the floating point format to color values in an integer format, at step 1704. FIG. 18*a*, FIG. 18*b* and FIG. 18*c* are data flow diagrams of parallel conversions of graphic color data using the CVTPS2PI or the CVTPD2PI instruction of one embodiment. In this embodiment, it is necessary to clamp the value of floating point operands used in conversion of graphic color data to 8-bit values. This is necessary because some of the data manipulations would create meaningless values if the floating point data was greater than 8 bits wide.

Using the CVTPS2PI instruction, the step of converting, step 1704, comprises converting 1810 first and second 32-bit color values located in the lower 64 bits 1802–1804 of a 128-bit register XMM0 to first and second 32-bit numbers in the integer format. Following this step, the third and fourth 32-bit color values 1806–1808 located in the upper 64 bits of the 128-bit register XMM0 are shifted into the lower 64-bits of the 128-bit register 1802–1804. The third and fourth 32-bit color values are converted to third and fourth 32-bit numbers in the integer format. In one embodiment, the aforementioned steps are performed for each of three 128-bit registers XMM0–XMM2, wherein one 128-bit register XMM0 comprises data for a Red color component of each of four pixels, one 128-bit register XMM1 comprises data for a Green color component of each of four pixels, and one 128-bit register XMM2 comprises data for a Blue color component of each of four pixels, but the invention is not so limited. In an alternate embodiment, a fourth 128-bit register (not shown) may comprise transparency data for each of four pixels.

In one embodiment, the step of placing, step 1706, comprises placing the first and second 32-bit numbers 1812–1814 in the integer format from a first 128-bit register XMM0 in a first 64-bit register MM0, and placing the third and fourth 32-bit numbers 1816–1818 in the integer format from the first 128-bit register XMM0 in a second 64-bit register MM3. The first and second 32-bit numbers in the integer format from a second 128-bit register XMM1 are placed in a third 64-bit register MM1, and the third and fourth 32-bit numbers in the integer format from the second 128-bit register XMM1 are placed in a fourth 64-bit register MM4. The first and second 32-bit numbers in the integer format from a third 128-bit register XMM2 are placed in a fifth 64-bit register MM2, and the third and fourth 32-bit numbers in the integer format from the third 128-bit register XMM2 are placed in a sixth 64-bit register MM5. In an alternate embodiment, the first and second 32-bit numbers in the integer format from a fourth 128-bit register (not shown) are placed in a seventh 64-bit register (not shown), and the third and fourth 32-bit numbers in the integer format from the fourth 128-bit register are placed in an eighth 64-bit register (not shown).

Using the CVTPD2PI instruction, the step of converting, step 1704, comprises converting 1840 first and second 64-bit color values located in the packed double precision floating point numbers 1842–1844 of a 128-bit register XMM0 to first and second 32-bit numbers in the integer format. Following this step, the third and fourth 64-bit color values 1846–1848 located in the 128-bit register XMM3. The third and fourth 32-bit color values are converted to third and fourth 32-bit numbers in the integer format. In one embodiment, the aforementioned steps are performed for each of six 128-bit registers XMM0–XMM5, wherein two 128-bit registers XMM0 and XMM3 comprise data for a Red color component of each of four pixels, two 128-bit register XMM1 and XMM4 comprise data for a Green color component of each of four pixels, and two 128-bit register XMM2 and XMM5 comprise data for a Blue color component of each of four pixels, but the invention is not so limited. In an alternate embodiment, a seventh and an eighth 128-bit register (not shown) may comprise transparency data for each of four pixels.

In one embodiment, the step of placing, step 1706, comprises placing the first and second 32-bit numbers 1812–1814 in the integer format from a first 128-bit register XMM0 in a first 64-bit register MM0, and placing the first and second 32-bit numbers 1816–1818 in the integer format from a second 128-bit register XMM3 in a second 64-bit register MM3. The first and second 32-bit numbers in the integer format from a third 128-bit register XMM1 are placed in a third 64-bit register MM1, and the first and second 32-bit numbers in the integer format from the fourth 128-bit register XMM4 are placed in a fourth 64-bit register MM4. The first and second 32-bit numbers in the integer format from a fifth 128-bit register XMM2 are placed in a fifth 64-bit register MM2, and the first and second 32-bit numbers in the integer format from the sixth 128-bit register XMM5 are placed in a sixth 64-bit register MM5. In an alternate embodiment, the first and second 32-bit numbers in the integer format from a seventh 128-bit register (not shown) are placed in a seventh 64-bit register (not shown), and the first and second 32-bit numbers in the integer format from an eight 128-bit register are placed in an eighth 64-bit register (not shown).

The step of assembling, step 1708, generally comprises manipulating the contents of the set of six 64-bit registers MM0–MM5, wherein the manipulation results in each 64-bit register comprising the color components that define a pixel. Specifically, in one embodiment, following the step of placing, step 1706, each register of the set of six 64-bit registers MM0–MM5 comprises data for one color component of each of two pixels. Therefore, the step of assembling, step 1708, comprises a logical combination of the first three registers MM0–MM2 of the set of six 64-bit registers, wherein the combination results in a first combined 64-bit register 1850 comprising three 8-bit color components for each of a first 1820–1824 and a second 1830–1834 pixel, wherein the three 8-bit color components define the color of a pixel. The contents of the first combined register 1850 are placed into register MM0.

The logical combination of one embodiment comprises performing a bitwise logical OR 1899 of the contents of the first MM0 and the second MM1 64-bit registers, but the invention is not so limited. The bitwise logical OR instruction performs a bitwise logical OR on 64 bits of the destination and source operands and writes the result to the destination register. Each bit of the result is set to 0 if the corresponding bits of both operands are 0; otherwise, the bit is 1. A bitwise logical OR is then performed of the result of the first logical operation 1898 and the contents of the third 64-bit register MM2. The result of these two logical operations is a first combined 64-bit register 1850 comprising three 8-bit color components for each of a first 1820–1824 and second 1830–1834 pixel.

Moreover, a logical combination is performed of the second three registers MM3–MM5 of the set of six 64-bit registers MM0–MM5, wherein the combination results in a second combined 64-bit register 1852 comprising three 8-bit color components for each of a third and a fourth pixel. The logical combination of the second three registers MM3–MM5 of one embodiment comprises performing a bitwise logical OR of the contents of the fourth MM3 and the fifth MM4 64-bit registers, but the invention is not so limited. A bitwise logical OR is then performed of the result of this third logical operation 1897 and the contents of the sixth 64-bit register MM5. The result of these two logical operations is a second combined 64-bit register 1852 comprising three 8-bit color components for each of a third and fourth pixel. The contents of the second combined register 1852 are placed into register MM3. In an alternate embodiment, transparency data may be manipulated along with the R, G, B data of pixels, wherein the two remaining 8-bit slots of the combined 64-bit registers will comprise transparency data for the corresponding pixel.

Figure 19A:
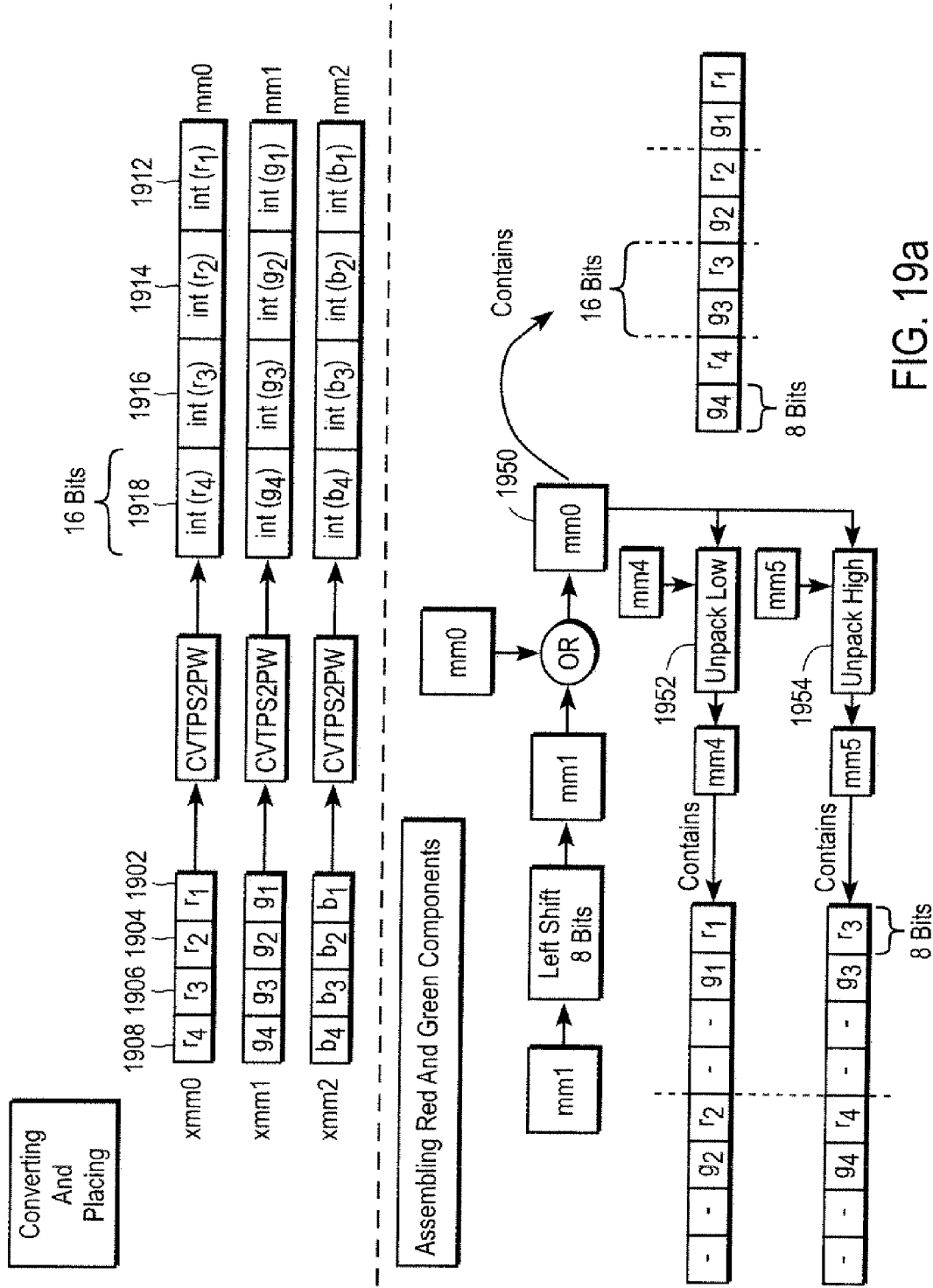
FIG. 19a and FIG. 19b is a data flow diagram of a parallel conversion of graphic color data using a CVTPS2PW instruction of one embodiment.
Figure 19B:
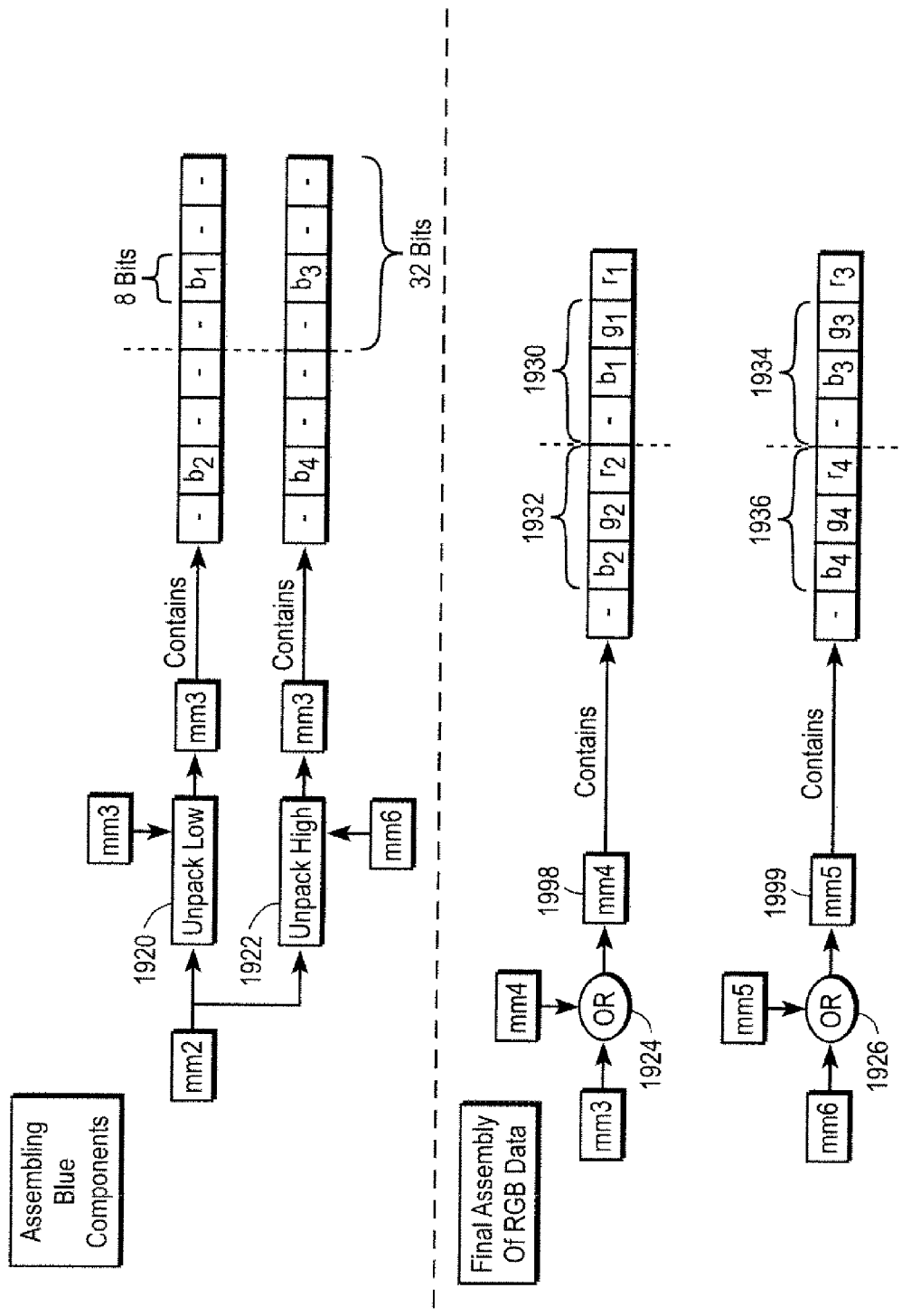

In one embodiment, the CVTPS2PW instruction previously discussed herein is used to convert the color components in the floating point format to color values in an integer format, at step 1704. FIG. 19*a* and FIG. 19*b* are data flow diagrams of the parallel conversion of graphic color data using the CVTPS2PW instruction of one embodiment. In this embodiment, it is necessary to clamp the value of floating point operands used in conversion of graphic color data to 8-bit values. This is necessary because some of the data manipulations would create meaningless values if the floating point data was greater than 8 bits wide.

Using this instruction, the step of converting, step 1704, comprises converting four 32-bit color components 1902–1908 located in a 128-bit register XMM0 to four 16-bit numbers 1912–1918, or color components, in a 64-bit register MM0. In one embodiment, the aforementioned steps are performed for each of three 128-bit registers XMM0–XMM2, wherein one 128-bit register XMM0 comprises data for a Red color component of each of four pixels, one 128-bit register XMM1 comprises data for a Green color component of each of four pixels, and one 128-bit register XMM2 comprises data for a Blue color component of each of four pixels, but the invention is not so limited. In an alternate embodiment, a fourth 128-bit register (not shown) may comprise transparency data for each of four pixels. In another alternate embodiment, each register of a set of three 128-bit registers may comprise data for the color components of a pixel, and each register of the set of three 64-bit registers may comprise data for the color components that define a pixel.

The step of placing, step 1706, comprises placing the four 16-bit numbers, or color components, in the integer format in a 64-bit register. Therefore, in one embodiment, a first 64-bit register MM0 corresponding to a first 128-bit register XMM0 comprises the Red component data for each of four pixels, a second 64-bit register MM1 corresponding to a second 128-bit register XMM1 comprises the Green component data for each of the four pixels, and a third 64-bit register MM2 corresponding to a third 128-bit register XMM2 comprises the Blue component data for each of the four pixels, but the invention is not so limited.

The step of assembling, step 1708, generally comprises manipulating the contents of the set of three 64-bit registers MM0–MM2, wherein the manipulation results in two 64-bit registers 1998–1999 that each comprise the color components that define each of two pixels. In one embodiment, the manipulation comprises the logical combination of two registers MM0–MM1 of the set of three 64-bit registers MM0–MM2, wherein the combination results in a first MM4 and a second MM5 combined 64-bit register. The first combined register MM4 comprises a first and a second 8-bit color component for each of a first and a second pixel, and the second combined register MM5 comprises a first and a second 8-bit color component for each of a third and a fourth pixel. A third combined 64-bit register MM3 is generated by performing an unpack operation 1920 on the lower 32 bits of the third 64-bit register MM2, wherein the third combined register MM3 comprises a third 8-bit color component for each of the first and second pixels. A fourth combined 64-bit register MM6 is generated by performing an unpack operation 1922 on the upper 32 bits of the third 64-bit register MM2, wherein the fourth combined register MM6 comprises a third 8-bit color component for each of the third and fourth pixels.

Specifically, in one embodiment, following the step of placing, step 1706, each register of the set of three 64-bit registers comprises data for one color component of each of four pixels. Therefore, the step of assembling, step 1708, comprises the step of assembling results for the Red and Green color components of four pixels, the step of assembling results for the Blue color components of four pixels, and the step of piecing together the Red, Green, and Blue components to form two 64-bit registers, wherein each register comprises the data for the color components that define each of two pixels.

The step of assembling the results for the Red and Green color components of four pixels comprises performing a bitwise logical OR of the contents of the first MM0 and second MM1 64-bit registers of the set of three 64-bit registers. The resultant 64-bit register 1950 comprises eight 8-bit numbers, or color components, wherein four 8-bit numbers comprise data for the Red color component of each of four pixels and four 8-bit numbers comprise data for the Green color component of each of the four pixels, but the invention is not so limited. In one embodiment, the contents of the resultant 64-bit register 1950 are substituted for the first 64-bit register MM0 of the set of three 64-bit registers. An unpack operation (unpack low from word to doubleword) 1952 is performed on the lower 32 bits of the resultant 64-bit register 1950 to produce a first combined 64-bit register MM4 comprising data for the Red color component and the Green color component of each of a first and second pixel. An unpack operation interleaves data by taking one operand from one register and one operand from a corresponding location in another register and placing both operands contiguously in a register. An unpack operation (unpack high from word to doubleword) 1954 is performed on the upper 32 bits of the resultant 64-bit register 1950 to produce a second combined 64-bit register MM5 comprising data for the Red color component and the Green color component of each of a third and fourth pixel.

The step of assembling the results for the Blue color components of four pixels comprises performing an unpack operation (unpack low from word to doubleword) 1920 on the lower 32 bits of the third 64-bit register MM2 to produce a third combined 64-bit register MM3 comprising data for the Blue color component of each of a first and second pixel. An unpack operation (unpack high from word to doubleword) 1922 is performed on the upper 32 bits of the third 64-bit register MM2 to produce a fourth combined 64-bit register MM6 comprising data for the Blue color component of each of a third and fourth pixel.

The step of piecing together the Red, Green, and Blue components to form two 64-bit registers 1998–1999 comprises performing a first logical OR 1924 of the first MM4 and third MM3 combined 64-bit registers to produce a first graphic register 1998 and performing a second logical OR 1926 of the second MM5 and fourth MM6 combined 64-bit registers to produce a second graphic register 1999. The first graphic register 1998 comprises three 8-bit color components that define each of a first 1930 and second 1932 pixel. The second graphic register 1999 comprises three 8-bit color components that define each of a third 1934 and fourth 1936 pixel.

Figure 20A:
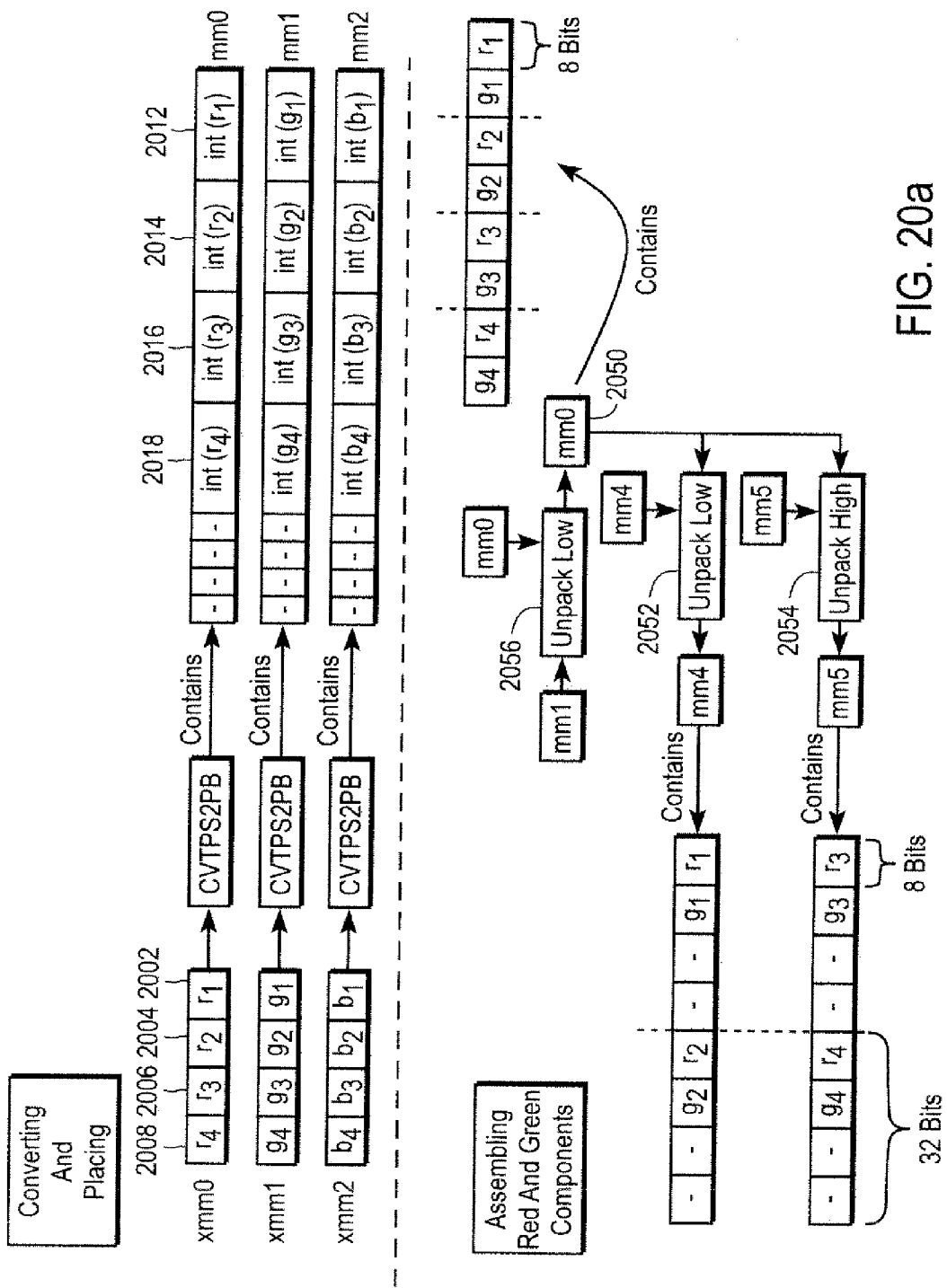
FIG. 20a and FIG. 20b is a data flow diagram of a parallel conversion of graphic color data using a CVTPS2PB instruction of one embodiment.
Figure 20B:
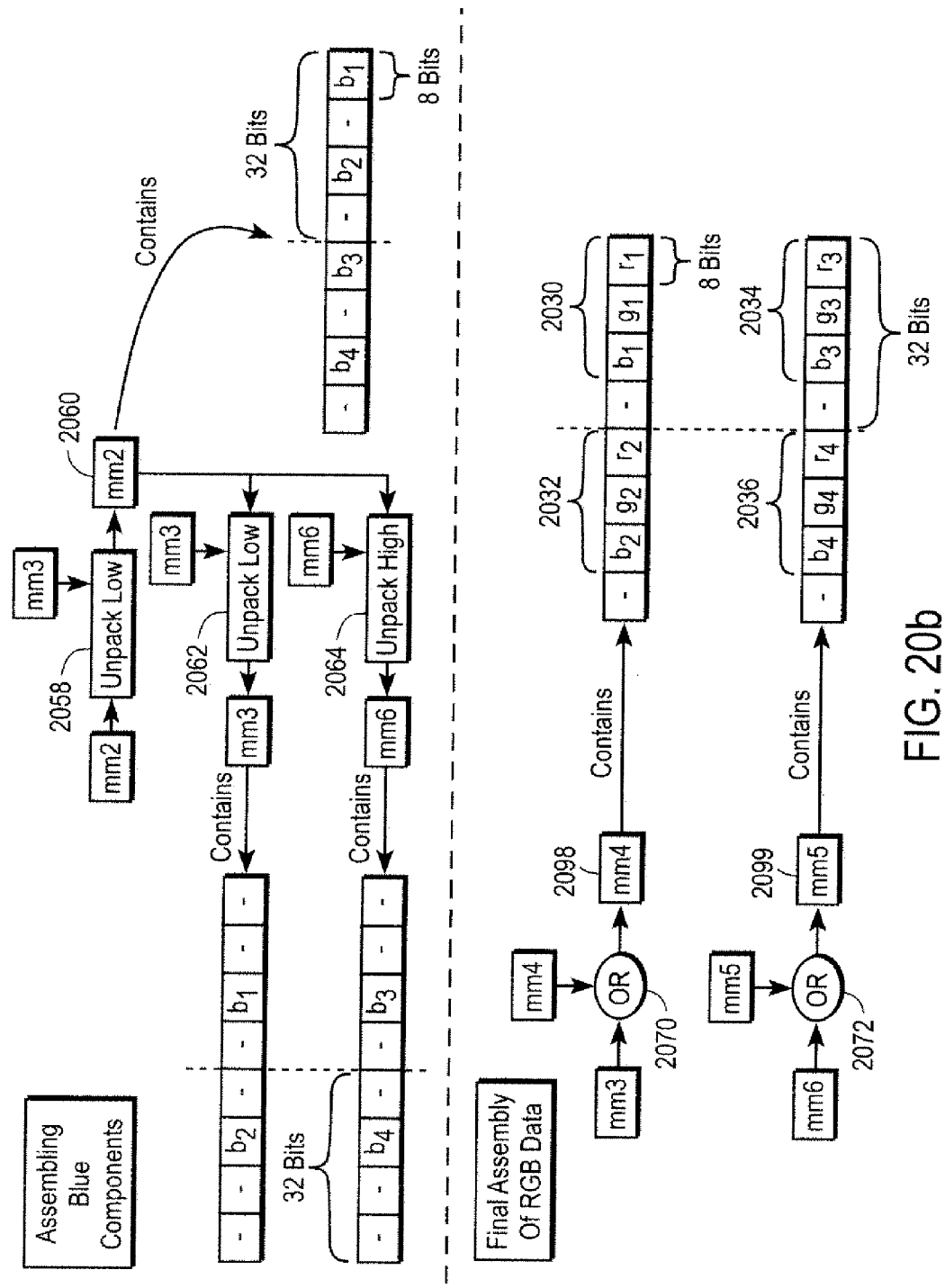

In one embodiment, the CVTPS2PB instruction previously discussed herein is used to convert the color components in the floating point format to color values in an integer format, at step 1704. FIG. 20*a* and FIG. 20*b* are data flow diagrams of the parallel conversion of graphic color data using the CVTPS2PB instruction of one embodiment. Using this instruction, the step of converting, step 1704, comprises converting four 32-bit color components 2002–2008 located in a 128-bit register XMM0 to four 8-bit numbers 2012–2018, or color components, in a 64-bit register MM0. In one embodiment, the aforementioned steps are performed for each of three 128-bit registers XMM0–XMM2, wherein one 128-bit register XMM0 comprises data for a Red color component of each of four pixels, one 128-bit register XMM1 comprises data for a Green color component of each of four pixels, and one 128-bit register XMM2 comprises data for a Blue color component of each of four pixels, but the invention is not so limited. In an alternate embodiment, a fourth 128-bit register (not shown) may comprise transparency data for each of four pixels. In another alternate embodiment, each register of a set of three 128-bit registers may comprise data for the color components of a pixel, and each register of the set of three 64-bit registers may comprise data for the color components that define a pixel.

The step of placing, step 1706, comprises placing the four 8-bit numbers, or color components, in the integer format in a 64-bit register. Therefore, in one embodiment, a first 64-bit register MM0 corresponding to a first 128-bit register XMM0 comprises the Red component data for each of four pixels, a second 64-bit register MM1 corresponding to a second 128-bit register XMM1 comprises the Green component data for each of the four pixels, and a third 64-bit register MM2 corresponding to a third 128-bit register XMM2 comprises the Blue component data for each of the four pixels, but the invention is not so limited.

The step of assembling, step 1708, generally comprises manipulating the contents of the set of three 64-bit registers MM0–MM2, wherein the manipulation results in two 64-bit registers 2098–2099 that each comprise the color components that define each of two pixels. In one embodiment, the manipulation comprises the logical combination of two registers MM0–MM1 of the set of three 64-bit registers MM0–MM2, wherein the combination results in a first MM4 and a second MM5 combined 64-bit register. The first combined register MM4 comprises a first and a second 8-bit color component for each of a first and a second pixel, and the second combined MM5 register comprises a first and a second 8-bit color component for each of a third and a fourth pixel. A third MM3 and a fourth MM6 combined 64-bit register are generated from the logical combination of one register MM2 of the set of three 64-bit registers and a fourth 64-bit register 1910 containing logic zeros. The third combined register MM3 comprises a third 8-bit color component for each of the first and second pixels, and the fourth combined register MM6 comprises a third 8-bit color component for each of the third and fourth pixels.

A logical combination of the first MM4 and third MM3 combined registers results in a first 64-bit graphic register 2098; the first graphic register 2098 comprises three 8-bit color components 2030 that define a color of a first pixel and three 8-bit color components 2032 that define a color of a second pixel. A logical combination of the second MM5 and fourth MM6 combined registers results in a second 64-bit graphic register 2099; the second graphic register 2099 comprises three 8-bit color components 2034 that define a color of a third pixel and three 8-bit color components 2036 that define a color of a fourth pixel. In an alternate embodiment, each of the combined registers may comprise two 8-bit transparency components for each of the corresponding pixels, and each of the graphic registers may comprise an 8-bit transparency component corresponding to each represented pixel.

Specifically, in one embodiment, following the step of placing, step 1706, each register of the set of three 64-bit registers MM0–MM2 comprises data for one color component of each of four pixels. Therefore, the step of assembling, step 1708, comprises the step of assembling results for the Red and Green color components of four pixels, the step of assembling results for the Blue color components of four pixels, and the step of piecing together the Red, Green, and Blue components to form two 64-bit registers 2098–2099, wherein each register comprises the data for the color components that define each of two pixels.

The step of assembling the results for the Red and Green color components of four pixels comprises performing an unpack operation (unpack low from byte to word) 2056 on the contents of the first MM0 and second MM1 64-bit registers of the set of three 64-bit registers MM0–MM2. The resultant 64-bit register 2050 comprises eight 8-bit numbers, or color components, wherein four 8-bit numbers comprise data for the Red color component of each of four pixels and four 8-bit numbers comprise data for the Green color component of each of the four pixels, but the invention is not so limited. In one embodiment, the contents of the resultant 64-bit register 2050 are substituted for the first 64-bit register MM0 of the set of three 64-bit registers MM0–MM2. An unpack operation (unpack low from word to doubleword) 2052 is performed on the lower 32 bits of the resultant 64-bit register 2050 to produce a first combined 64-bit register MM4 comprising data for the Red color component and the Green color component of each of a first and second pixel. An unpack operation (unpack high from word to doubleword) 2054 is performed on the upper 32 bits of the resultant 64-bit register 2050 to produce a second combined 64-bit register MM5 comprising data for the Red color component and the Green color component of each of a third and fourth pixel.

The step of assembling the results for the Blue color components of four pixels comprises performing an unpack operation (unpack low from byte to word) 2058 on the contents of the third 64-bit register and a fourth 64-bit register MM3 containing logical zeros. The resultant 64-bit register 2060 comprises four 8-bit numbers that are the data for the Blue component of each of the four pixels. In one embodiment, the contents of the resultant 64-bit register 2060 are substituted for the third 64-bit register MM2 of the set of three 64-bit registers MM0–MM2. An unpack operation (unpack low from word to doubleword) 2062 is performed on the lower 32 bits of the resultant 64-bit register 2060; the result of the unpack replaces the contents of the fourth 64-bit register MM3, wherein the fourth 64-bit register MM3 now comprises data for the Blue color component of each of a first and second pixel. An unpack operation (unpack high from word to doublewords) 2064 is performed on the upper 32 bits of the resultant 64-bit register 2060 to produce a seventh 64-bit register MM6 comprising data for the Blue color component of each of a third and fourth pixel.

The step of piecing together the Red, Green, and Blue components to form two 64-bit registers 2098–2099 comprises performing a first logical OR 2070 of the first MM4 and third MM3 combined 64-bit registers to produce a first graphic register 2098 and performing a second logical OR 2072 of the second MM5 and fourth MM6 combined 64-bit registers to produce a second graphic register 2099. The first graphic register 2098 comprises three 8-bit color components that define each of a first 2030 and second 2032 pixel. The second graphic register 2099 comprises three 8-bit color components that define each of a third 2034 and fourth 2036 pixel.

CIRCUIT DESCRIPTIONS

Figure 21:
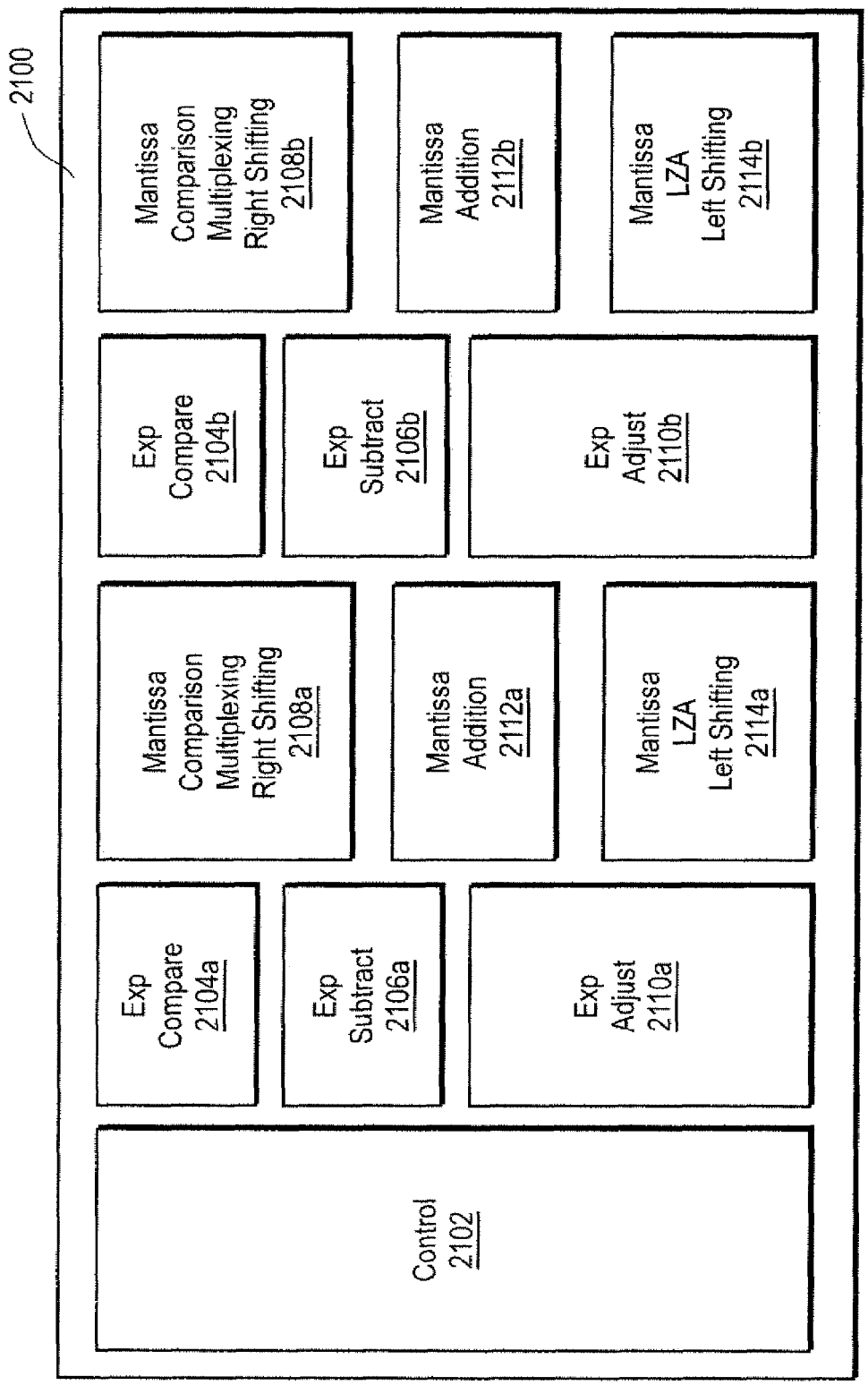
FIG. 21 is a block diagram of a floating point arithmetic and conversion unit according to one embodiment of the present invention.

FIG. 21 is a block diagram of a floating point arithmetic unit 2100 according to one embodiment of the present invention. In this embodiment, floating point unit 2100 performs addition and subtraction on floating point numbers in a single precision format. Floating point unit 2100 includes duplicate sets of functional units to perform parallel operations on two sets of floating point operands. Duplicate, parallel functional units are designated in FIG. 21 with like numbers, for example 2104a and 2104b. Floating point unit 2100 can therefore perform parallel operations on packed data formats, for example, as required by SIMD operations. Because functional units "a" are equivalent to functional units "b", only functional units "a" will be described.

Control unit 2102 includes circuitry for controlling the operation of functional units within floating point unit 2100. For example, control unit 2102 determines which functional units must be used in response to the control signal received, and in which manner, to carry out an operation. Functional unit 2108a is a mantissa comparison, multiplexing, and right shifting unit. The comparison capability of unit 2108a is only needed in addition and subtraction operations. Specifically, when exponents of two floating point operands are equal, it is necessary to compare mantissa portions in order to determine the smaller mantissa and arrange operands so as to avoid a negative result.

Exponent compare unit 2104 compares incoming exponents in order to determine which is the larger exponent. In the case of an arithmetic operation between two floating point operands, exponent compare unit receives an exponent 1 and an exponent 2 from an operand 1 and an operand 2, respectively. In this embodiment, in the case of a conversion operation, an exponent of an incoming floating point number to be converted to an integer format is compared to a predetermined number for the purpose of determining whether a conversion operation will require a shift beyond data path space normally allotted for single precision floating point numbers in floating point unit 2100. As will be explained more fully below, one embodiment of floating point unit 2100 includes additional data path space in each of its functional units to accommodate shifts beyond a normal single precision floating point capacity. In addition, according to one embodiment, one of two conversion constants is used in a floating point to integer conversion operation. One conversion constant is used for the case in which normal single precision floating point data path capacity is adequate to perform the conversion. Another constant is used for the case in which the conversion operation will require a shift beyond the normal data path capacity required for single precision floating point numbers.

Alternatively, an integer may be represented in 64-bits. In an alternative embodiment of floating point unit 2100 additional data path space in each of its functional units is provided to accommodate shifts beyond a normal double precision floating point capacity. One conversion constant is used for the case in which normal double precision floating point data path capacity is adequate to perform the conversion. Another constant is used for the case in which the conversion operation will require a shift beyond the normal data path capacity required for double precision floating point numbers.

Exponent subtract unit 2106a, in a conversion operation, performs a subtraction between an exponent of an incoming floating point number to be converted and a constant. As is known, constants used for conversion between a floating point format and integer format contain an exponent field that contains a predetermined number and a mantissa field that is filled with zeros. The constant takes the place of a second floating point operand in a conversion operation in floating point unit 2100. The constant is a predetermined number whose value is dependent on a specific application, for example, a particular format used. Use of the constant allows the conversion to be performed in floating point unit 2100. In this embodiment, the conversion constant also includes a bias. As is known in the art, processors may represent exponents in a biased form. This means that a constant value is added to an actual exponent so that the biased exponent is always a positive number. The value of a bias depends on the number of bits available for representing exponents in the floating point format being used.

The bias and constant are chosen so that the smallest normalized number can be reciprocated without overflow. For example, in a common external format, $-126_{10}$ is the maximum negative value representable. In this case, a bias of $+127_{10}$ is added to the exponent. Commonly, in processor internal formats the actual bias is larger because the exponent field is larger than that of an external representation.

Still referring to FIG. 21, exponent subtract unit 2106a is used to subtract an exponent of an incoming floating point number from a constant (where the constant includes a constant plus a constant bias) in order to determine how many positions to the right the floating point must be shifted in order to right align the number for integer format.

Mantissa addition unit 2112a is used for adding floating point numbers in an addition operation. Mantissa addition unit 2112a can also be used in a conversion operation for complementing a negative number. As is known, floating point numbers are always represented by positive fractions in the mantissa with a sign bit indicating the sign of the number. Incoming negative integer numbers may need to be converted to positive numbers for floating point representation.

Mantissa leading zero anticipation (LZA)/left shifting unit 2114a is used for left shifting in the case of a conversion from integer to floating point. Unit 2114a is also used to anticipate leading 0s. When a left shift has been performed in a conversion from integer to floating point, leading zero anticipation circuitry of unit 2114a determines the number of zeros to the left of a leftmost 1 if a resultant floating point number is not normalized. The number of leading zeros is transmitted to exponent adjust unit 2110a. Exponent adjust unit 2110a receives the number of leading zeros and shifts the number as necessary to normalize the floating point number.

Figure 22:
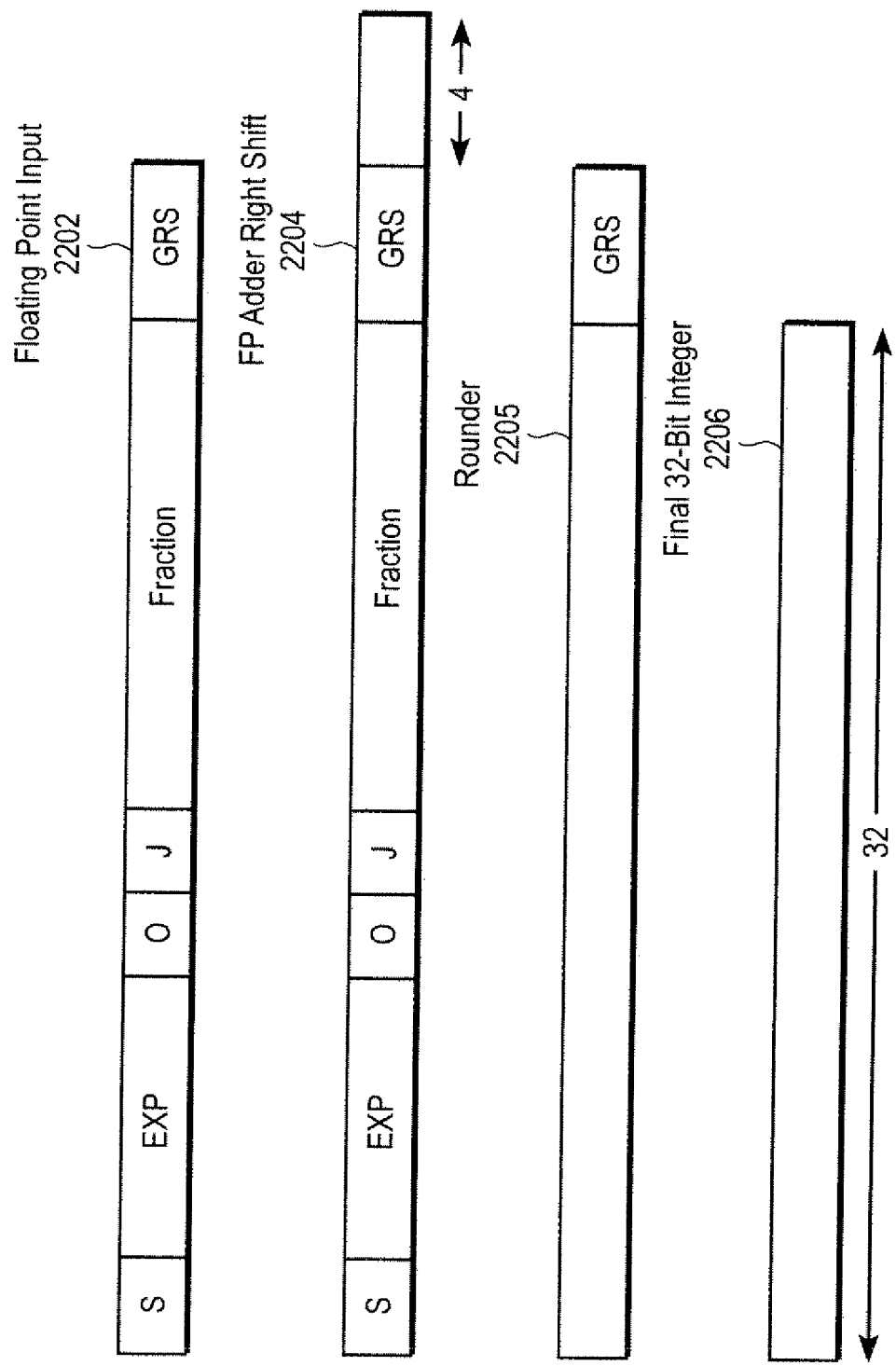
FIG. 22 is a diagram of a floating point format to integer format conversion operation when the floating point exponent is less than 23, according to one embodiment.

FIG. 22 is a diagram illustrating an operation to convert a floating point number having an exponent that is smaller than a certain number to an integer number according to one embodiment. It will be appreciated that one embodiment of the floating point unit may be designed for a double precision floating point format. In this embodiment, floating point unit 2100 is designed to operate on single precision floating point numbers with 23-bit mantissas. Therefore, in this embodiment, the certain number is 23. If an exponent of an incoming floating point number to be converted has an exponent that is greater than or equal to 23, it is possible that conversion will require a shift right beyond the normal data path width of a floating point unit designed to perform floating point arithmetic.

Floating point number 2202 is a number to be converted that is latched into right shifter 2204 of floating point unit 2100 as shown. Floating point number 2202 is a number in an internal floating point format according to one embodiment. The internal format of floating point number 2202 is a format on which floating point unit 2100 operates, and differs from an external format that is output from or input to a processor including floating point unit 2100. Several external formats are known. Commonly, external formats conform to an Institute of Electronics and Electrical Engineers (IEEE) specification. The present invention can be used with different external and internal formats.

In the internal format of floating point number 2202 the leftmost field contains a sign bit indicating whether number 2202 is positive or negative. Number 2202 also includes an exponent field that, in this embodiment, includes 10 bits that indicate a power to which the mantissa portion of number 2202 is to be raised. In this embodiment, the mantissa portion includes the "J" bit and the fraction field. The J bit is a one-bit binary integer immediately to the left of an implied decimal point (or floating point). In other embodiments, the one-bit binary integer is implied and not explicitly shown as it is in this embodiment. The fraction field contains a binary fraction of 27 bits. The "O" bit is a single bit that indicates whether a mantissa overflow exists in the number represented. In binary floating point formats such as the one shown, some numbers cannot be represented with just the exponent field, the J bit, and the fraction field. For example, in a floating point operation adding the numbers 1 and 1.5, the resultant number 2.5 requires that the O bit and the J bit contain a 1 and a 0, respectively. Numbers that have an overflow condition are not in the "normalized" floating point format. Normalized floating point format includes a value of zero in the O bit, a value of 1 in the J bit, and a binary value in the fraction field that indicates a power of two to which the number must be raised.

The "GRS" field includes 3 bits that are used for rounding control as is known in the art. The GRS bits are the guard, round, and sticky bits. The value stored in the GRS bits is used by a rounding circuit in floating point arithmetic operations to round a resultant number according to some predetermined method.

In this embodiment, additional storage capacity is present in right shifter 2204 to accommodate a maximum possible number of bit position shifts. Specifically, in this embodiment, floating point unit 2100 performs operations on single precision floating point numbers. Without additional storage capacity, floating point unit 2100 could not accurately perform conversion operations on numbers that required a shift to the left or right over a certain number of bit positions.

In the case illustrated in FIG. 22, the additional capacity of right shifter 2204 of floating point unit 2100 is not actually used because the exponent is less than 23 and so the maximum possible shift right is within the area shown as the GRS field. After shifting takes place in right shifter 2204, the resultant number is rounded in rounder 2205 using the GRS bits in the known way. The final 32-bit integer is available at the outputs of floating point unit 2100, for example, in a register such as register 2206.

Figure 23:
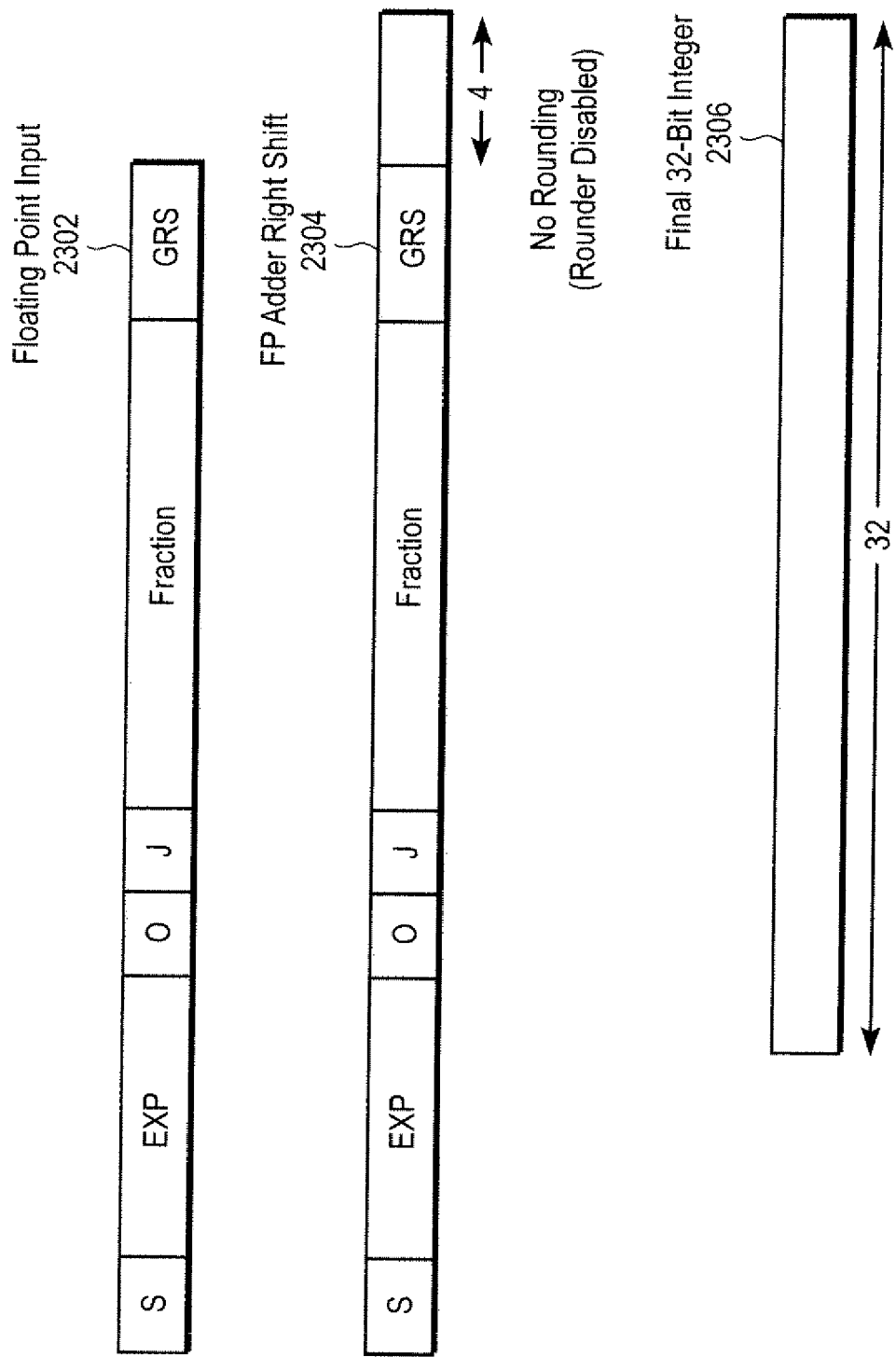
FIG. 23 is a diagram of a floating point format to integer format conversion operation when the floating point exponent is greater than or equal to 23, according to one embodiment.

FIG. 23 is a diagram illustrating an operation to convert a floating point number having an exponent that is greater smaller than a certain number to an integer number according to one embodiment. In this embodiment, incoming floating point number 2302 is a single precision floating point number that, in one case, may require the floating point to be shifted 31 bit positions in order to convert floating point number 2302 to an integer format. In prior floating point units that operate on single precision floating point numbers, a maximum shift of 24 bit positions is permitted in order to avoid overflowing into the GRS field. This is because the GRS field must be preserved for rounding. In this embodiment, it is determined whether an operation to be performed is an arithmetic operation or a conversion operation (as explained more fully below). If it is determined that the operation to be performed is a conversion operation that requires a shift into and beyond the GRS field, "virtual shifting" and "virtual rounding" are enabled. Virtual shifting uses a special, larger conversion constant comprised of a biased constant plus the maximum number of bit positions that can be shifted right. In this embodiment, the maximum number is the number of bit positions between the J bit and the rightmost bit of the additional four bits shown in right shifter 2304. In the case of a maximum shift right, no rounding is performed. Therefore the GRS field need not be preserved. In this case, the control unit of floating point unit 2100 generates a signal to disable the rounding circuitry (this may be referred to as virtual rounding). It is not necessary to perform rounding or use actual GRS bits because the initial GRS bits(before the start of a conversion operation) are known to be zero. Therefore, the bits potentially shifted beyond the rightmost bit of right shifter 2304 (and "lost") are known to be zeros and do not have to be accounted for by bits in a GRS field. The result of the conversion operation is a final 32-bit integer that is available at the outputs of floating point unit 2100, for example, in a register such as register 2306.

Figure 24:
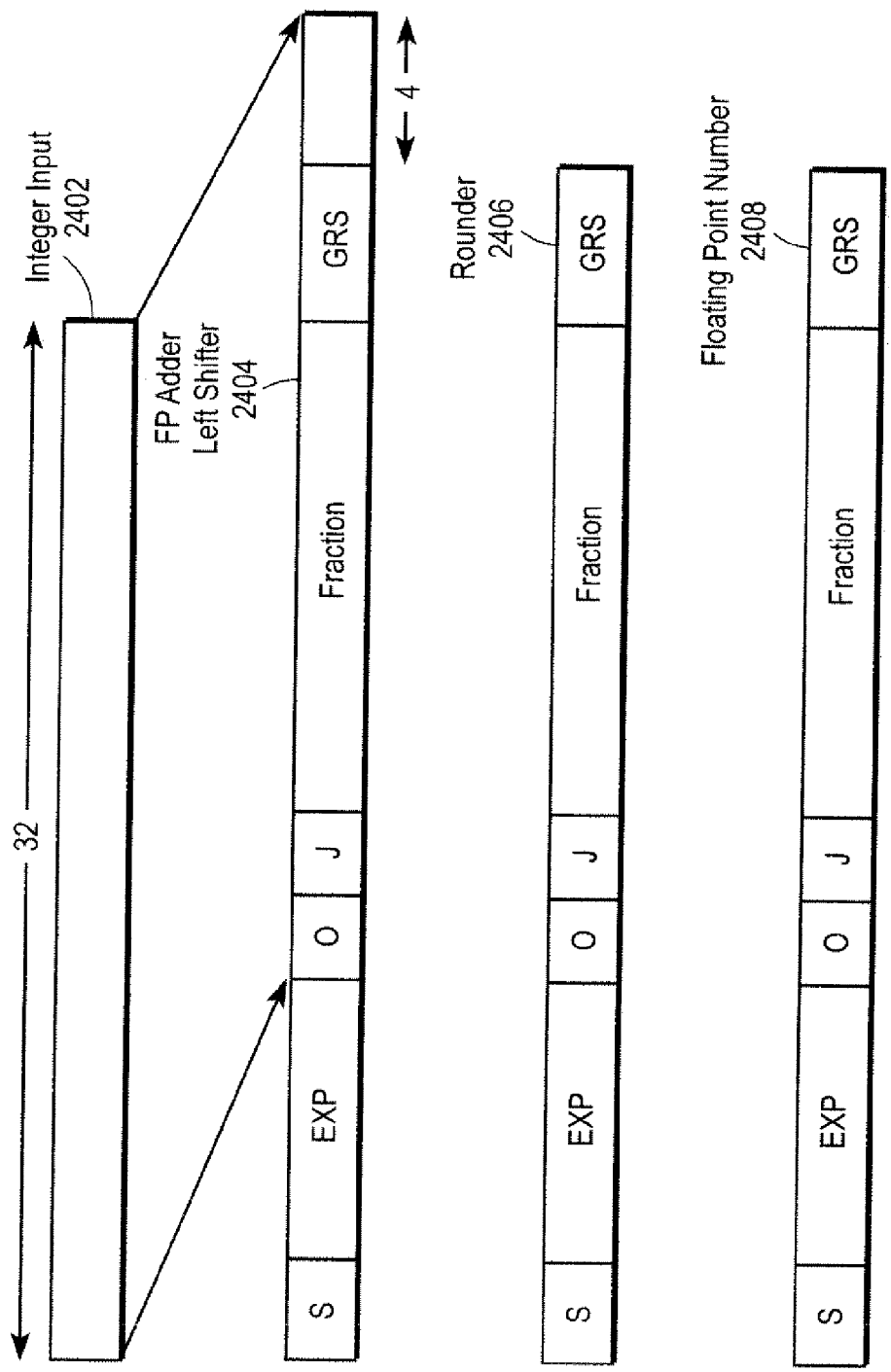
FIG. 24 is a diagram of an integer format to floating point format conversion operation according to one embodiment.

FIG. 24 is an illustration of a conversion from integer format to single precision floating point format according to one embodiment of the present invention using floating point unit 2100. In an alternative embodiment the integer format may be a 64-bit integer format. Integer number 2402 is a number in 32-bit integer format coming into an input of floating point unit 2100. Floating point adder left shifter 2404 is part of mantissa/left zero anticipation/left shifting unit 2114a. Left shifter 2404 includes additional bit positions to the right of the GRS field. In this embodiment, four additional bit positions are provided to accommodate a maximum shift to the left of 31 bits. The additional bit positions prevent a possible shift of significant bits into the exponent field of the resultant floating point number, which would cause a meaningless number to be created. According to this embodiment, floating point unit 300 determines how to latch an incoming number by determining the state of the incoming signal that indicates a type of instruction received. In the case of an instruction to convert a number from integer format to floating point format, floating point unit 2100 latches incoming number 2402 so as to align the rightmost bit of number 2402 with the rightmost bit of the additional bit added to the right of the GRS field in left shifter 2404. After shifting is performed by left shifter 2404, the result is transferred to rounder 2406. In this embodiment, rounder 2406 is a separate unit from floating point unit 2100. In other embodiments, rounder 2406 could be in a same unit as left shifter 2404. Resultant floating point number 2408 is output from rounder 2406. FIG. 24 does not show every intermediate operation that may be required in a conversion from integer format to floating point format. For example, mantissa addition unit 2112a may be required to convert a negative integer number from its 2's compliment representation to absolute value and sign representation required for floating point. These additional intermediate operations are not pertinent to the invention.

Figure 25:
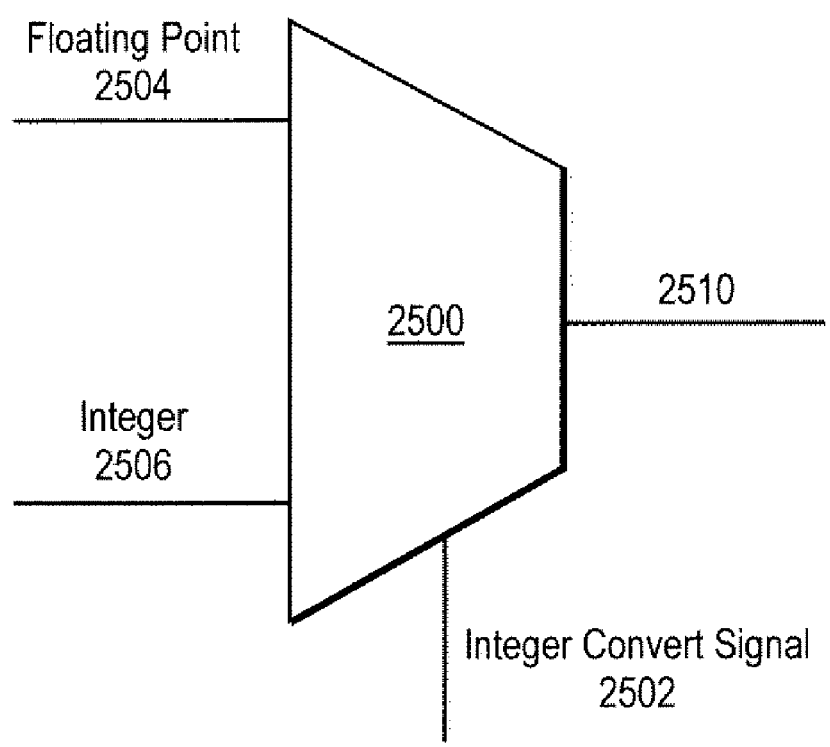
FIG. 25 is a diagram of a selection circuit according to one embodiment.

FIG. 25 is a diagram of a selection circuit used to direct floating point unit 2100 to latch an incoming number in a particular way. In this embodiment, the selection circuit of FIG. 25 includes a multiplexer 2500 controlled by integer convert signal 2502. If an instruction received by floating point unit 2100 is an integer convert instruction, integer number 2506 is selected to be latched in the manner shown in FIG. 24. In this case, latch integer signal 2506 is output on output 2510 of multiplexer 2500. In the case where a floating point to integer conversion is required by an instruction or the case where a floating point arithmetic operation is to be performed, integer convert signal 2502 is not active and latch floating point signal 2504 is output.

This embodiment includes the advantage of gracefully handling the case of the maximum negative integer number as input to a conversion operation. In this embodiment, the maximum negative integer comes into floating point arithmetic unit 2100 with a "1" in the O bit of left shifter 2404 and a zero in the J bit of left shifter 2404. The maximum negative integer does not change when complimented. Therefore, when the number arrives at rounder 2406, it appears as if an overflow condition exists. Rounder 2406 will therefore shift the number right and adjust the floating point exponent accordingly so that a correct floating point representation is produced.

Figure 26:
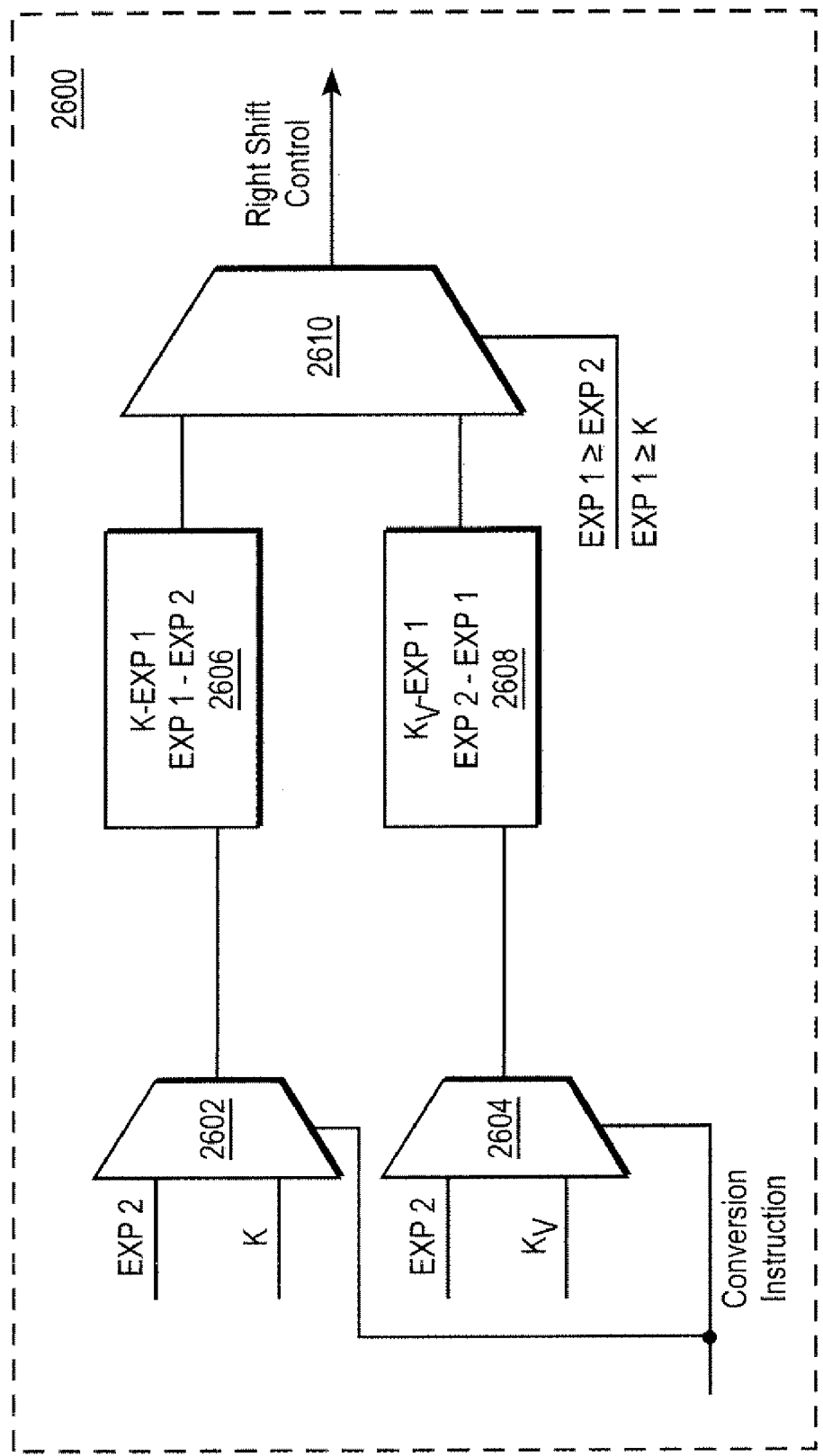
FIG. 26 is a block diagram of a selection circuit according to one embodiment.

FIG. 26 is a block diagram of a selection circuit that determines whether an incoming floating point number to be converted will require a shift of more than 23 bit positions (in this embodiment using single precision floating point numbers) and enables virtual shifting accordingly. The selection circuit of FIG. 26 speeds execution of a conversion operation by simultaneously calculating both of two possible numbers of bit positions to be shifted. In this way, a data dependency is removed. Specifically, it is not necessary to wait for the result of a subtraction operation performed on two incoming operand exponents, determine whether the result is negative or positive, and then compliment as necessary to obtain a correct shift value.

The selection circuit of FIG. 26 is also used in addition operations. As is known, floating point addition operations typically align the exponents of the two operands by shifting the number having the larger exponent to match the smaller exponent before addition takes place. In the case of addition as well as that of conversion it is necessary to determine a correct number of bits to shift by performing a subtraction operation.

Multiplexer 2602 has inputs labeled exponent 2 and K. Exponent 2 represents an exponent of an arithmetic operand when an operation to be performed is an arithmetic operation. K represents a conversion constant comprised of a constant bias plus 23 for this embodiment. 23 for a single precision floating point number is the maximum number of bit positions that can be shifted without shifting into the GRS field. Multiplexer 2604 has inputs exponent 2 and $K_V$. Exponent 2 is the same exponent 2 as is input to multiplexer 2602. $K_V$ is an alternative conversion constant that allows virtual shifting into the GRS field and into bits to the right of the GRS field. In this embodiment, $K_V$ is 31 plus the constant bias. Because there is a difference of 4 between $K_V$ and K, a shift of 7 additional bit positions (virtual shifting) is allowed when $K_V$ is used. In this embodiment, use of $K_V$ allows bits to be shifted through the GRS field and the additional 4 bit positions to the right of the GRS field. Both multiplexers 2602 and 2604 are controlled by a signal that indicates whether the instruction is a conversion instruction or an arithmetic instruction. If the instruction is a conversion instruction, multiplexer 2602 outputs K and multiplexer 2604 outputs $K_V$. Selector circuit 2600 is also comprised of two subtraction circuits that perform two subtraction operations simultaneously. Subtractor 2606 has exponent 1 on one input. Exponent 1 is the exponent of a second arithmetic operand when the operation is an arithmetic operation and exponent 1 is the exponent of the floating point number to be converted when the operation is a conversion operation. Depending upon the output of multiplexer 2602 subtract circuit 2606 performs either a subtraction of exponent 1 from K or a subtraction of exponent 2 from exponent 1.

Subtract circuit 2608 has one input that receives exponent 1 where exponent 1 is the same exponent received by subtract circuit 2606. Subtract circuit 2608 also receives the output of multiplexer 2604. Dependent upon the output of multiplexer 2604, subtract circuit 2608 performs a subtrac tion of exponent 1 from $K_V$ or a subtraction of exponent 1 from exponent 2. Multiplexer 2610 receives the output of subtract circuit 2606 and the output of subtract circuit 2608. Multiplexer 2610 is controlled by a signal that indicates, in the case of an arithmetic operation, whether exponent 1 is greater than or equal to exponent 2. In the case of a conversion operation, 2610 is controlled by a signal that indicates whether exponent 1 is greater than or equal to K. In the case of a conversion operation, if exponent 1 is greater than or equal to K multiplexer 2610 will output the difference of exponent 1 and $K_V$ as a right shift control. If exponent 1 is not greater than or equal to K, multiplexer 2610 will output the difference of exponent 1 and K as a right shift control. In one embodiment, constant values K and $K_V$ are stored in a read only memory (ROM).

While the present invention has been described with reference to specific exemplary embodiments. For example, embodiments have been described which use particular floating point or integer formats and particular bit fields and numbers of bits. The invention, however, is not limited to these specific formats. Accordingly, the specification and drawings are to be regarded in an illustrative rather than a restrictive sense. It will be appreciated that modifications may be made to the embodiments herein disclosed and that a number of alternative embodiments could be used by practitioners, perhaps in combination with or not in combination with one or more sequences of machine executable emulation instructions, without departing from the spirit of the present invention as claimed.

What is claimed is:

1. An apparatus comprising:
a decoder configured to decode control signals of a first set of control signal formats, and
a circuit coupled to the decoder, the circuit in response to at least one decoded control signal to convert between a first plurality of numbers in an integer format stored in a first packed register of a first set of architectural registers and a second plurality of numbers in a floating-point format stored in a second packed register of a second set of architectural registers.

2. The apparatus of claim 1, wherein the second plurality of numbers is equal in count to the first plurality of numbers.

3. The apparatus of claim 1, wherein the set of control signal formats permits control signals to convert the second plurality of numbers in a packed floating point format to the first plurality of numbers in a packed doubleword integer data format.

4. The apparatus of claim 3, wherein a difference of numbers between the second plurality and the first plurality are set to zeroes in a packed doubleword integer data format.

5. The apparatus of claim 3, wherein the set of control signal formats permits control signals to identify the first plurality of numbers as two numbers in the first set of architectural registers each of the first set of architectural registers having 64-bits of storage capacity.

6. The apparatus of claim 3, wherein the set of control signal formats permits control signals to identify the floating point format as a 64-bit double-precision floating point format.

7. The apparatus of claim 1, wherein the set of control signal formats permits control signals to convert the first plurality of numbers in a packed integer format to the second plurality of numbers in a packed floating point data format.

8. The apparatus of claim 7, wherein a difference count of numbers between the second plurality and the first plurality are not converted to a floating point data format.

9. An apparatus comprising:
a first storage area to store packed data, the first storage area representing a register in a first set of architectural registers;
a second storage area to store packed data, the second storage area representing a register in a second set of architectural registers;
a decoder to decode control signals of a first set of control signal formats; and
conversion logic to convert between a first plurality of numbers in an integer format stored in the first storage area and a second plurality of numbers in a floating-point format stored in the second storage area responsive to the decoding of a control signal of the first set of control signal formats.

10. The apparatus of claim 9, wherein the conversion logic comprises an integrated circuit.

11. The apparatus of claim 9, wherein the conversion logic comprises a combination of an integrated circuit and a sequence of machine executable emulation instructions.

12. The apparatus of claim 11, wherein the first set of control signal formats the decoder is to decode comprise Intel-Architecture control signal formats having three or more bytes, a first byte and a second byte of the three bytes permitting an operation code to specify a conversion operation for converting numbers between a set of packed integer data formats and a set of packed floating point data formats.

13. A processor comprising:
a first register belonging to a first set of architectural registers;
a second register belonging to a second set of architectural registers;
a decoder to decode instructions; and
a floating point arithmetic circuit coupled to the decoder, the floating point arithmetic circuit in response to at least one first decoded instruction configurable to,
access a first plurality of numbers in a packed floating point format in the first register;
convert the first plurality of numbers to a second plurality of numbers in an integer format; and
store the second plurality of numbers in a packed integer format in the second register.

14. The processor of claim 13, wherein the floating point arithmetic circuit in response to at least one second decoded instruction being configurable to,
access a first one of the first plurality of numbers in the packed floating point format in the first register;
convert the first one of the first plurality of numbers to a second number in an integer format; and
store the second number in a packed integer format in the second register.

15. The processor of claim 13, wherein the floating point arithmetic circuit in response to at least one second decoded instruction being configurable to,
access a third plurality of numbers in a packed integer format in the second register;
convert the third plurality of numbers to a fourth plurality of numbers in a floating point format; and
store the fourth plurality of numbers in a packed floating point format in the first register.

16. The processor of claim 15, wherein the floating point arithmetic circuit in response to at least one third decoded instruction being configurable to,
access a first one of the third plurality of numbers in the packed integer format in the second register;
convert the first one of the third plurality of numbers to a second number in a floating point format; and store the second number in a packed floating point format in the first register.

17. A computer system comprising:
a memory to store a packed conversion instruction of a first set of control signal formats permitting a first source address and a second destination address, the packed conversion instruction being of a set of packed conversion instructions to convert between a set of packed floating point data formats and a set of packed integer data formats;
a storage device to store a software installation, the software installation configured to supply the packed conversion instruction to the memory for execution;
a processor to receive and decode the packed conversion instruction from the memory, the processor including:
a first storage location corresponding to the first source address to store a first packed data having a first plurality of packed data elements including a first data element of a first data format,
a second storage location corresponding to the second destination address to store a second packed data having a second plurality of packed data elements including a second data element of second data format, and
conversion logic to receive the first packed data from the first storage location and to convert the first data element to the second data element and to store the second data element in the second storage location.

18. The computer system of claim 17, wherein the conversion logic comprises an integrated circuit.

19. The computer system of claim 17, wherein the first set of control signal formats comprise Intel-Architecture control signal formats having three or more bytes, a first byte and a second byte of the three bytes permitting an operation code to specify a conversion operation for converting numbers between a set of packed integer data formats and a set of packed floating point data formats.

20. The computer system of claim 19, wherein the conversion logic comprises a combination of an integrated circuit and a sequence of machine executable emulation instructions.

21. The computer system of claim 19, wherein the set of packed conversion instructions includes an instruction (CVTPD2PI) to convert data of a packed double-precision floating-point data format to data of a packed doubleword integer data format.

22. The computer system of claim 19, wherein the set of packed conversion instructions includes an instruction (CVTPI2PD) to convert data of a packed doubleword integer data format to data of a packed double-precision floating-point data format.

23. The computer system of claim 19, wherein the set of packed conversion instructions includes an instruction (CVTTPD2PI) to convert data of a packed double-precision floating-point data format to data of a packed doubleword integer data format using truncation when a result element exceeds the maximum signed doubleword integer value.

24. The computer system of claim 19, wherein the set of packed conversion instructions includes an instruction (CVTPD2DQ) to convert data of a packed double-precision floating-point data format to data of a packed doubleword integer data format.

25. The computer system of claim 19, wherein the set of packed conversion instructions includes an instruction (CVTDQ2PD) to convert data of a packed doubleword integer data format to data of a packed double-precision floating-point data format.

26. The computer system of claim 19, wherein the set of packed conversion instructions includes an instruction (CVTTPD2DQ) to convert data of a packed double-precision floating-point data format to data of a packed doubleword integer data format using truncation when a result element exceeds the maximum signed doubleword integer value.

27. The computer system of claim 18, wherein the conversion logic comprises;
a right shifter to receive a number in a floating point format and to accommodate a shift beyond a data path width required by a floating point arithmetic operation.

28. The computer system of claim 27, wherein the floating point format is a double precision format.

29. The computer system of claim 18, the conversion logic further comprising a left shifter to receives a number in the integer format, to accommodate a shift beyond the data path width required by a floating point arithmetic operation.

30. The computer system of claim 29, wherein the integer format is a 64-bit signed integer format.

* * * * *